United States Patent
Sonehara et al.

(10) Patent No.: US 10,170,570 B1
(45) Date of Patent: Jan. 1, 2019

(54) SEMICONDUCTOR MEMORY DEVICE

(71) Applicant: TOSHIBA MEMORY CORPORATION, Tokyo (JP)

(72) Inventors: Takeshi Sonehara, Yokohama Kanagawa (JP); Erika Kodama, Yokohama Kanagawa (JP); Nobutaka Nakamura, Yokohama Kanagawa (JP); Tsuneo Inaba, Kamakura Kanagawa (JP); Koichi Nakayama, Hiratsuka Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,473

(22) Filed: Mar. 1, 2018

(30) Foreign Application Priority Data

Sep. 21, 2017 (JP) ................. 2017-181545

(51) Int. Cl.
| | |
|---|---|
| *H01L 23/528* | (2006.01) |
| *H01L 27/11556* | (2017.01) |
| *H01L 29/417* | (2006.01) |
| *H01L 27/1158* | (2017.01) |
| *G11C 8/10* | (2006.01) |

(52) U.S. Cl.
CPC ...... *H01L 29/41741* (2013.01); *H01L 23/528* (2013.01); *H01L 27/1158* (2013.01); *H01L 27/11556* (2013.01); *G11C 8/10* (2013.01)

(58) Field of Classification Search
CPC ............. H01L 29/41741; H01L 23/528; H01L 27/11556
See application file for complete search history.

(56) References Cited

U.S. PATENT DOCUMENTS

| | | | |
|---|---|---|---|
| 8,680,604 B2 | 3/2014 | Higashi et al. | |
| 8,896,051 B2 | 11/2014 | Nansei | |
| 8,957,471 B2 | 2/2015 | Fukuzumi | |
| 8,970,040 B1 | 3/2015 | Chen | |
| 9,087,790 B2 | 7/2015 | Oh et al. | |
| 2017/0373071 A1* | 12/2017 | Lim | H01L 27/1104 |

FOREIGN PATENT DOCUMENTS

| | | |
|---|---|---|
| JP | 2012-119478 A | 6/2012 |
| JP | 2013-131580 A | 7/2013 |
| JP | 5330017 B2 | 10/2013 |

* cited by examiner

*Primary Examiner* — Marc Armand
(74) *Attorney, Agent, or Firm* — Patterson & Sheridan, LLP

(57) ABSTRACT

According to one embodiment, a semiconductor memory device includes a plurality of electrodes, extending in a first direction and a second direction orthogonal to the first direction are stacked one over the other, and include opposed sides extending in the second direction, a plurality of protrusion portions extending from the first side of the electrodes and spaced from one another in the second direction, and an extraction portion extending from the second side of the electrode. First and second contact plugs extend in a third direction orthogonal to the first and second directions, one of each contacting one of the extraction portions, wherein the extraction portion extending from the upper-most of the electrodes is located closer to the center of the second side in the second direction, than the location of the extraction portion extending from the lowermost of the electrodes.

20 Claims, 39 Drawing Sheets

SEMICONDUCTOR MEMORY DEVICE

CROSS-REFERENCE TO RELATED APPLICATION

This application is based upon and claims the benefit of priority from Japanese Patent Application No. 2017-181545, filed Sep. 21, 2017, the entire contents of which are incorporated herein by reference.

FIELD

Embodiments described herein relate generally to a semiconductor memory device.

BACKGROUND

As one of storage class memories aiming for high-speed operation, a resistive RAM (ReRAM) using a resistance-change type memory cell is proposed.

DETAILED DESCRIPTION

Figure 1:
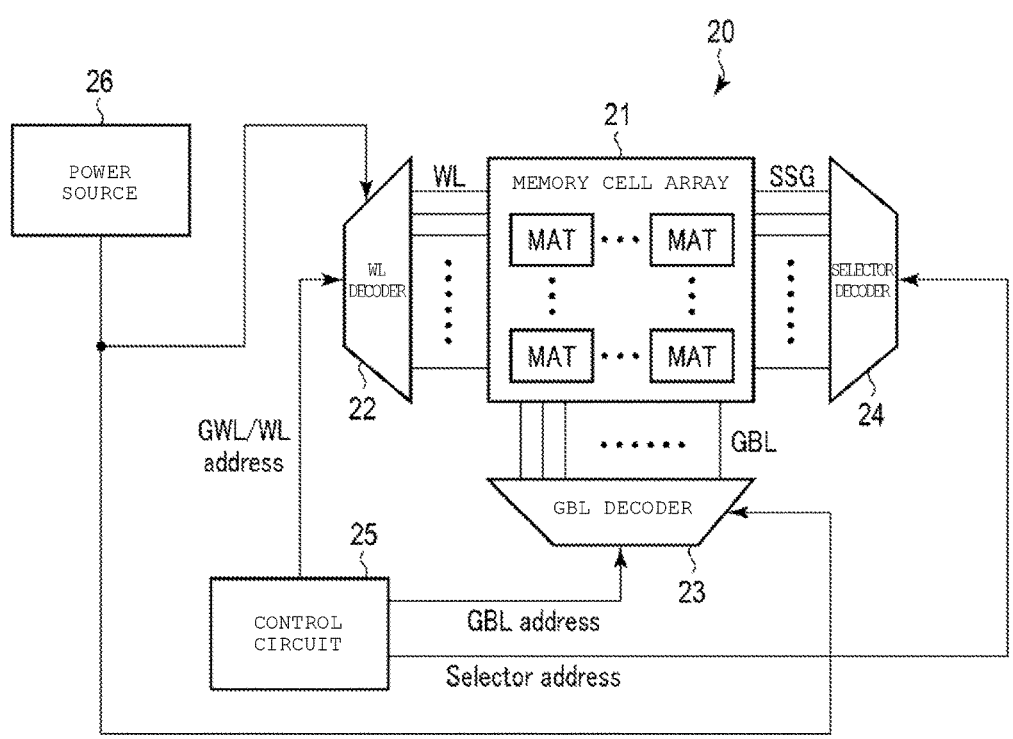
FIG. 1 is a block diagram of a semiconductor memory device according to a first embodiment.

Embodiments provide a semiconductor memory device capable of having improved reliability.

In general, according to one embodiment, there is provided a semiconductor memory device including a plurality of electrodes, extending in a first direction and a second direction orthogonal to the first direction, and stacked one over the other with an insulating layer disposed between each adjacent electrode, the plurality of electrodes including a first side, and a second side, each extending in the second direction and spaced from each other in the first direction, a plurality of protrusion portions extending from the first side of at least two of the electrodes, the protrusion portions spaced from one another in the second direction, an extraction portion extending from the second side of the electrode on the at least two electrodes having protrusion portions extending from the first side thereof, first and second contact plugs extending in a third direction, orthogonal to the first and second directions, one of each contacting the extraction portions connected to one of the two electrodes having protrusion portions extending from the first side thereof, wherein the extraction portion extending from the uppermost of the two electrodes having protrusion portions extending from the first side thereof is located closer to the center of the second side in the second direction, than the location of the extraction portion extending from the lowermost of the two electrodes having protrusion portions extending from the first side thereof.

Hereinafter, embodiments will be described with reference to the accompanying drawings. In the following description, components having substantially the same functions and configurations are denoted by the same reference numerals and signs, and repeated description thereof will be given only when needed. In addition, in each embodiment shown below, devices or methods embodying the technical idea of the embodiment are exemplified, and the technical idea of the embodiment does not limit materials, shapes, structures, layouts and the like of components to the following. The technical idea of the embodiment can have various changes and modifications added thereto in the scope of the claims.

1. First Embodiment

A semiconductor memory device according to a first embodiment will be described. Hereinafter, as the semiconductor memory device, a three-dimensional stacked resistance random access memory (ReRAM) having memory cells stacked three-dimensionally above a semiconductor substrate will be described by way example.

1.1 Overall Configuration of Semiconductor Memory Device

First, the overall configuration of a semiconductor memory device according to the present embodiment will be described with reference to FIG. 1. FIG. 1 is an example of a block diagram illustrating a basic overall configuration of a semiconductor memory device.

As shown in FIG. 1, a semiconductor memory device 20 includes a memory cell array 21, a WL decoder 22, a GBL decoder 23, a selector decoder 24, a control circuit 25, and a power source 26.

The memory cell array 21 includes a plurality of memory groups MAT arranged in a two dimensional matrix configuration. Each memory group MAT includes a plurality of memory cells, that is, memory elements including variable resistance elements, and stores data in a non-volatile state. The details of the memory cell will be described later herein. Each memory group MAT is operable independently of the others, and can perform write and read operations at simultaneous or separate timings. The number of memory groups MAT may be freely set.

The WL decoder 22 includes a word line selection portion and a word line driver which are not shown in the drawing. The word line selection portion selects a word line WL based on a WL address received from the control circuit 25. The word line driver can apply a voltage required for reading and writing data or the like to a selected word line WL and a non-selected word line WL.

The GBL decoder 23 includes a global bit line selection portion and a global bit line driver which are not shown in the drawing. The global bit line selection portion selects a global bit line GBL based on a column address received from the control circuit 25. The global bit line driver can apply a voltage required for reading and writing data or the like to a selected global bit line GBL and a non-selected global bit line GBL.

The selector decoder 24 includes a selector selection portion and a select gate line driver which is not shown in the drawing. During a reading or writing operation, the selector selection portion selects a select gate line SSG based on a selector address received from the control circuit 25. The select gate line driver can apply a voltage required for reading and writing data or the like to a selected select gate line SSG and a non-selected select gate line SSG.

The control circuit 25 controls the operation of the entire semiconductor memory device 20. In addition, it is possible to transmit a row address to the WL decoder 22, to transmit a column address (GBL address) to the GBL decoder 23, and to transmit a selector address to the selector decoder 24.

In addition, since the control circuit 25 changes the resistance state of a variable resistance element of a selected memory cell during writing of data, the control circuit can command the WL decoder 22, the GBL decoder 23, and the selector decoder 24 to apply a required voltage during the writing operation.

Since the control circuit 25 measures the resistance value of a variable resistance element of a selected memory cell, during reading of data, as the storage state of the memory cell, the control circuit can command the WL decoder 22, the GBL decoder 23, and the selector decoder 24 to apply a required voltage thereto during reading operations.

Further, the control circuit 25 includes a sense amplifier which is not shown in the drawing, and can sense (amplify) data read to the global bit line GBL through this sense amplifier.

The power source 26 generates a voltage required for reading and writing data or the like. The voltage generated by the power source 26 is applied to a word line WL and a bit line BL.

For example, during writing of data, a large potential difference is generated between the selected word line WL and a selected bit line BL, and the resistance state of a variable resistance element transitions to a different resistance. In addition, during reading of data, a potential difference is generated between the selected word line WL and the selected bit line BL in a range in which the transition of the resistance state does not occur, and thus a current flowing through the bit line BL or the word line WL can be measured.

1.2 Configuration of Memory Cell Array

Figure 2:
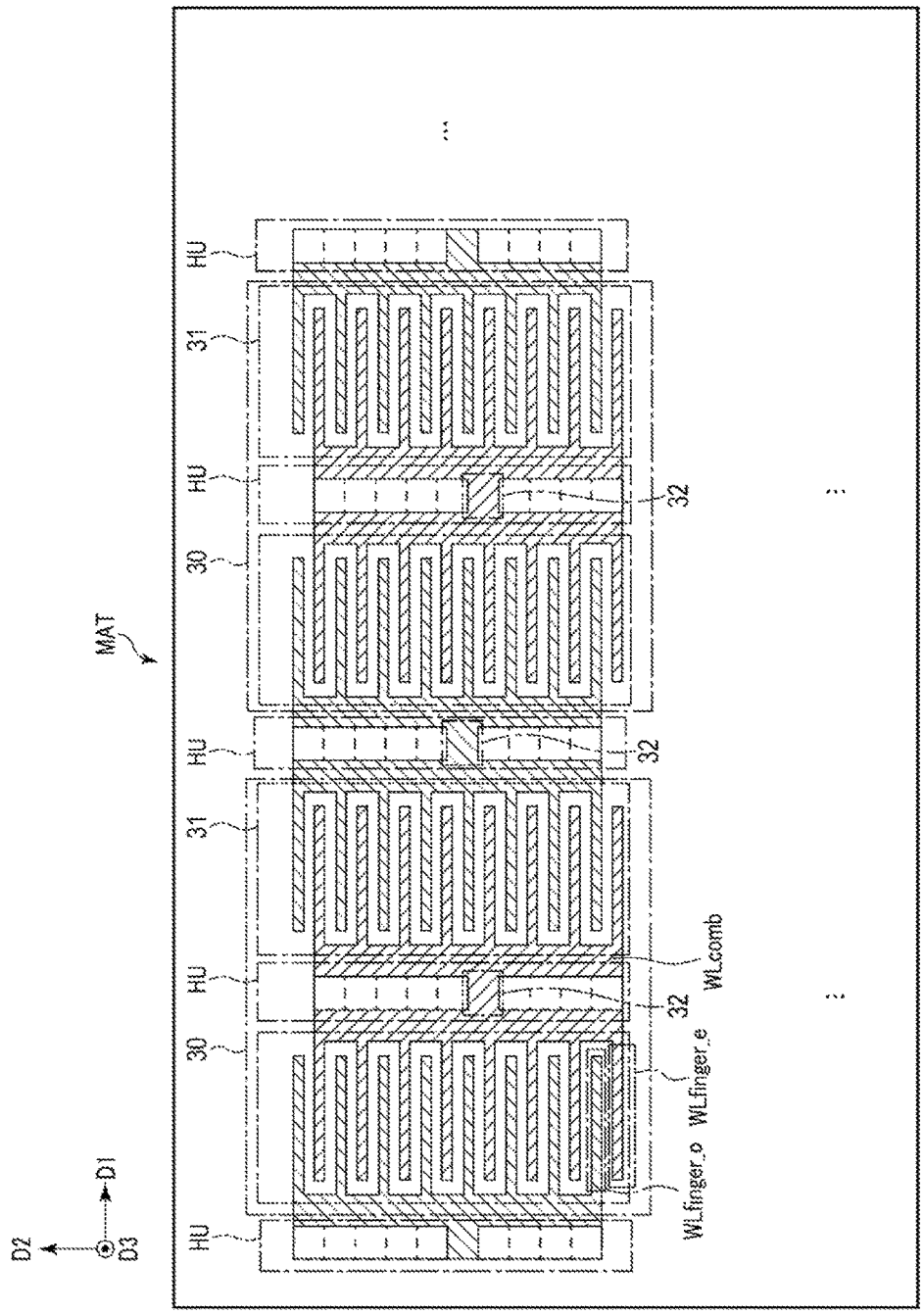
FIG. 2 is a block diagram of a memory cell array provided in the semiconductor memory device according to the first embodiment.
Figure 3:
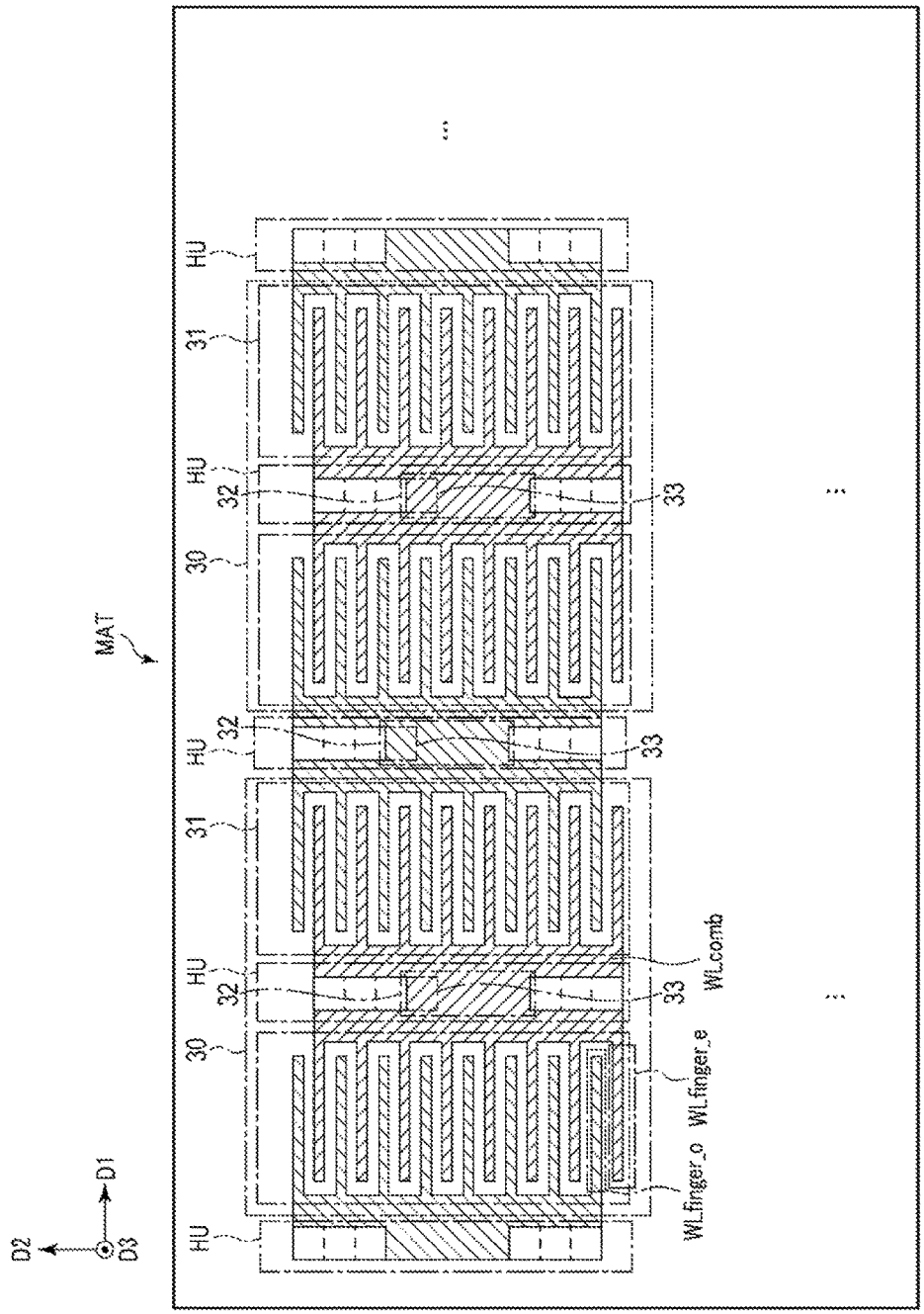
FIG. 3 is a block diagram of the memory cell array provided in the semiconductor memory device according to the first embodiment.
Figure 4:
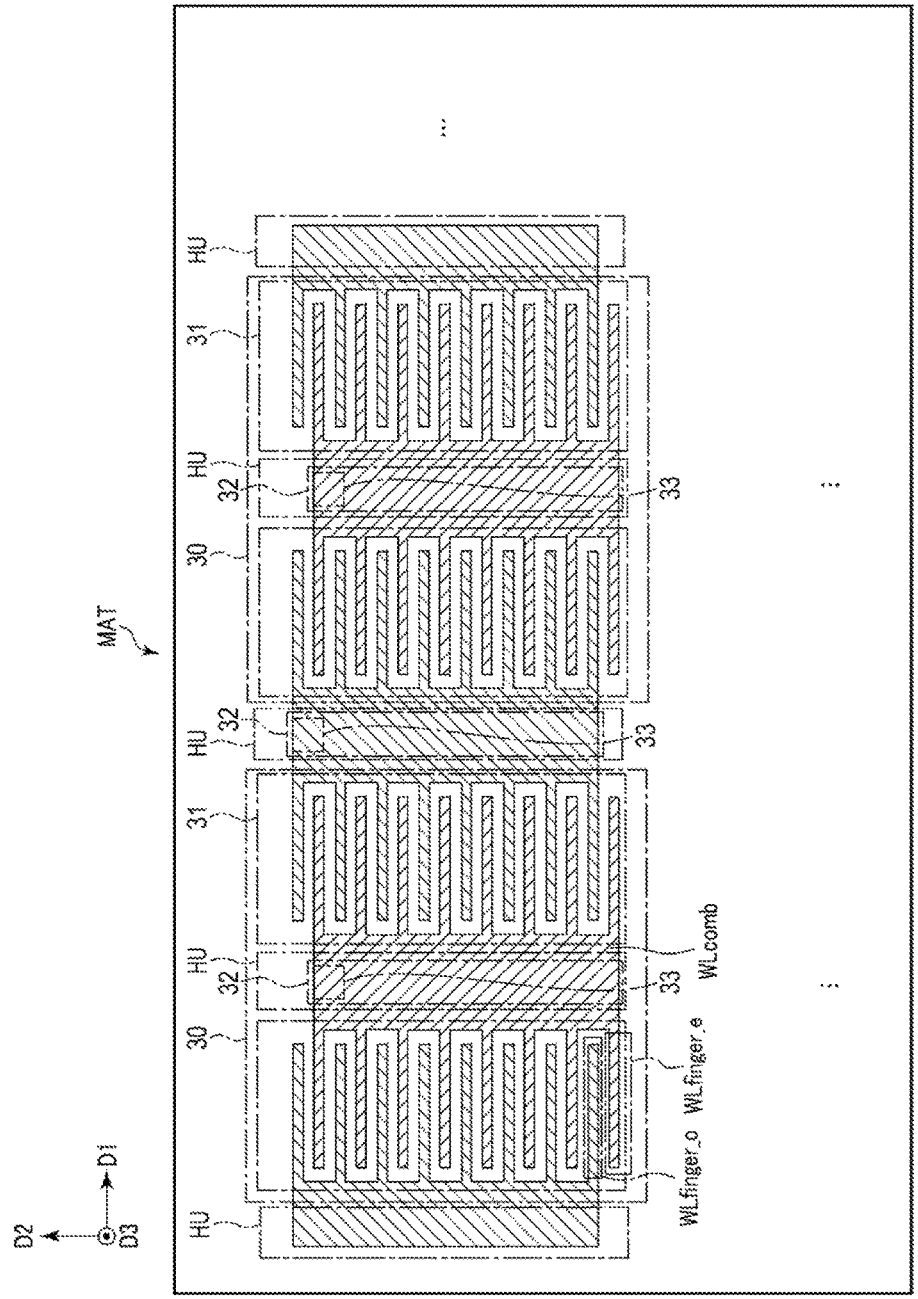
FIG. 4 is a block diagram of the memory cell array provided in the semiconductor memory device according to the first embodiment.
Figure 5:
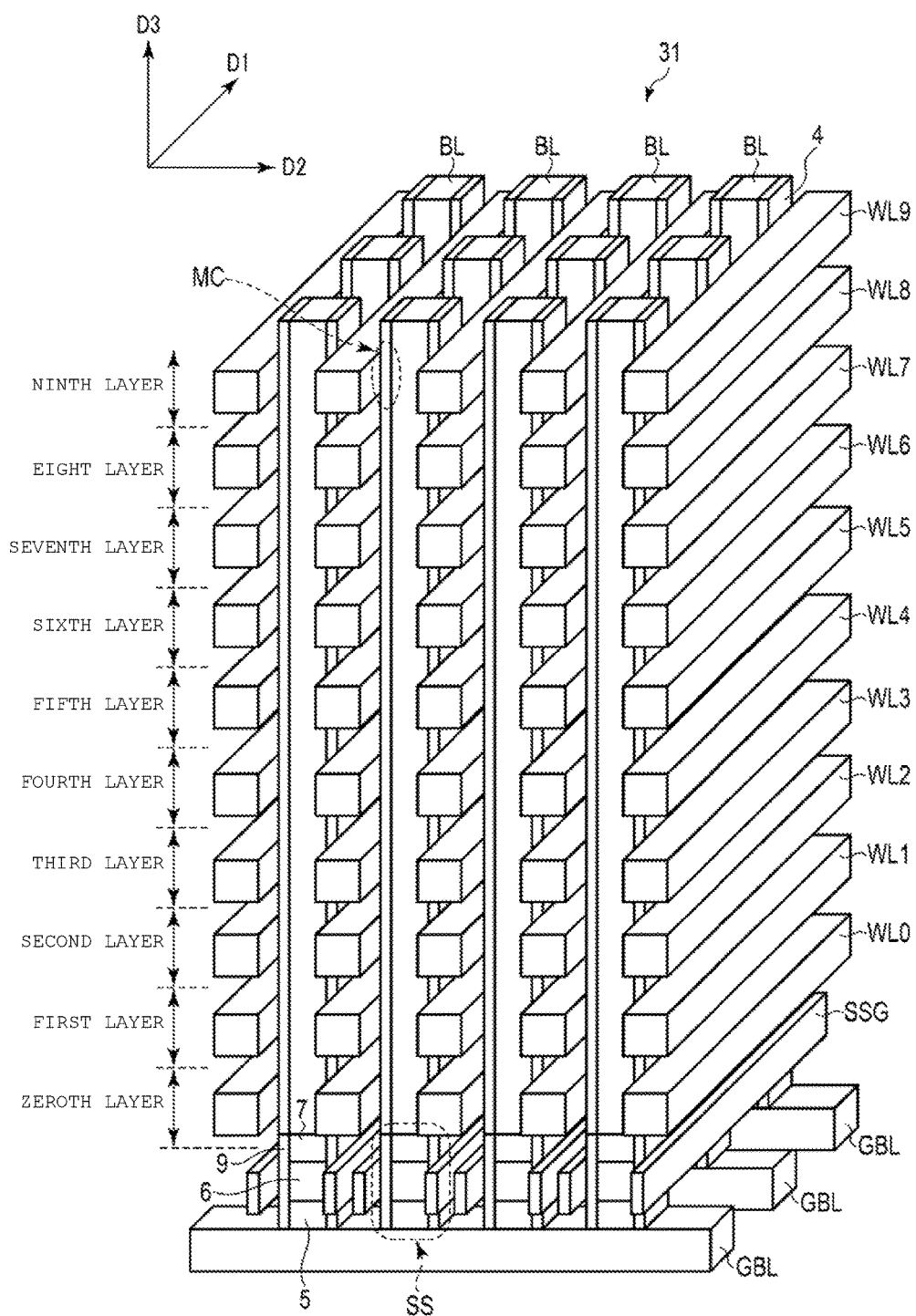
FIG. 5 is a perspective view of the memory cell array provided in the semiconductor memory device according to the first embodiment.
Figure 6:
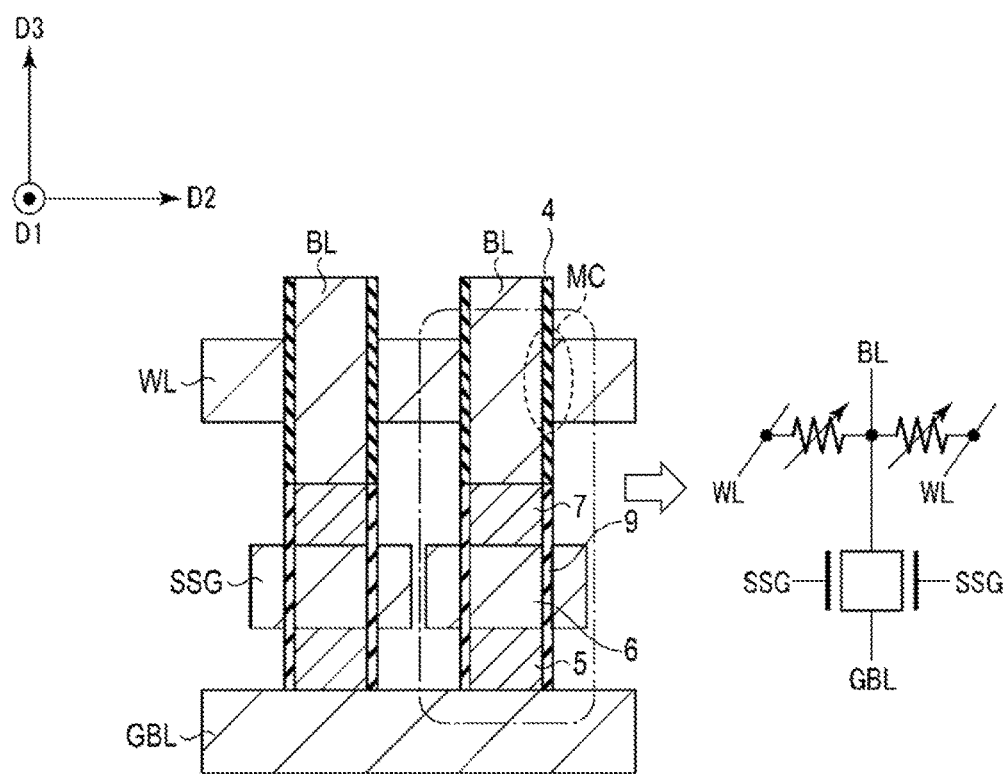
FIG. 6 is a partial cross-sectional view of the memory cell array provided in the semiconductor memory device according to the first embodiment.

Next, the configuration of the memory cell array 21 according to the present embodiment will be described with reference to FIGS. 2 to 6. FIGS. 2 to 4 show an example of a plan view of one memory group MAT in the memory cell array 21. FIG. 5 shows a perspective view of the memory cell array 21. FIG. 6 shows an example of a partial cross-sectional view of the memory cell array 21 and the equivalent circuit. In the example of FIGS. 2 to 4, for the purpose of simplifying description, only one layer of stacked word lines WL is shown. More specifically, FIG. 2 shows the uppermost word line WL among ten stacked word lines WL of FIG. 5. FIG. 3 shows the fourth word line WL from the uppermost word line of FIG. 5, and FIG. 4 shows the lowermost word line WL of FIG. 5. In addition, in the views of FIGS. 5 and 6, interlayer insulating films are omitted.

As shown in FIG. 2, the memory group MAT includes a plurality of memory blocks 30 and hookup portions HU which are arranged in a matrix configuration. The number of memory blocks 30 may be freely set. Each memory block 30 provides a plurality of memory cells MC connected in common to each other by one or a plurality of word lines WL. For example, the control circuit 25 can simultaneously access the plurality of memory blocks 30 in write and read operations. For example, a memory block 30 serves as a decode unit when addresses (row address, column address, and selector address) are decoded.

The memory blocks 30 include, for example, two memory units 31.

In the memory unit 31, the word line WL extends in a first direction D1 parallel to a semiconductor substrate. A plurality of word lines WL in each layer have a comb-shaped structure in which the word lines are alternately connected in common to each other along a second direction D2 which is parallel to the semiconductor substrate and is orthogonal to the first direction D1. Hereinafter, in the second direction D2, an odd-numbered word line WL is denoted as an odd-numbered word line finger WLfinger_o, and an even-numbered word line WL is denoted as an even-numbered word line finger WLfinger-e. In a case where the odd-numbered word line finger WLfinger_o and the even-numbered word line finger WLfinger-e are not distinguished from each other, these word line fingers are simply denoted as a word line finger WLfinger. Further, an electrode portion having a comb-shaped structure which includes a plurality of word line fingers WLfinger connected in common to each other is denoted as a word line comb WLcomb. In one layer, the side of the word line comb WLcomb from which the odd-numbered word line fingers WLfinger_o extend and the side of the word line comb WLcomb from which the even-numbered word line fingers WLfinger_e extend face each other, and mutual comb teeth (word line fingers WLfinger) are disposed so as to be alternately engaged with each other, i.e., interleaved in the second direction D2, with an interlayer insulating film interposed therebetween. The same, i.e., a common, voltage is applied to the plurality of word line fingers WLfinger connected to one word line comb WLcomb. A different voltage can be applied between the word line comb WLcomb including odd-numbered word line fingers WLfinger_o and the word line comb WLcomb including even-numbered word line fingers WLfinger_e (that is, the odd-numbered word line fingers WLfinger_o and the even-numbered word line fingers WLfinger_e are spaced from each other in the second direction D2).

Two memory units 31 within the memory block 30 are disposed so as to be line-symmetric with respect to each other, for example, around a hookup portion HU region extending in the second direction D2.

The hookup portion HU is a region which is provided with an extraction portion 32 for connecting each word line finger WLfinger to the WL decoder 22. The hookup portion HU extends along the second direction D2 orthogonal to the first direction D1 parallel to the word line finger WLfinger. One memory unit 31 is provided between two hookup portions HU adjacent in the first direction. Therefore, the hookup portions HU and the memory units 31 are alternately disposed along the first direction D1 parallel to the semiconductor substrate. In the hookup portion HU, two word line combs WLcomb extending along the first direction D1 opposite to one another are connected to the extraction portion 32, and are thus connected to the WL decoder 22 via a contact plug which is not shown in the drawing. Hereinafter, a structure in which two word line combs WLcomb are connected to one extraction portion 32 is referred to as a dual comb structure. Therefore, two word line combs WLcomb connected to one extraction portion 32, that is, two word line combs WLcomb having one dual comb structure are driven by one word line driver. For example, in the example of FIG. 2, the word line comb WLcomb including even-numbered word line fingers WLfinger_e of two memory units 31 within the memory block 30 is connected to the extraction portion 32 in the hookup portion HU within the memory block 30. On the other hand, the word line comb WLcomb including odd-numbered word line fingers WLfinger_o is connected to the extraction portion 32 in the hookup portion HU provided between two memory blocks 30 which are arranged side by side along, for example, the first direction D1.

Each extraction portion 32 connected to the word line comb WLcomb includes a region (hereinafter, referred to as a "contact region portion") for connection to a contact plug which is not shown in the drawing. Therefore, as the word line combs are stacked in the third direction D3, in the hookup portion HU, a stack of extraction portions 32 are formed in a step shape along the second direction D2.

FIG. 2 shows an uppermost word line comb WLcomb out of ten stacked word line combs WLcomb of FIG. 5, which has a dual comb structure. In this case, the area of the uppermost extraction portion 32 in the first and second directions D1, D2 is smaller than the area in the first and second directions D1, D2 of an extraction portion 32 provided on a lower layer therefrom. The entirety of the uppermost extraction portion 32 functions as a contact region portion 33.

In addition, FIG. 3 shows the fourth word line comb WLcomb from the uppermost layer word line comb of FIG. 2. In this case, the area of a fourth extraction portion 32 in the first and second directions D1, D2 is larger than the area of the uppermost extraction portion 32 in the first and second directions D1, D2 shown in FIG. 2. A region of this extraction portion 32 in which an extraction portion 32 of another word line comb WLcomb is not disposed thereabove functions as the contact region portion 33 thereof.

In addition, FIG. 4 shows the lowermost word line comb WLcomb of FIG. 5. In this case, the area of the lowermost extraction portion 32 in the first and second directions D1, D2 is larger than the area in the first and second directions D1, D2 of another extraction portion 32 located thereabove in the third direction D3. A region in which an extraction portion 32 of another word line comb WLcomb is not disposed thereabove functions as the contact region portion 33.

The shape of the word line WL may not be a dual comb structure, and may not be a comb-shaped structure. For example, the extraction portion of a linear word line WL extending in the first direction D1 may be stacked so as to be formed in a step shape toward the first direction D1.

Next, the structure of the memory unit 31 will be described in detail.

As shown in FIG. 5, global bit lines GBL, word lines WL0 to WL9, and bit lines BL are provided within the memory cell array 21. The numbers of global bit lines GBL, word lines WL, and bit lines BL may be set freely.

Each of a plurality of global bit lines GBL extends along the second direction D2, is formed parallel to each other global bit line GBL and are spaced from one another along the first direction D1, and is disposed on, for example, the lowermost layer of the memory cell array 21. Each of a plurality of word lines WL extends along the first direction D1, is formed parallel to each other word line WL and are spaced from each other along a third direction D3 perpendicular to the second direction D2 and the semiconductor substrate, and is provided at a higher position in the third direction D3 than the global bit line GBL. A plurality of layers (zeroth layer, first layer, second layer . . . ) of the plurality of word lines WL are provided spaced from each other along the third direction D3. In the example of FIG. 5, ten layers (zeroth layer to ninth layer) of the word lines WL are provided, the word lines WL in each layer are denoted as word lines WL0 to WL9. Hereinafter, a description will be given in which the word line WL0 is set as the lowermost word line WL, and the word line WL9 is set as the uppermost word line WL. The number of layers of the word line WL may be freely set.

A plurality of bit lines BL extend along the third direction D3 and between word lines WL adjacent to each other along the second direction D2, and are spaced from one another in the first direction D1 and the second direction D2. One end (lower end) of the bit line BL is electrically connected to one of the global bit lines GBL. More specifically, within a two-dimensional plane formed in the first direction D1 and the second direction D2, the bit lines BL arrayed in the same row along the second direction D2 are electrically connected to the same global bit line GBL.

A memory cell MC including a variable resistance element is formed at the interface between each word line WL and each bit line BL. In the present example, a resistance change material 4 is formed on the entirety of the side surfaces (surfaces facing a word line WL) of the bit line BL.

Each portion of the resistance change material 4 disposed between the bit line BL and the word line WL functions as the memory cell MC.

The resistance change material 4 in the present example is provided on two side surfaces (the two side surfaces facing adjacent word lines WL) facing each other in the second direction D2 in two sets facing each other on the side surface of the bit line BL, and may also be provided on two side surfaces (two side surfaces not facing the word lines WL) facing each other in the first direction D1.

A sheet selector (selection element) SS is provided between a global bit line GBL and a bit line BL electrically connected to this global bit line. The sheet selector SS is, for example, a field effect transistor (FET). Here, this FET may be called a "selection FET". In this case, the sheet selector SS includes a source region 5 formed on the global bit line GBL, a semiconductor layer (channel region) 6 formed on the source region 5, and a drain region 7 formed on the semiconductor layer 6. The semiconductor layer 6 is, for example, a silicon layer.

A gate insulation layer 9 is formed on the side surfaces of the source region 5, the semiconductor layer 6 and the drain region 7 on both sides thereof facing the second direction D2. Further, a select gate line (selection gate electrode of the selection FET) SSG extending along the first direction D1 is formed on the outer side thereof. The select gate line SSG in the present example is provided on both sides of the sheet selector SS in the second direction D2, but may be provided on only one side. The term "sheet" indicates a set of memory cells MC selected by any of the select gate lines SSG. In FIG. 5, a set of memory cells MC located within a plane formed in the first direction D1 and the third direction D3 is a sheet.

Next, the structures of the sheet selector SS and the memory cell MC will be described in detail.

As shown in FIG. 6, the source region 5, the channel region 6, and the drain region 7 for forming the sheet selector SS are sequentially stacked in one global bit line GBL. A gate insulation layer 9 is formed on the side surfaces of this stacked structure, and the select gate lines SSG are formed on the side surfaces of this gate insulation layer 9.

A selection FET serving as the sheet selector SS is formed by the source region 5, the channel region 6, the drain region 7, the gate insulation layer 9, and the select gate line SSG. That is, the sheet selector SS includes two gates connected to different select gate line SSG with respect to one set of a source region 5, a channel region 6, and a drain region 7. In other words, two selection FETs are provided per bit line BL, they share the source region 5, the channel region 6, and the drain region 7, and are connected to the select gate lines SSG of which the gates are different from each other.

A columnar bit line BL is formed on the drain region 7 of each sheet selector SS. The resistance change material 4 functioning as the memory cell MC is formed on the side surface of the bit line BL above, in the first direction D1, the gate insulation layer 9. Further, the word lines WL are formed in the region between bit lines BL adjacent to each other in the second direction D2. The resistance change material 4 is formed using, for example, a material such as HfO in contact with the bit line BL and the word line WL.

The resistance change material 4 represented by this HfO is a material for transitioning between at least two resistance values of a low resistance state (LRS) and a high resistance state (HRS). It is known that the resistance change material 4 of a high resistance state transitions to a low resistance state in a case where a voltage having a certain value or more is applied thereto, and the resistance change material 4 of a low resistance state transitions to a high resistance state in a case where a current having a certain value or more flows therethrough.

Particularly, an element in which transition from a high resistance state to a low resistance state and transition from a low resistance state to a high resistance state are performed by applying voltages having different polarities is called a bipolar operation element. The resistance change material 4 in which such an operation is performed can be formed of a thin film containing at least one of materials such as $TiO_2$, $ZnMn_2O_4$, NiO, $SrZrO_3$, $Pr_{0.7}Ca_{0.3}MnO_3$, and carbon, in addition to HfO.

In addition, Si in a polycrystalline or amorphous state, Ge, SiGe, GaAs, InP, GaP, GaInAsP, GaN, SiC, SiO, SiON, SiN, HfSiO, AlO or the like can be used in the resistance change material 4. In addition, a stacked film of the aforementioned materials can also be used in the resistance change material 4. In addition, a material such as, for example, Ag, Au, Ti, Ni, Co, Al, Fe, Cr, Cu, W, Hf, Ta, Pt, Ru, Zr or Ir, or a material such as a nitride or a carbide formed of these elements can be disposed, as an electrode, between the resistance change material 4 and the bit line BL. In addition, a material obtained by adding the above materials to polycrystalline silicon can also be used as an electrode.

As described above, the memory cells MC including the resistance change material 4 provided between the word line WL and the bit line BL are arranged within the memory cell array, for example, in a three-dimensional matrix configuration. In a memory cell MC, one end of a variable resistance element is connected to one of the bit lines BL, and the other end is connected to one of the word lines (a word line finger WLfinger). Each bit line BL is connected to a corresponding global bit line GBL via a corresponding sheet selector SS. The sheet selector SS can be regarded as a set of two selection FETs connected in parallel to each other which make common use of a source and a drain. In this structure, the word line WL and the bit line BL are simple line-and-space patterns. The word line WL and the bit line BL may have a positional relationship of intersecting each other, and deviation in a word line direction and a bit line direction is not required to be considered.

Therefore, positioning accuracy within a memory cell during manufacturing can be alleviated considerably, and thus manufacturing can be easily performed. Such a structure is a high-integration structure that makes it possible to store 1-bit information in a region of 2F2.

1.3 Configuration of Hookup Portion

Figure 7:
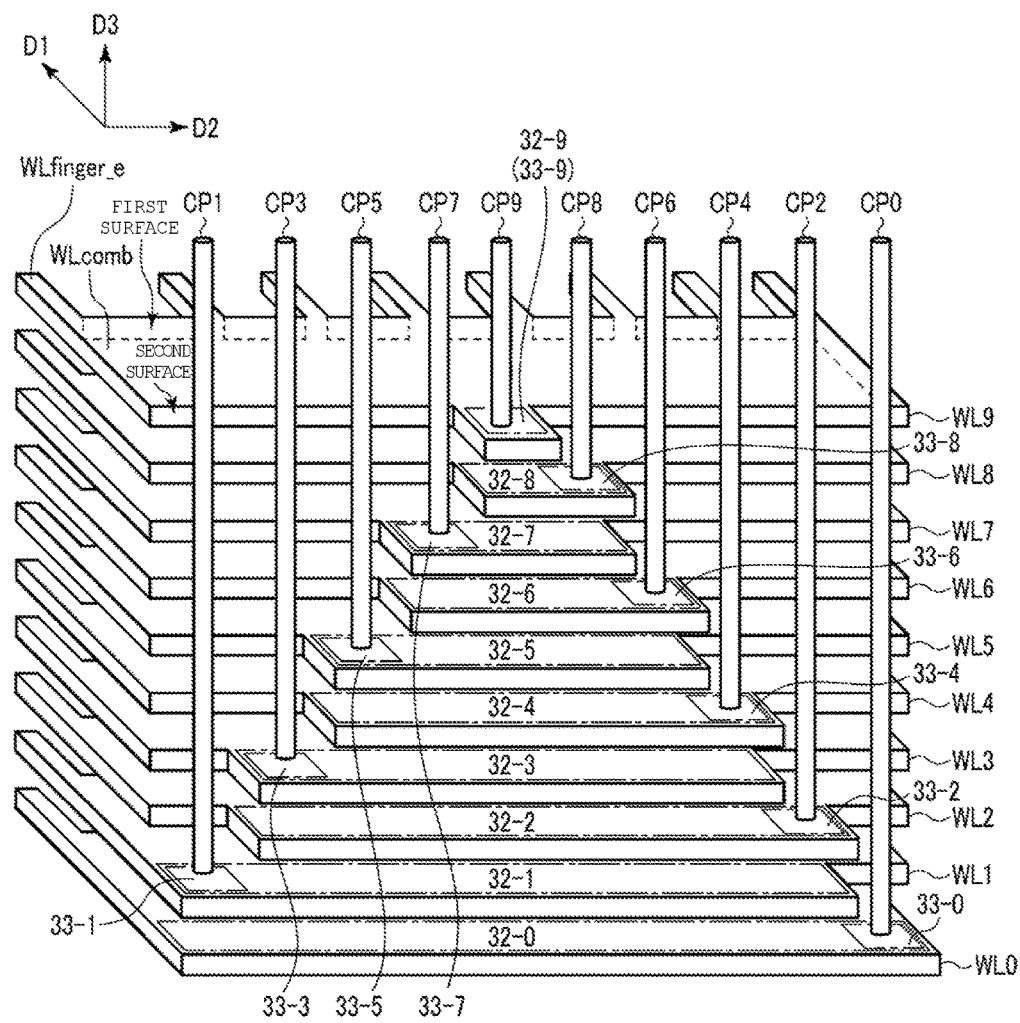
FIG. 7 is a perspective view of word line fingers and a hookup portion provided in the semiconductor memory device according to the first embodiment.
Figure 8:
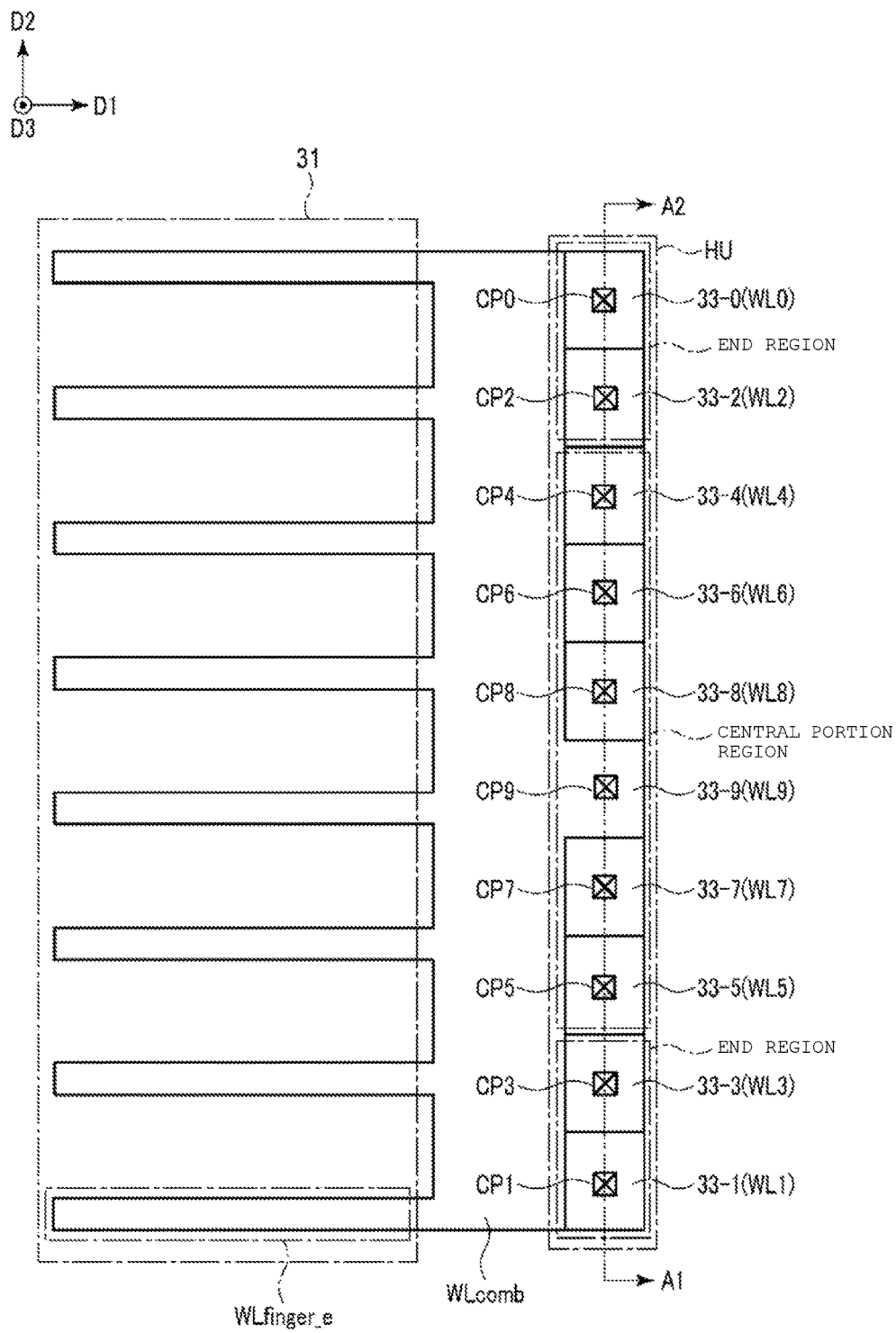
FIG. 8 is a plan view of the word line fingers and the hookup portion provided in the semiconductor memory device according to the first embodiment.
Figure 9:
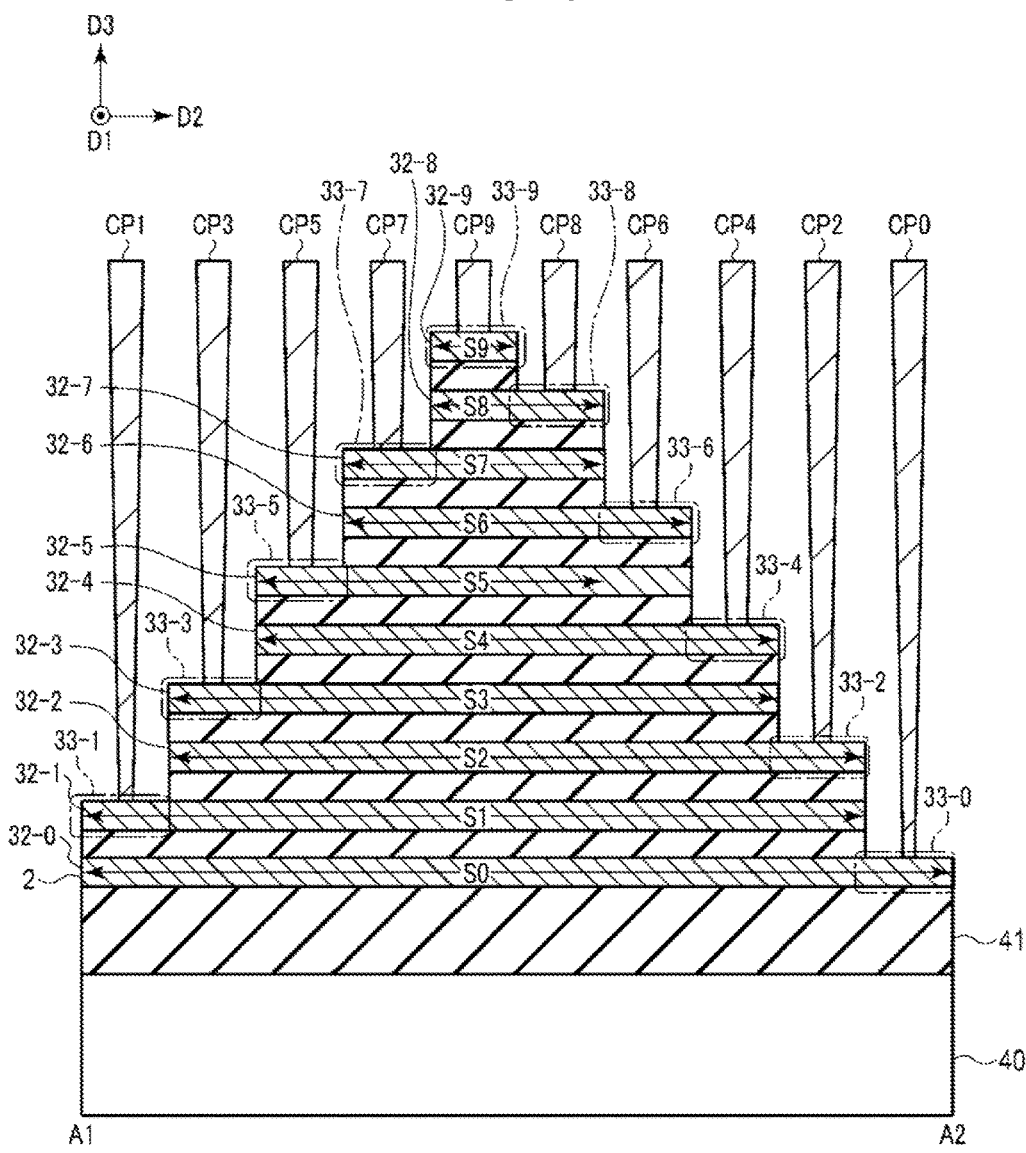
FIG. 9 is a cross-sectional view taken along line A1-A2 shown in FIG. 8.

Next, the configuration of the hookup portion HU will be described with reference to FIGS. 7 to 9. FIG. 7 shows a perspective view of a word line comb WLcomb and a hookup portion HU. FIG. 8 shows an example of a plan view of the word line finger WLfinger and the hookup portion HU, and FIG. 9 shows a cross-sectional view of the hookup portion HU taken along line A1-A2 in FIG. 8. In the example of FIGS. 7 and 8, for the purpose of simplifying description, in the word line comb WLcomb having a dual comb structure, one word line comb WLcomb and one extraction portion 32 are shown, and the word line comb WLcomb provided on the opposite side of the extraction portion 32 interposed therebetween is omitted. In addition, in the example of FIG. 7, the even-numbered word line finger WLfinger_e are shown, but the odd-numbered word line finger WLfinger_o also have the same configuration. Further, in the example of FIG. 7, an interlayer insulating film is omitted. In the example of FIG. 8, the odd-numbered word line fingers WLfinger_o and the bit line BL in the memory unit 31 are omitted. In the example of FIG. 9, an interlayer insulating film that covers a wiring and the extraction portion 32 except the word line WL is omitted.

As shown in FIG. 7, the word line comb WLcomb is configured such that a plurality of even-numbered word line fingers WLfinger_e extending in the first direction D1 are connected to one side surface (hereinafter, referred to as a "first surface") of a comb main body (electrode main body), and the extraction portion 32 is connected to a side surface (hereinafter, referred to as a "second surface") of the electrode main body facing away from the first surface in the first direction D1. Hereinafter, extraction portions corresponding to word lines WL0 to WL9 (word line comb WLcomb on zeroth layer to ninth layer) are denoted as 32-0 to 32-9, respectively. In addition, contact region portions corresponding to the word lines WL0 to WL9 are denoted as 33-0 to 33-9, respectively. In the contact region portions 33-0 to 33-9, the word lines WL (word line fingers WLfinger) are connected to upper wiring layers (not shown) connected to the WL decoder 22, respectively, through corresponding contact plugs CP0 to CP9. The contact plugs CP0 to CP9 are simply denoted as the contact plug CP in a case where there no particular limitation thereto. The number of contact plugs CP provided for each contact region portion 33 is one, but may be two or more. There is no limitation on the number of contact plugs CP connected to one contact region portion 33.

As shown in FIG. 8, in the present embodiment, the contact region portions 33-1, 33-3, 33-5, 33-7, 33-9, 33-8, 33-6, 33-4, 33-2, and 33-0 are provided in order in the third direction D3, and staggered in the direction D2. That is, the contact region portion 33-9 corresponding to the uppermost word line WL9 is disposed so as to be connected to the central portion region of the second surface of the word line comb WLcomb. The contact region portion 33-0 corresponding to the lowermost word line WL0 is disposed so as to be connected to the end region of the second surface of the word line comb WLcomb. Hereinafter, in the present embodiment, the regions of the contact region portions 33-0 to 33-3 disposed on both ends of the second surface of the word line comb WLcomb along the second direction D2 are referred to as end regions, and the regions of the contact region portions 33-4 to 33-9 disposed in regions close to the center of the second surface of the word line comb WLcomb are referred to as central portion regions. The number of contact region portions 33 included in the end regions and the central portion regions may be set freely. For example, the contact region portion 33-0 and 33-1 may be considered as included in the end regions, and the contact region portion 33-2 to 33-9 may be considered as included in the central portion regions. In addition, the contact region portion 33 may be disposed in any manner, but the contact region portion 33-9 corresponding to the uppermost word line WL9 is not disposed on the end of the second surface of the word line comb WLcomb. The contact region portion 33-9 is disposed at a position closer to the center of the second surface of the word line comb WLcomb, and the contact region portion 33-0 corresponding to the lowermost word line WL0 is disposed on the extreme end of the second surface of the word line comb WLcomb.

Next, the cross-sectional shape of the extraction portion 32 in the hookup portion HU will be described.

As shown in FIG. 9, an interlayer insulating film 41 is provided on a semiconductor substrate 40, and the extraction portions 32-0 to 32-9 are stacked on the interlayer insulating film 41 with the interlayer insulating film interposed between adjacent ones of the extraction portions 32-0 to 32-9 and between the lowermost extraction portion 32-0 and the semiconductor substrate 40. The contact plugs CP0 to CP9 are connected to the extraction portions 32-0 to 32-9 at the contact region portions 33-0 to 33-9, respectively. In the present embodiment, the contact region portion 33-9 corresponding to the uppermost word line WL9 located in the central portion region of the second surface of the word line comb WLcomb in the second direction D2. More specifically, the contact region portion 33-9 of the extraction portion 32-9 having a shortest length in the second direction D2 is located at the center of the second surface of the word line comb WLcomb, or offset from the center in the second direction D2 by, at most, the spacing between adjacent contact regions in the second direction D2, where an even number of extraction portions 32 are provided. In the example of FIG. 9, the contact region portions 33-7, 33-5, 33-3, and 33-1 corresponding to odd-numbered word lines WL7, WL5, WL3, and WL1 are sequentially provided from the contact region portion 33-9 toward the left end of the plane of paper. On the other hand, the contact region portions 33-8, 33-6, 33-4, 33-2, and 33-0 corresponding to even-numbered word lines WL8, WL6, WL4, WL2, and WL0 are sequentially provided from the contact region portion 33-9 toward the right end of the plane of paper. In other words, the contact region portions 33-1, 33-3, 33-5, 33-7, and 33-9 located on odd-numbered steps are disposed in a step shape so that the step height of the odd numbered extraction portions 32 is two levels of extraction portions 32 and intervening interlayer insulating layers 41 from one end of the second surface of the word line comb WLcomb toward the central portion. Similarly, the contact region portions 33-0, 33-2, 33-4, 33-6, and 33-8 located on even-numbered steps are disposed in a step shape so that the step height of the even numbered extraction portions 32 is two levels of extraction portions 32 and intervening interlayer insulating layers 41 from the other end region of the second surface toward the central portion region.

For example, the lengths of the extraction portions 32-0 to 32-9 corresponding to the word lines WL0 to WL9 in the second direction D2 are denoted as lengths S0 to S9, respectively. Then, the length S9 of the extraction portion 32-9 is the same as the length of the contact region portion 33-9. On the other hand, the length S8 of the extraction portion 32-8 is substantially equal to a length obtained by adding the length of the contact region portion 33-8 and the length of the contact region portion 33-9 together. Similarly, the length S7 of the extraction portion 32-7 is substantially equal to a length obtained by adding the length of the contact region portion 33-7, the length of the contact region portion 33-8, and the length of the contact region portion 33-9 together. Therefore, the length of the extraction portion 32 corresponding to each word line WL has a relation of S9<S8<S7<S6<S5<S4<S3<S2<S1<S0, and becomes larger toward an extraction portion 32 corresponding to a lower word line WL. That is, its area becomes larger, by the length of one contact region portion 33, at each extraction portion 32 corresponding to a lower word line WL. In the present embodiment, a contact region portion 33 of a long extraction portion 32, that is, a contact region portion 33 corresponding to a lower word line WL is disposed in the end region of the second surface of the word line comb WLcomb, and a contact region portion 33 of a short extraction portion 32, that is, a contact region portion 33 corresponding to an upper word line WL is disposed in the central portion region of the second surface of the word line comb WLcomb. In other words, a contact region portion 33 of an extraction portion 32 having a large area is disposed in the end region of the second surface of the word line comb WLcomb, and a contact region portion 33 of an extraction portion 32 having a small area is disposed in the central portion region of the second surface of the word line comb WLcomb.

Therefore, the shape of the stacked word lines WL in the hookup portion HU becomes a double staircase shape of which the center is highest, for example, along the second direction D2.

For example, the diameter of the bottom of the contact plug CP may be smaller than the diameter of the upper portion thereof due to the processing characteristics of the contact plug CP. The side surface of the contact plug CP may be formed so that its inclination angle is set to be equal to or less than 90 degrees with respect to the plane surface of the semiconductor substrate 40 (hereinafter, such a shape is referred to as a "taper shape"). In such a case, the bottom of the contact plug CP differs in diameter for each word line layer, in accordance with the taper shape of the contact plug CP. More specifically, in the example of FIG. 9, the diameter of the contact plug CP9 connected to the uppermost contact region portion 33-9 is the largest, and the diameter of the contact plug CP0 connected to the lowermost contact region portion 33-0 is the smallest. Therefore, the contact resistance between the contact region portion 33-9 and the contact plug CP9 is lowest among the contact regions, and contact resistance between the contact region portion 33-0 and the contact plug CP0 is the highest among the contact regions.

1.4 Effects According to the Present Embodiment

With the configuration according to the present embodiment, it is possible to improve the reliability of the semiconductor memory device. Hereinafter, the effects will be described in detail with reference to FIGS. 10 to 12.

Figure 10:
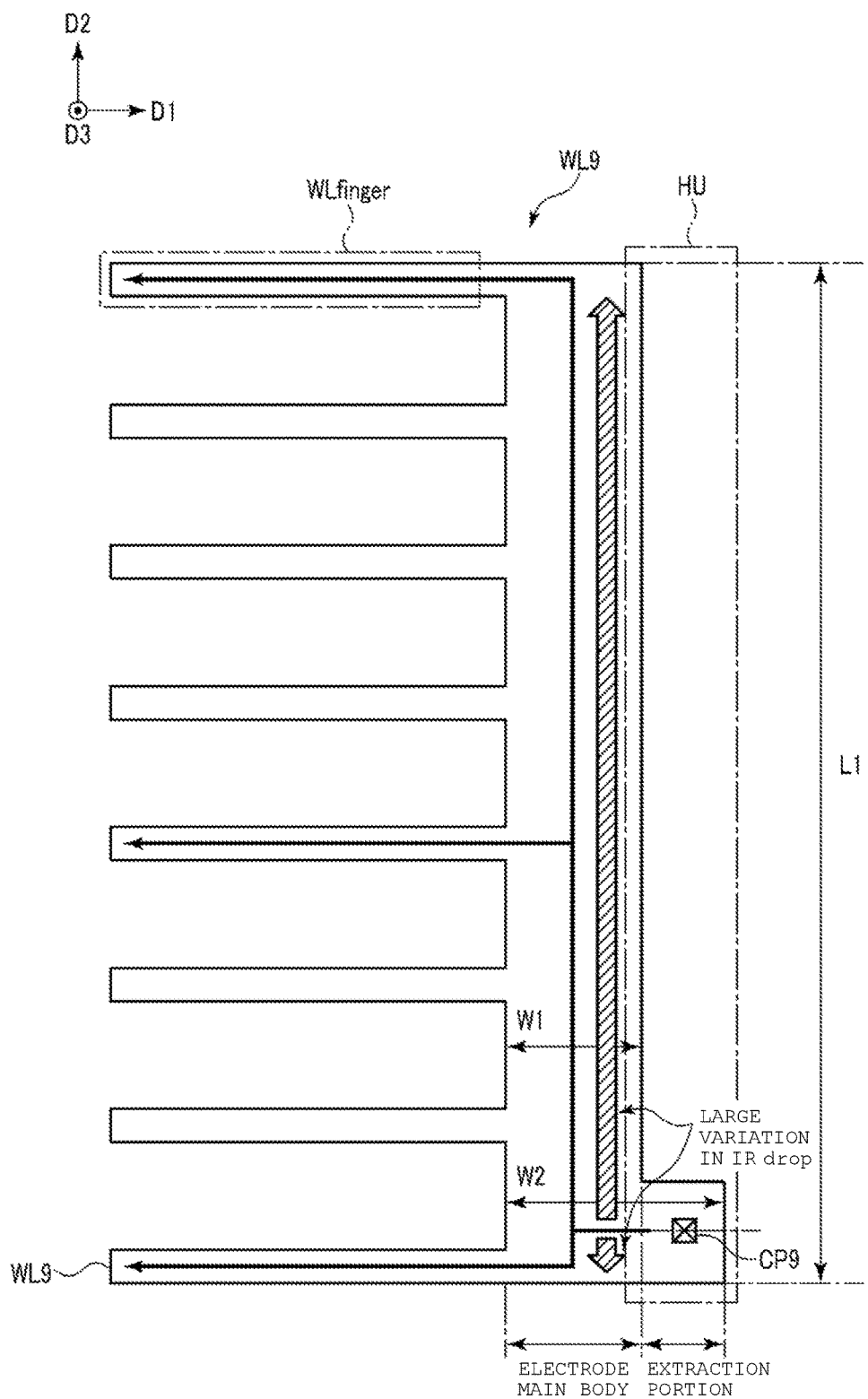
FIG. 10 is an example diagram in a case where a contact region portion corresponding to an uppermost word line is provided in an end region.
Figure 11:
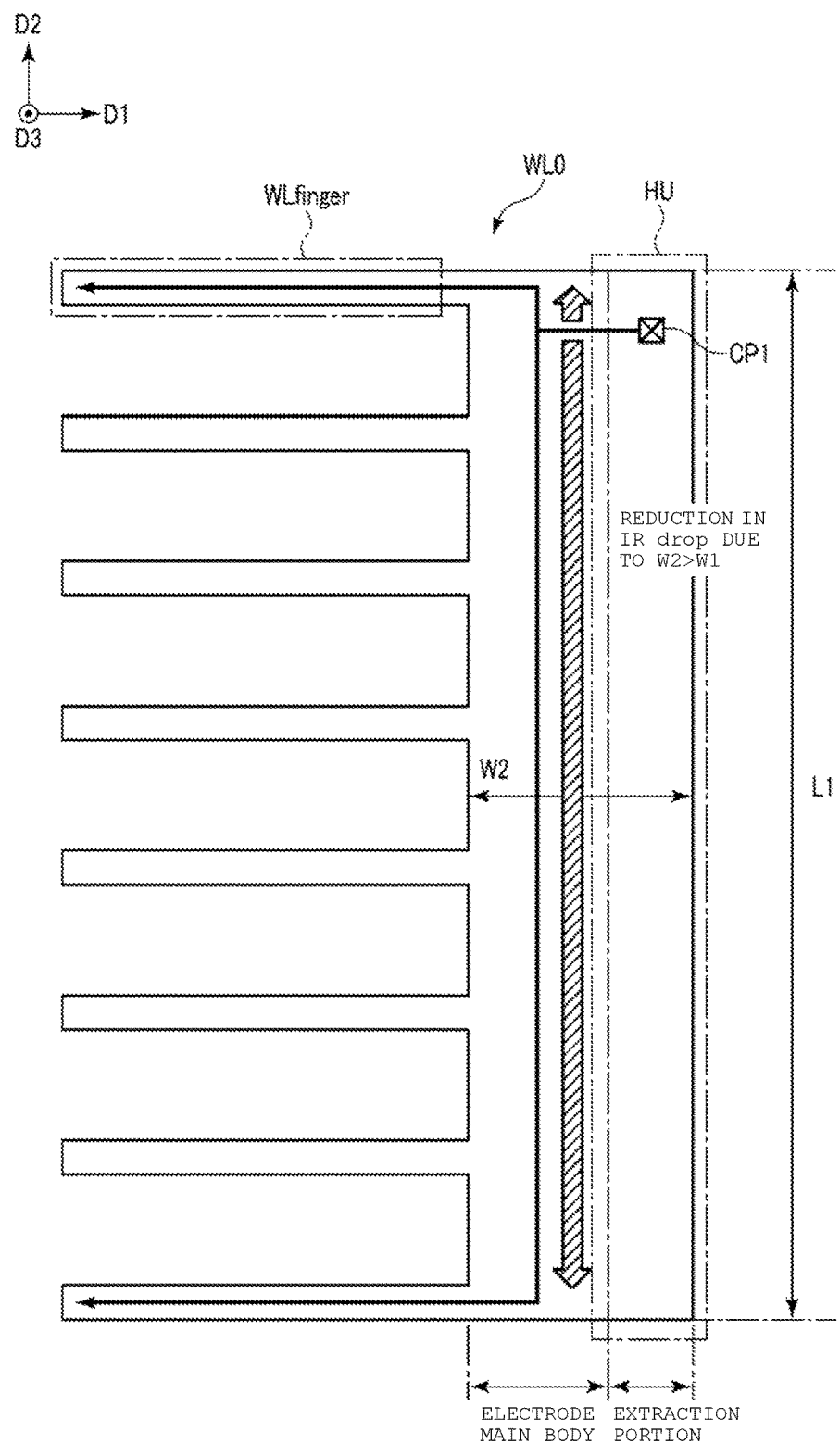
FIG. 11 is an example diagram in a case where a contact region portion corresponding to a lowermost word line is provided in the end region.

In a three-dimensional stacked memory having the word line comb WLcomb stacked above a semiconductor substrate, in the case where the extraction portion 32 (contact region portion 33) connected to the uppermost word line comb WLcomb is provided in the end region of the second surface of the word line comb WLcomb, the variation in a voltage between the word line fingers WLfinger in the uppermost word line comb WLcomb is large. Such an example will be described with reference to FIGS. 10 and 11. FIG. 10 shows an example of a case where the contact region portion 33-9 is disposed in the end region of the second surface of the word line comb WLcomb without applying the present embodiment. FIG. 11 shows an example of a case where the contact region portion 33-0 is disposed in the end region of the second surface of the word line comb WLcomb of the present embodiment.

For example, in a case where the contact region portions 33-0 to 33-9 are disposed in order along the second direction from the end of the second surface of the word line comb WLcomb, the contact region portion 33-9 corresponding to the uppermost word line WL9 and the contact region portion 33-0 corresponding to the lowermost word line WL0 are disposed on the opposite ends of the second surface of the word line comb WLcomb. As shown in FIG. 10, for example, in this word line comb WLcomb, its length in the second direction D2 is set to L1, the length (width) of the electrode main body (portion except a comb tooth (word line finger WLfinger) in the first direction) in the first direction D1 is set to W1, and a length (width) obtained by adding the extraction portion 32 to the length W1 is set to W2. Then, a distance from the contact plug CP9 corresponding to the uppermost word line WL9 (word line comb WLcomb) to each word line finger WLfinger exhibits a difference of approximately length L1 between a word line finger WLfinger located at a position close to the contact plug CP9 and a word line finger WLfinger located at a position distant from the contact plug CP9. Thereby, the cumulative wiring resistance from the contact plug CP9 to each word line finger WLfinger varies, and is greatest between contact region CP9 and the WLfinger closest to the top of FIG. 10. For this reason, a variation in voltage drop (IR drop) from the contact plug CP9 to each word line finger WLfinger becomes relatively large.

On the other hand, as shown in FIG. 11, in a case of the contact region portion 33-0 corresponding to the lowermost word line WL0 (word line comb WLcomb), the distance from the contact plug CP0 to each word line finger WLfinger exhibits a variation of approximately length L1, similarly to that of the contact region portion 33-9. However, the extraction portion 32 corresponding to the lower word line WL has a large width in the first direction D1. For this reason, the width of an effective wiring for connecting the contact plug CP0 and each word line finger WLfinger is set to W2, and is larger than the width W1 of a wiring for connecting the contact plug CP9 and each word line finger WLfinger. Therefore, wiring resistance from the contact plug CP0 to each word line finger WLfinger is smaller than that between contact plug CP9 and the WLfingers. Thus, the variation in voltage drop (IR drop) from the contact plug CP0 corresponding to the lowermost word line WL0 to each word line finger WLfinger is smaller than the variation in voltage drop (IR drop) from the contact plug CP9 corresponding to the uppermost word line WL9 to each word line finger WLfinger. That is, the differences in voltage drop from the contact region portion 33 corresponding to the upper word line WL is larger than the differences in voltage drop from the contact region portion 33 corresponding to the lower word line WL.

Therefore, in a case where the contact region portion 33 (of the short extraction portion 32) corresponding to the upper word line WL is provided on the end of the second surface of the word line comb WLcomb, a variation in voltage drop for each word line WL layer, that is, a variation in electrical characteristics becomes larger.

Figure 12:
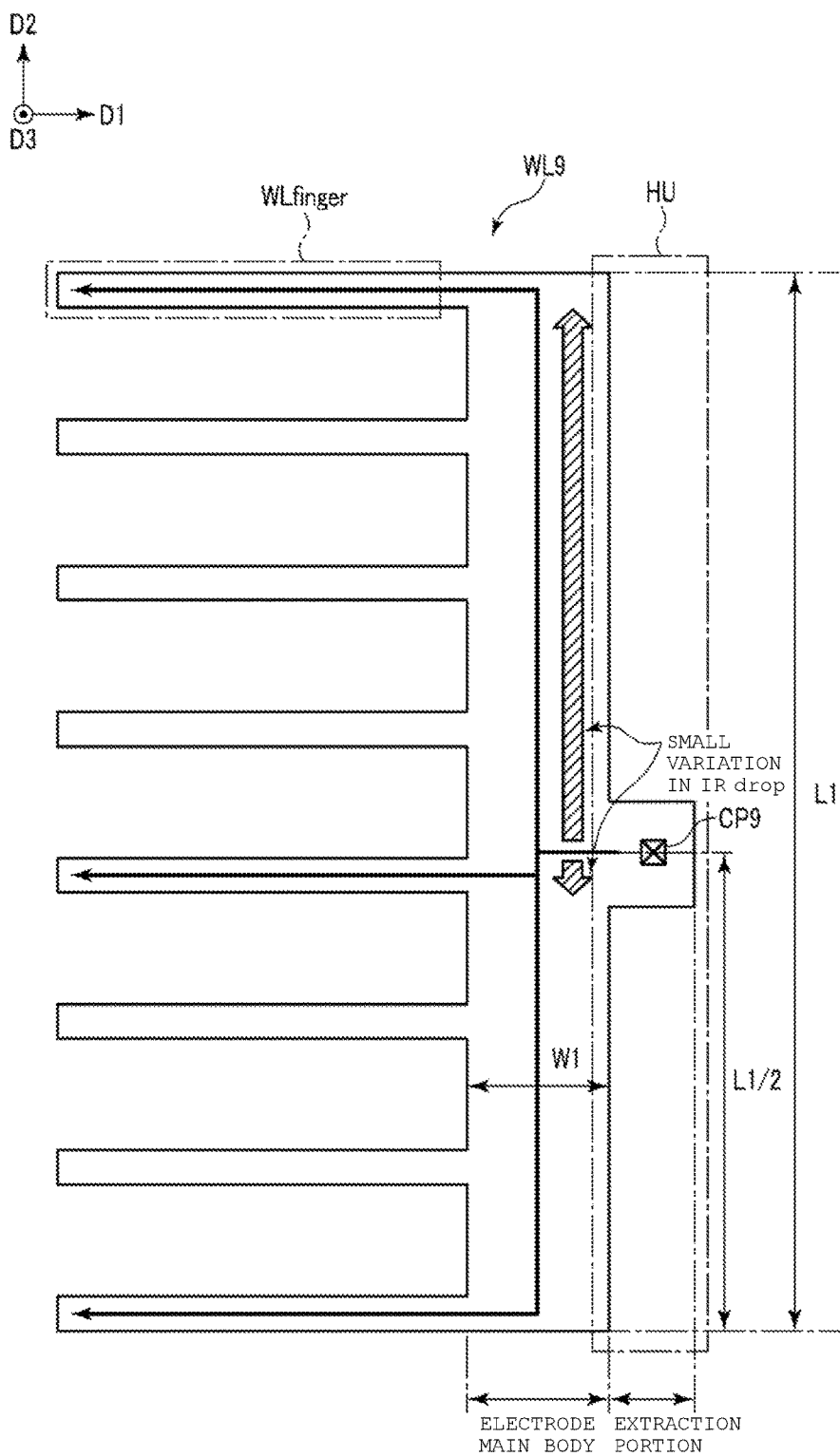
FIG. 12 is an example diagram in a case where the contact region portion corresponding to the uppermost word line is provided in a central portion region.

On the other hand, in the configuration according to the present embodiment, the contact region portion 33 corresponding to the upper word line WL is not disposed at the end region of the second surface of the word line comb WLcomb, but is disposed in its central portion region. The contact region portion 33 corresponding to the lowest word line WL is disposed at the end region of the second surface of the word line comb WLcomb. That is, the contact region portion 33 of the relatively shorter, in direction D2, extraction portions 32 is disposed in the central portion region of the second surface of the word line comb WLcomb, and the contact region portion 33 of the relatively longer, in direction D2, extraction portions 32 is disposed at the end region of the second surface of the word line comb WLcomb. Thereby, it is possible to reduce the variation in voltage drop from the contact plug CP to each word line WL. FIG. 12 shows a specific example of the effects. FIG. 12 shows an example of a case where the contact region portion 33-9 is disposed in the central portion region of the second surface of the word line comb WLcomb by applying the present embodiment.

As shown in FIG. 12, in a case where the contact region portion 33-9 corresponding to the uppermost word line WL9 is disposed in the central portion region of the second surface of the word line comb WLcomb, a distance from the contact plug CP9 to the word line fingers WLfinger is reduced to a difference of approximately length (L1)/2 between a word line finger WLfinger located at a position close to the contact plug CP9 and a word line finger WLfinger located at a position distant from the contact plug CP9. Therefore, the variation in voltage drop is smaller than in a case where the contact region portion 33-9 corresponding to the uppermost word line WL9 is disposed in the end region of the second surface of the word line comb WLcomb.

Therefore, since a variation in voltage (voltage drop) in each word line finger WLfinger can be reduced, malfunction in write and read operations is prevented, and thus it is possible to improve reliability of the semiconductor memory device.

Further, since a variation in voltage drop to each word line finger WLfinger can be reduced, it is possible to shorten the charge and discharge time of the word line finger WLfinger in write and read operations, and to thereby speed up these operations. Thus, it is possible to improve the processing capacity of a semiconductor memory device.

Further, in the configuration according to the present embodiment, the contact region portion 33 is disposed so that the stepped difference between adjacent contact regions 33 of the extraction portions 32 adjacent along the second direction is two steps from the end of the second surface of the word line comb WLcomb toward its central portion. For this reason, since a steep stepped difference of, for example, three steps or more is not formed, a defect in forming the contact portions CP can be reduced after the extraction portion 32 is processed, and then the hookup portion HU is embedded with an interlayer insulating film.

Further, in the configuration according to the present embodiment, two word line combs WLcomb on the same layer corresponding to two memory units 31 are connected to one extraction portion 32 in one hookup portion HU. Therefore, it is possible to prevent an increase in the area of the hookup portion HU. Therefore, it is possible to prevent an increase in the chip area of a semiconductor memory device.

Further, in the configuration according to the present embodiment, the contact plug CP having a relatively large contact area and a relatively low resistance value is connected to the upper extraction portion 32 having a relatively small area disposed in the central portion region and a relatively high resistance value. The contact plug CP having a relatively small contact area and a relatively high resistance value is connected to the lower extraction portion 32 having a relatively large area disposed in the end region and a relatively low resistance value. By this combination, it is possible to reduce variations in a resistance value between the contact plug CP and the word line finger WLfinger in the upper word line comb WLcomb, and a resistance value between the contact plug CP and the word line finger WLfinger in the lower word line comb WLcomb.

2. Second Embodiment

Next, a second embodiment will be described. In the second embodiment, three specific examples are shown with respect to the shape of a different hookup portion HU. Hereinafter, only points different from those in the first embodiment will be described.

2.1 First Example

Figure 13:
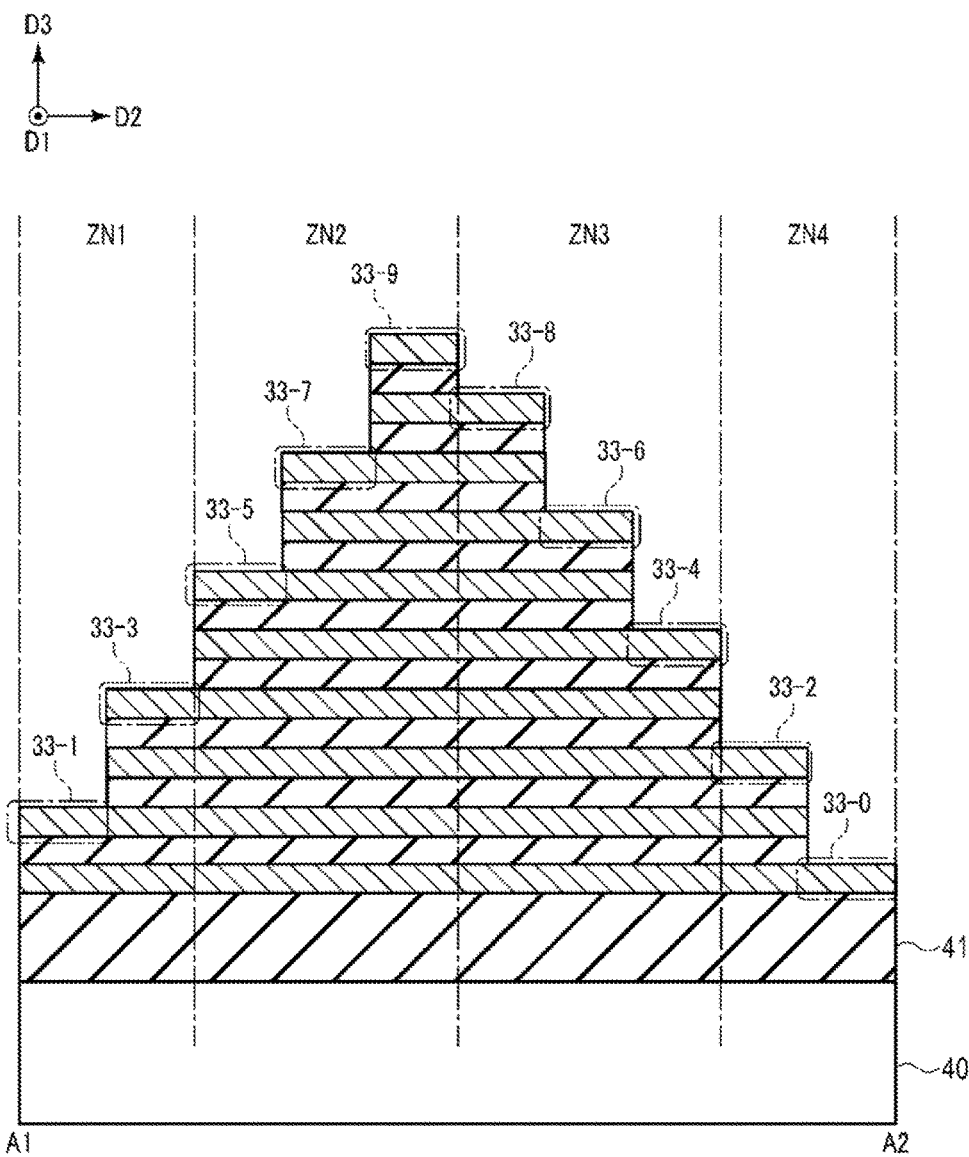
FIG. 13 is an example diagram in a case where a stepped contact region portion is divided into four zones.
Figure 14:
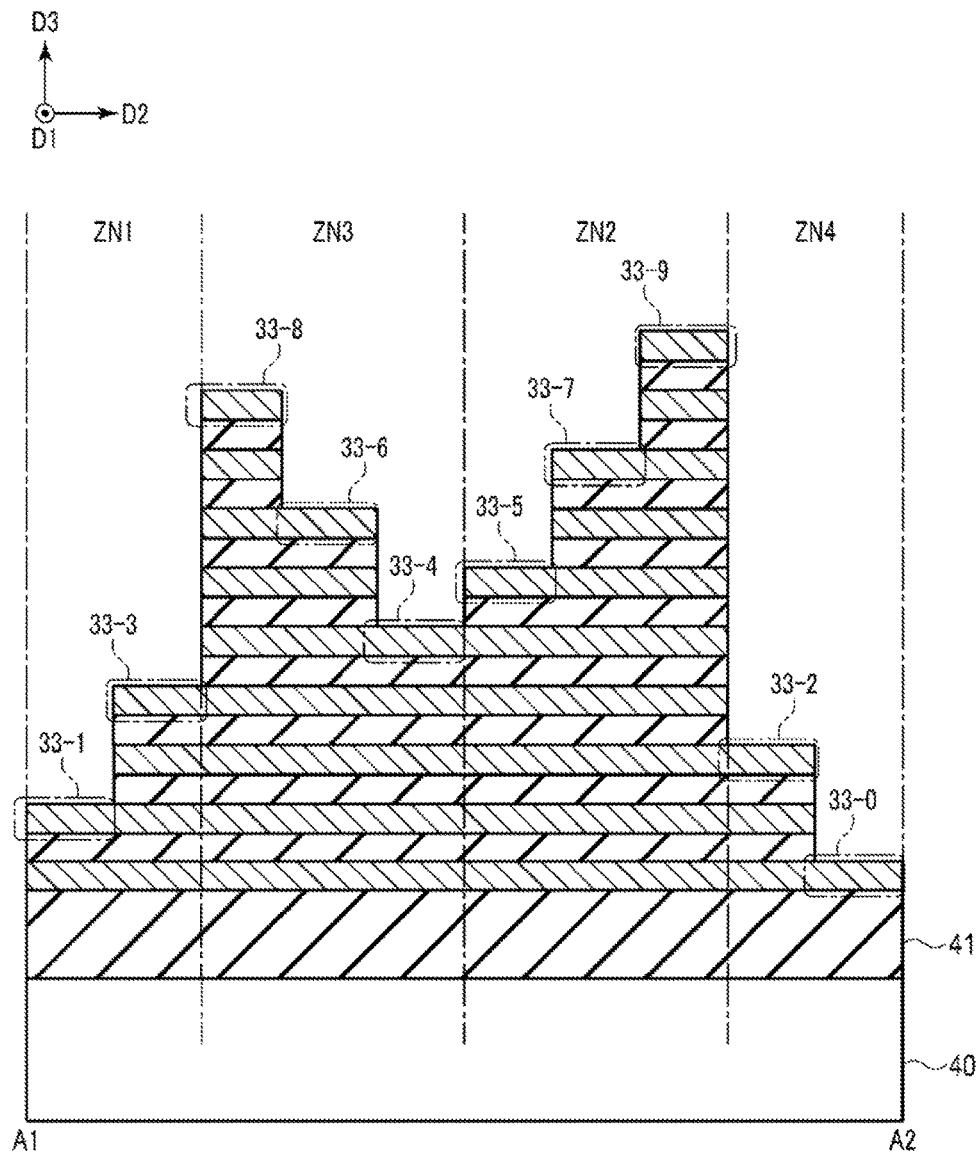
FIG. 14 is a cross-sectional view of a hookup portion provided in a semiconductor memory device according to a first example of a second embodiment.

First, a first example will be described with reference to FIGS. 13 and 14. FIG. 13 shows an example in a case where the contact region portion 33 is divided into four zones ZN in FIG. 9 of the first embodiment. FIG. 14 shows a cross-sectional view of a hookup portion HU in the first example of the second embodiment. In the examples of FIG. 13 and FIG. 14, an interlayer insulating film that covers the contact plug CP and the contact region portion 33 is omitted.

In the first example, a description will be given of a case where the disposition of the contact region portions 33-0 to 33-9 described with reference to FIG. 9 of the first embodiment is divided into four zones ZN, and the zones ZN are rearranged.

First, an example in which FIG. 9 of the first embodiment is divided into four zones ZN is shown in FIG. 13.

As shown in FIG. 13, along the second direction D2, the disposition of the contact region portions 33-1 and 33-3 is set to a zone ZN1, the disposition of the contact region portions 33-5, 33-7, and 33-9 is set to a zone ZN2, the disposition of the contact region portions 33-8, 33-6, and 33-4 is set to a zone ZN3, and the disposition of the contact region portions 33-2 and 33-0 is set to a zone ZN4. The number of zones ZN and the number of contact region portions 33 included in each zone ZN may be set freely.

In the first example, the zone ZN2 and the zone ZN3 of FIG. 13 are switched with each other, and the result is shown in FIG. 14. More specifically, the zone ZN1 (contact region portions 33-1 and 33-3), the zone ZN3 (contact region portions 33-8, 33-6, and 33-4), the zone ZN2 (contact region portions 33-5, 33-7, and 33-9), and the zone ZN4 (contact region portions 33-2 and 33-0) are disposed in order along the second direction D2. In the first example, the number of zones ZN divided is four, and is even-numbered. Therefore, the inside zones ZN located at positions symmetric with respect to the center of the second surface of the word line comb WLcomb are switched. That is, the zone ZN2 and the zone ZN3 are switched with each other, but the zone ZN1 and the zone ZN4 are not switched. Thereby, the contact region portion 33-9 corresponding to the uppermost word line WL9 is not disposed in the end region of the second surface of the word line comb WLcomb. In addition, the contact region portion 33-0 corresponding to the lowermost word line WL0 is not disposed in the central portion region of the second surface of the word line comb WLcomb. An example in which the number of zones ZN is odd-numbered will be described later.

2.2 Second Example

Figure 15:
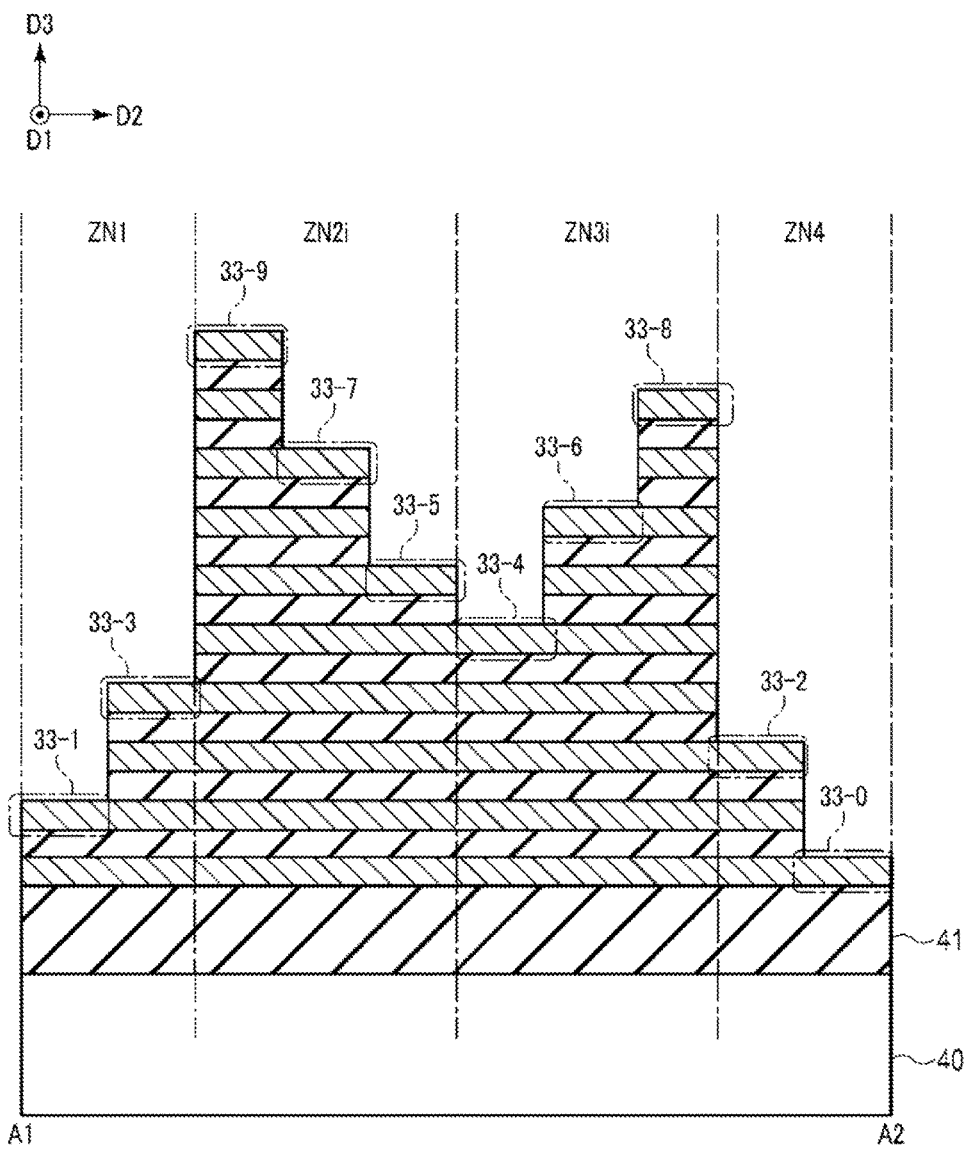
FIG. 15 is a cross-sectional view of a hookup portion provided in a semiconductor memory device according to a second example of the second embodiment.

Next, a second example will be described with reference to FIG. 15. FIG. 15 shows a cross-sectional view of a hookup portion HU in the second example of the second embodiment. In the example of FIG. 15, an interlayer insulating film that covers the contact plug CP and the contact region portion 33 is omitted.

In the second example, a description will be given of a case where zones ZN are reversed with respect to four zones ZN described with reference to FIG. 13 of the first example.

As shown in FIG. 15, in the second example, the zone ZN2 and the zone ZN3 are disposed so as to be reversed in the second direction D2 such that the sequence of the individual contact region portions in the zones "ZN2$i$" and "ZN3$i$" are reversed compared to the sequence of the individual contact zones in zones ZN2 and ZN3 (hereinafter, the reversed layouts are denoted as "ZN2$i$" and "ZN3$i$"). More specifically, the zone ZN1 (contact region portions 33-1 and 33-3), the zone ZN2$i$ (contact region portions 33-9, 33-7, and 33-5), the zone ZN3$i$ (contact region portions 33-4, 33-6, and 33-8), and the zone ZN4 (contact region portions 33-2 and 33-0) are disposed in order along the second direction D2. In the second example, zones ZN which do not include an end region are reversed. That is, the zones ZN2 and ZN3 may be reversed, but the zones ZN1 and ZN4 are not reversed. Thereby, the contact region portion 33-0 corresponding to the lowermost word line WL0 is not caused to be disposed in the central portion region of the second surface of the word line comb WLcomb.

2.3 Third Example

Figure 16:
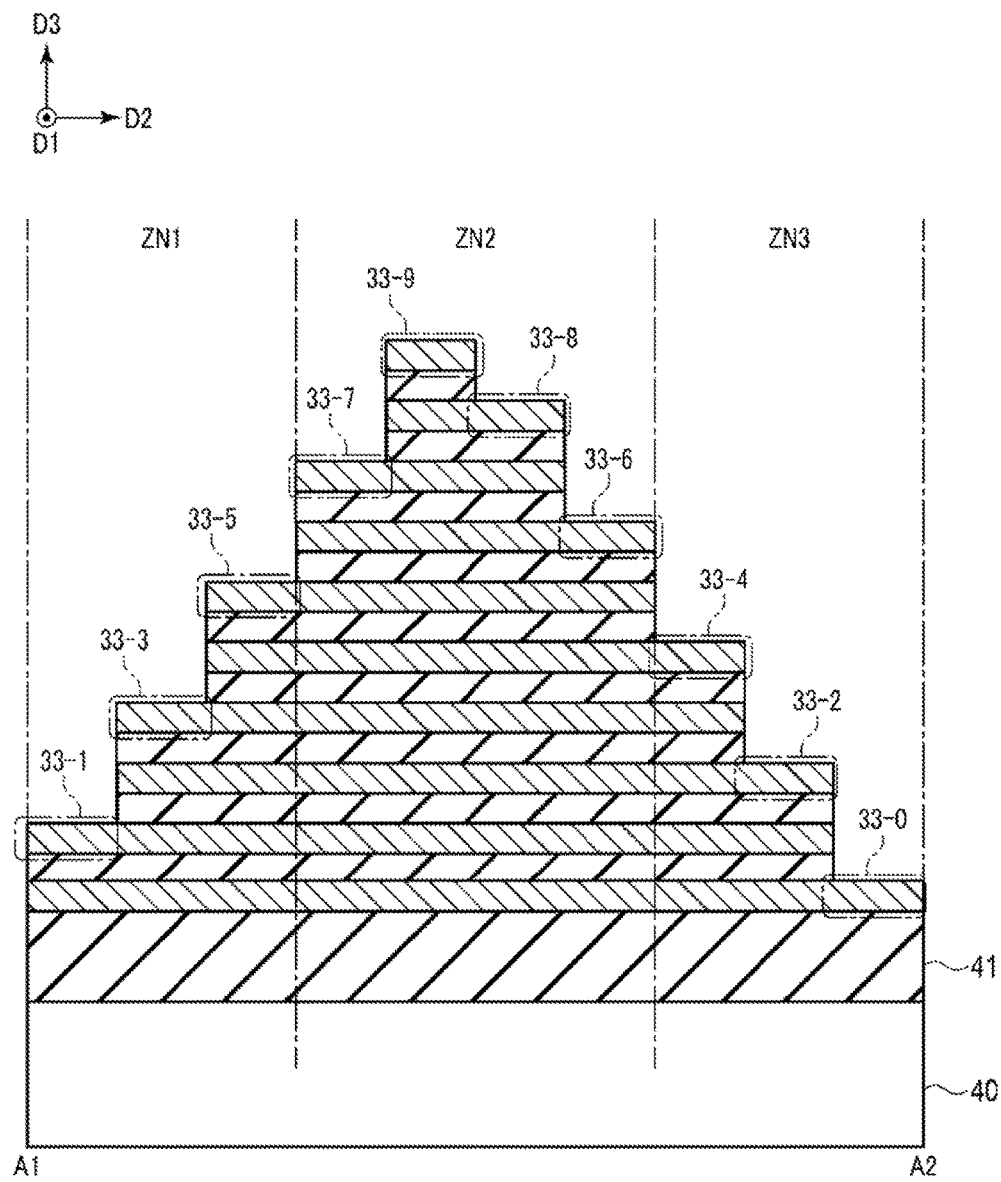
FIG. 16 is an example diagram in a case where the stepped contact region portion is divided into three zones.
Figure 17:
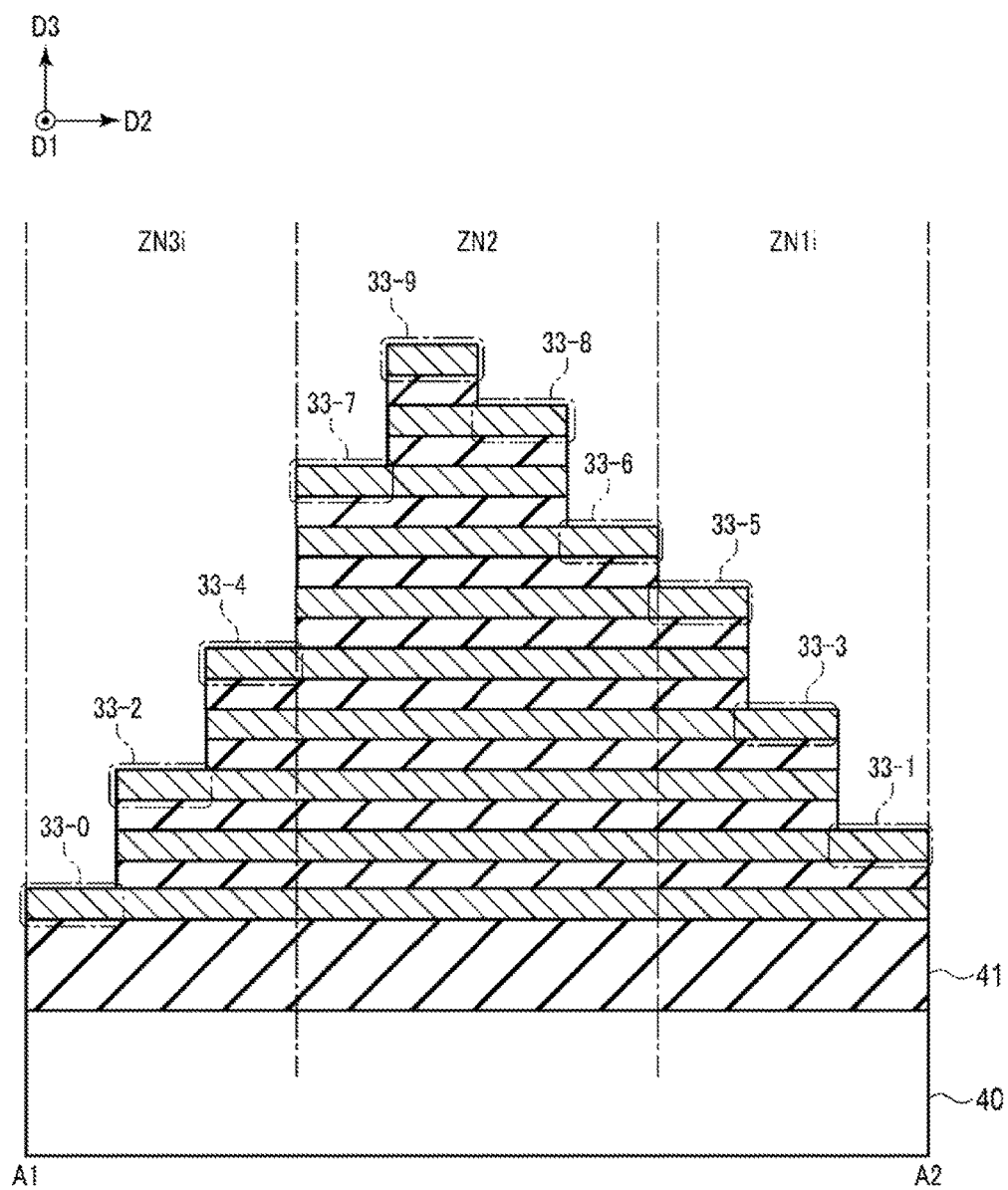
FIG. 17 is a cross-sectional view of a hookup portion provided in a semiconductor memory device according to a third example of the second embodiment.

Next, a third example will be described with reference to FIGS. 16 and 17. FIG. 16 shows an example of a case where the contact region portion 33 is divided into three zones ZN in FIG. 9 of the first embodiment. FIG. 17 shows a cross-sectional view of a hookup portion HU in the third example of the second embodiment. In the examples of FIGS. 16 and 17, an interlayer insulating film that covers the contact plug CP and the contact region portion 33 is omitted.

In the third example, a description will be given of a case where the disposition of the contact region portions 33-0 to 33-9 described with reference to FIG. 9 of the first embodiment is divided into three zones ZN, and the zones ZN are reversed and rearranged.

First, an example in which FIG. 9 of the first embodiment is divided into three zones ZN is shown in FIG. 16.

As shown in FIG. 16, along the second direction D2, the disposition of the contact region portions 33-1, 33-3, and 33-5 is set to a zone ZN1, the disposition of the contact region portions 33-7, 33-9, 33-8, and 33-6 is set to a zone ZN2, and the disposition of the contact region portions 33-4, 33-2, and 33-0 is set to a zone ZN3. The number of zones ZN and the number of contact region portions 33 included in each zone ZN may be set freely.

In the third example, the zone ZN1 and the zone ZN3 are reversed and interchanged with each other, and the result is shown in FIG. 17. More specifically, the zone ZN3$i$ (contact region portions 33-0, 33-2, and 33-4 in that order in the second direction D2 from the left side of the Fig.), the zone ZN2 (contact region portions 33-7, 33-9, 33-8, and 33-6 in that order in the second direction D2 from the left to right side of the Fig.), and the zone ZN1$i$ (contact region portions 33-5, 33-3, and 33-1 in that order in the second direction D2 from the left to right side of the Fig.) are disposed in order along the second direction D2. In the third example, the number of zones ZN divided is three, and is odd-numbered. Therefore, the zones ZN located at positions symmetric with respect to the center of the second surface of the word line comb WLcomb are reversed and switched with each other. More specifically, the zones ZN1 and ZN3 are reversed and switched with each other. In this case, the position of the central zone ZN2 is maintained. Thereby, the contact region portion 33-9 corresponding to the uppermost word line WL9 is not disposed in the end region of the second surface of the word line comb WLcomb. In addition, the contact region portion 33-0 corresponding to the lowermost word line WL0 is not disposed in the central portion region of the second surface of the word line comb WLcomb.

2.4 Effects According to the Present Embodiment

With the configuration according to the second embodiment, it is possible to obtain the same effects as those in the first embodiment.

3. Third Embodiment

Next, a third embodiment will be described. In the third embodiment, a method of manufacturing the hookup portion HU will be described. In the third embodiment, a case where eight word lines WL0 to WL7 are stacked one over the other will be described. Hereinafter, only points different from those in the first and second embodiments will be described.

3.1 with Respect to Configuration of Hookup Portion

Figure 18:
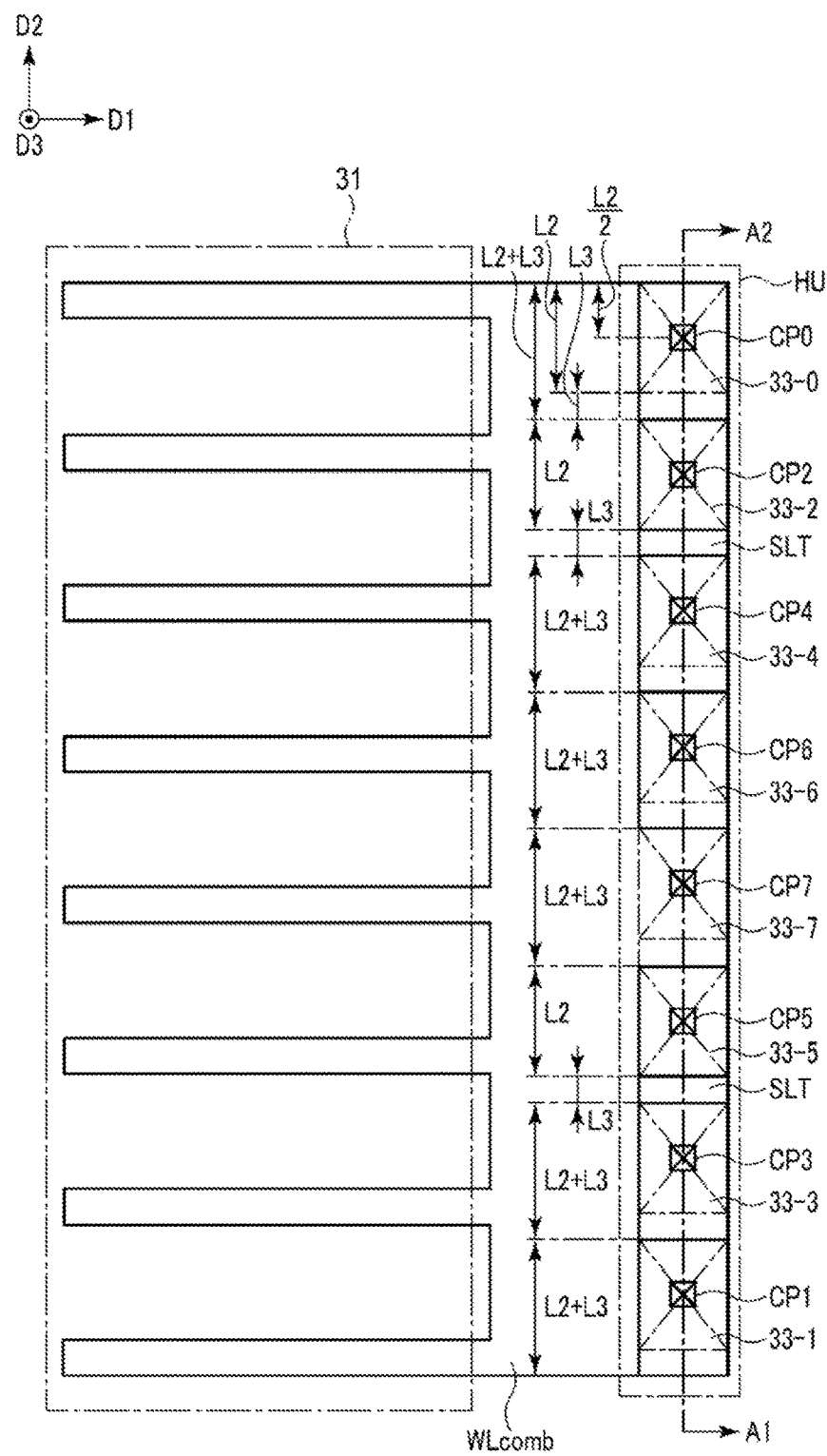
FIG. 18 is a plan view of word line fingers and a hookup portion provided in a semiconductor memory device according to a third embodiment.

First, the configuration of the hookup portion HU in the present embodiment will be described with reference to FIG. 18. FIG. 18 shows an example of a plan view of the word line comb WLcomb and the hookup portion HU. In the example of FIG. 18, for the purpose of simplifying description, one word line comb WLcomb corresponding to one memory unit 31 is shown, and the word line comb WLcomb and the bit line BL that face the memory unit 31 are omitted.

As shown in FIG. 18, in the present embodiment, in the hookup portion HU, eight contact region portions 33 are provided, and a slit SLT is provided between some of the contact region portions 33. More specifically, the contact region portions 33-1 and 33-3, the slit SLT, the contact region portions 33-5, 33-7, 33-6, and 33-4, the slit SLT, and the contact region portions 33-2 and 33-0 are provided in order from the end of the second surface of the word line comb WLcomb along the second direction D2. That is, the contact region portion 33-7 corresponding to the uppermost word line WL7 is disposed in the central portion region of the second surface of the word line comb WLcomb, and the contact region portion 33-0 corresponding to the lowermost word line WL is disposed in the end region of the second surface of the word line comb WLcomb. The slit SLT is provided between the contact region portion 33-3 and the contact region portion 33-5, and between the contact region portion 33-4 and the contact region portion 33-2. The slit SLT separates the extraction portions 32, and reaches the second surface of the word line comb WLcomb in the first direction D1.

The present embodiment is applied, and thus the slit SLT is formed at the same position in any semiconductor chip in a case of the same product. Therefore, in a case where the slit SLT is formed at the same position in a plurality of chips, it is likely that the slit SLT is considered to be formed intentionally at the same position rather than due to a manufacturing variation, and that the present specification is applied.

Hereinafter, the length of the contact region portion 33 in the second direction D2 will be described in detail. In consideration of a manufacturing variation such as the superimposition accuracy of photolithography in the second direction D2, a length required for a region of connection to the contact plug CP is set to L2, and the width of the slit SLT is set to L3. For example, in the present embodiment, in the extraction portion 32 on each layer, a length obtained by adding the slit SLT and the contact region portion 33 together is set to a constant length of L2+L3. More specifically, the length of the contact region portions 33-1, 33-3, 33-7, 33-6, 33-4, and 33-0 in the second direction D2 is set to be L2+L3. On the other hand, the length of the contact region portions 33-5 and 33-2 is set to be L2. That is, the length of the contact region portions 33-5 and 33-2 is smaller than the length of other contact region portions 33 by the length L3 of the slit SLT.

The contact plugs CP0 to CP7 connected to the contact region portions 33-0 to 33-7 are arranged at equal intervals along the second direction D2. More specifically, for example, the length of the contact region portions 33-5 and 33-2 in the second direction D2 is L2. In this case, the contact region portions 33-5 and 33-2 are set so that the contact plug CP5 and CP2 are respectively connected to the central portions thereof, that is, at a distance of (L2)/2 from the ends in the second direction D2. On the other hand, the length of the contact region portions 33-1, 33-3, 33-7, 33-6, 33-4, and 33-0 in the second direction D2 is L2+L3. In this case, the contact region portions 33-1, 33-3, 33-7, 33-6, 33-4, and 33-0 are set so that the contact plugs CP1, CP3, CP7, CP6, CP4, and CP0 are respectively connected thereto at a distance of (L2)/2 from the upper ends of the plane of paper of FIG. 18 in each contact region portion 33. Thereby, the contact plugs CP0 to CP7 are arranged at equal intervals of L2+L3 along the second direction D2.

In the present embodiment, a description is given of a case where the length of the contact region portions 33-1, 33-3, 33-7, 33-6, 33-4, and 33-0 in the second direction D2 is set to L2+L3, and the length of the contact region portions 33-5 and 33-2 is set to L2, but the length of the contact region portions 33-1, 33-5, 33-7, 33-6, 33-2, and 33-0 may be set to L2+L3, and the length of the contact region portions 33-3 and 33-4 may be set to L2.

3.2 Method of Manufacturing Hookup Portion

Figure 19:
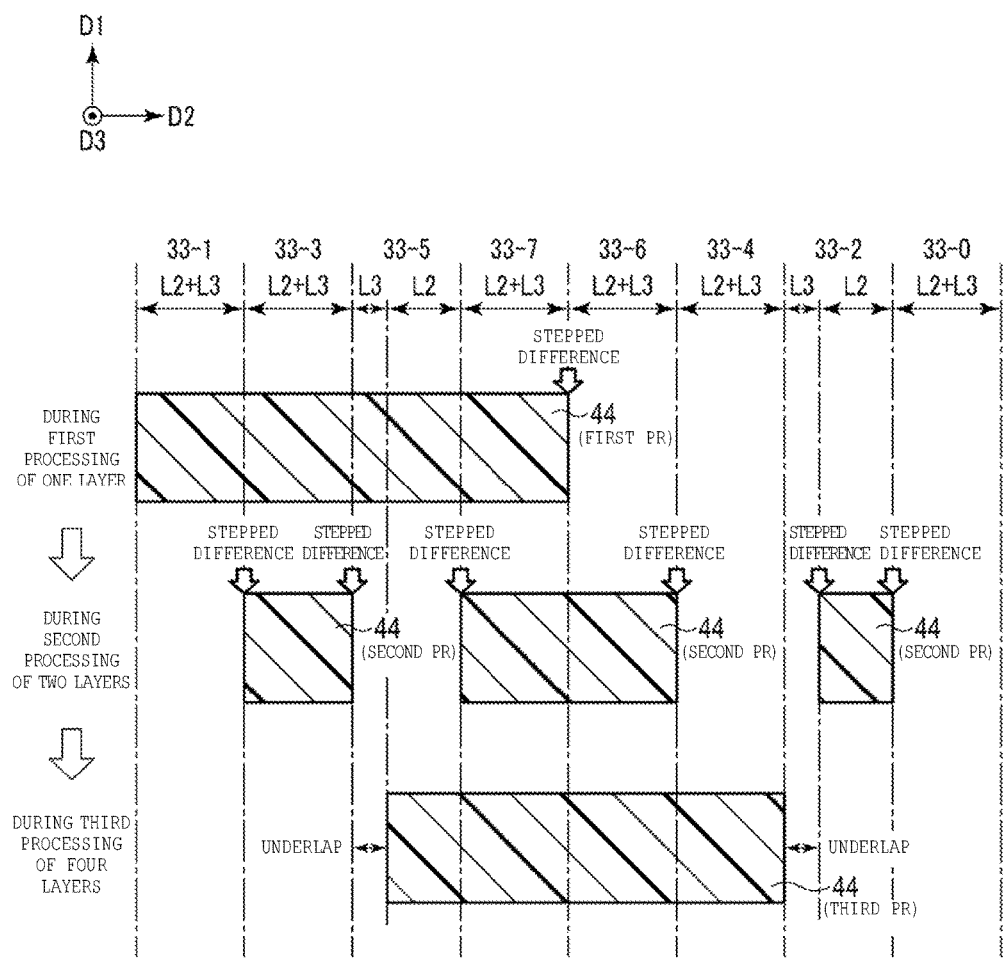
FIG. 19 is a plan view illustrating mask patterns in a case where the hookup portion provided in the semiconductor memory device according to the third embodiment is processed.

Next, a method of manufacturing the hookup portion HU will be described with reference to FIGS. 19 to 24. FIG. 19 is a diagram illustrating a plan view of mask patterns in a case where the hookup portion HU shown in FIG. 18 is processed three separate times. FIGS. 20 to 24 show each step of a manufacturing method in a case where the hookup portion HU shown in FIG. 18 is manufactured using the mask patterns shown in FIG. 19.

In the present embodiment, the number of layers of the extraction portion 32 to be processed one time is increased by a power of 2 during processing of the extraction portion 32. Thereby, in a case where eight layers are processed, the contact region portions 33-0 to 33-7 corresponding to the extraction portions 32-0 to 32-7 are formed by three-times processing. More specifically, one ($=2^0$) layer of the extraction portion 32 is processed in the first processing, two ($=2^1$) layers of the extraction portions 32 are processed in the second processing, and four ($=2^2$) layers of the extraction portions 32 are processed in the third processing. For example, since there is one layer of the extraction portion 32-7 above the contact region portion 33-6, the contact region portion 33-6 is formed by one layer of the upper extraction portion 32-7 being removed in the first processing. In addition, for example, since there are seven layers of the extraction portions 32-1 to 32-7 above the contact region portion 33-0, the contact region portion 33-0 is formed by seven layers of the upper extraction portions 32-1 to 32-7 being removed in the first to third processing.

The number of layers of the extraction portion 32 may be set equal to the number of layers of the word line WL (word line comb WLcomb). For example, in a case where sixteen layers of the extraction portions 32 are processed, eight ($=2^3$) layers of the extraction portions 32 are processed in fourth processing. In addition, the number of layers to be processed is not required to increase in order of processing, and may be random. For example, four layers of the extraction portions 32 may be processed in the first processing.

First, mask patterns of the hookup portion HU corresponding to the first to third processing will be described. By repeating photolithography and dry etching steps three times, eight contact region portions 33 corresponding to eight layers of the extraction portions 32 are formed. In this case, in the present embodiment, in a case where only the lower step side of a stepped difference region formed in the stacked extraction portion 32 is masked in second and the subsequent photolithography, an underlapped (short)mask pattern is formed so that a mask pattern does not superimpose (not overlap) the upper step side. That is, for example, photolithography is executed using a mask designed so as to be underlapped. In this case, the width of underlap is set to such a width so as not to generate overlap even in a case where a manufacturing variation occurs in consideration of the superimposition accuracy of photolithography.

As shown in FIG. 19, first, a first mask pattern (reference sign "first PR") is formed so as to mask the contact region portions 33-1, 33-3, 33-5, and 33-7 in the first photolithography step. In this case, the length of the first mask pattern corresponding to each of the contact region portions 33-1, 33-3, 33-5, and 33-7 in the second direction D2 is set to the sums of L2+L3 for each contact region portion being masked. That is, the length of the first mask pattern in direction D2 is set to 4×L2+4×L3. Thereafter, one layer of the exposed portion of the extraction portion 32 is etched by dry etching, based on the first mask pattern. In this case, a step difference is formed at a boundary between the contact region portions 33-7 and the contact region portion 33-6, and the contact region portion 33-6 serves as a lower step of the stepped difference.

Next, a second mask pattern 44 (reference sign "second PR" in FIG. 18) is formed so as to mask the contact region portions 33-3, 33-7, 33-6, and 33-2 in the second photolithography. In this case, the length of the second mask pattern corresponding to the contact region portion 33-3 in the second direction D2 is set to L2+L3. In addition, the length of the second mask pattern corresponding to each of the contact region portions 33-7 and 33-6 is set to L2+L3. That is, the length of the second mask pattern corresponding to the contact region portions 33-7 and 33-6 is set to 2×L2+2×L3. The length of the second mask pattern corresponding to the contact region portion 33-2 is set to L2. In this case, the second mask pattern corresponding to the contact region portion 33-2 is provided at a position spaced by the length L3 from the contact region portion 33-4, that is, at a position spaced by L2+2×L3 from the second mask pattern corresponding to the contact region portions 33-7 and 33-6. Thereafter, two layers of the extraction portions 32 exposed by being not covered by the mask are etched by dry etching, using on the second mask pattern. Thereby, a stepped difference is now present at the boundary between each of the contact region portions 33. For example, a stepped difference is formed at a boundary between the contact region portion 33-3 and the contact region portion 33-5, and the contact region portion 33-5 serves as a lower step of the stepped difference. In addition, a stepped difference is formed at a position spaced by the length L3 from a boundary between the contact region portion 33-4 and the contact region portion 33-2 to the contact region portion 33-2, and the contact region portion 33-4 serves as a lower step of the stepped difference.

Next, a third mask pattern (reference sign "third PR" in FIG. 18) is formed so as to mask the contact region portions 33-5, 33-7, 33-6, and 33-4 in the third photolithography. In this case, the length of the third mask pattern corresponding to the contact region portion 33-5 in the second direction D2 is set to L2. In addition, the length of the third mask pattern corresponding to each of the contact region portions 33-7, 33-6, and 33-4 is set to L2+L3. That is, the length of the third mask pattern is set to 4×L2+3×L3. One end of the third mask pattern is provided at a position spaced by the length L3 from the end of the contact region portion 33-3, that is, at a position of underlap so as not to exceed the boundary (stepped difference) between the contact region portion 33-3 and the contact region portion 33-5. Similarly, the other end of the third mask pattern is provided at a position spaced by the length L3 from the stepped difference of the contact region portion 33-2, that is, at a position of underlap so as not to exceed the boundary (stepped difference) between the contact region portion 33-4 and the contact region portion 33-2. Thereby, the third mask pattern is formed so as not to overlap the upper step portion of the stepped difference. Thereafter, four layers of the extraction portions 32 are etched by dry etching, based on the third mask pattern. In this case, the slit SLT extending through the layers for two extraction portions 32 is formed in the underlap region.

Next, the cross-sectional shape of the hookup portion HU will be described.

Figure 20:
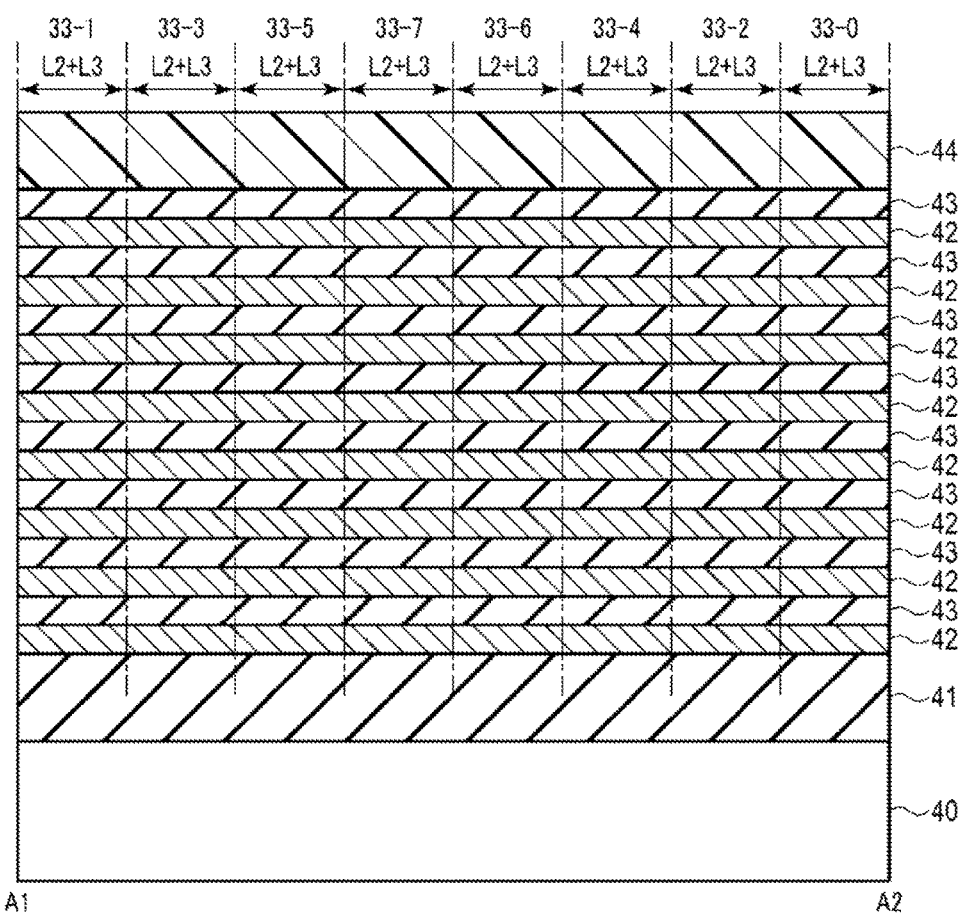
FIG. 20 is a cross-sectional view, taken along line A1-A2, illustrating a step of manufacturing the hookup portion provided in the semiconductor memory device according to the third embodiment.

First, as shown in FIG. 20, the interlayer insulating film 41 is formed on the semiconductor substrate 40. Eight of each of a wiring layer 42 and an interlayer insulating film 43 functioning as the extraction portion 32 (word line WL) are alternately stacked on the interlayer insulating film 41, and a resist 44 is applied on the front surface of an uppermost interlayer insulating film 43.

Figure 21:
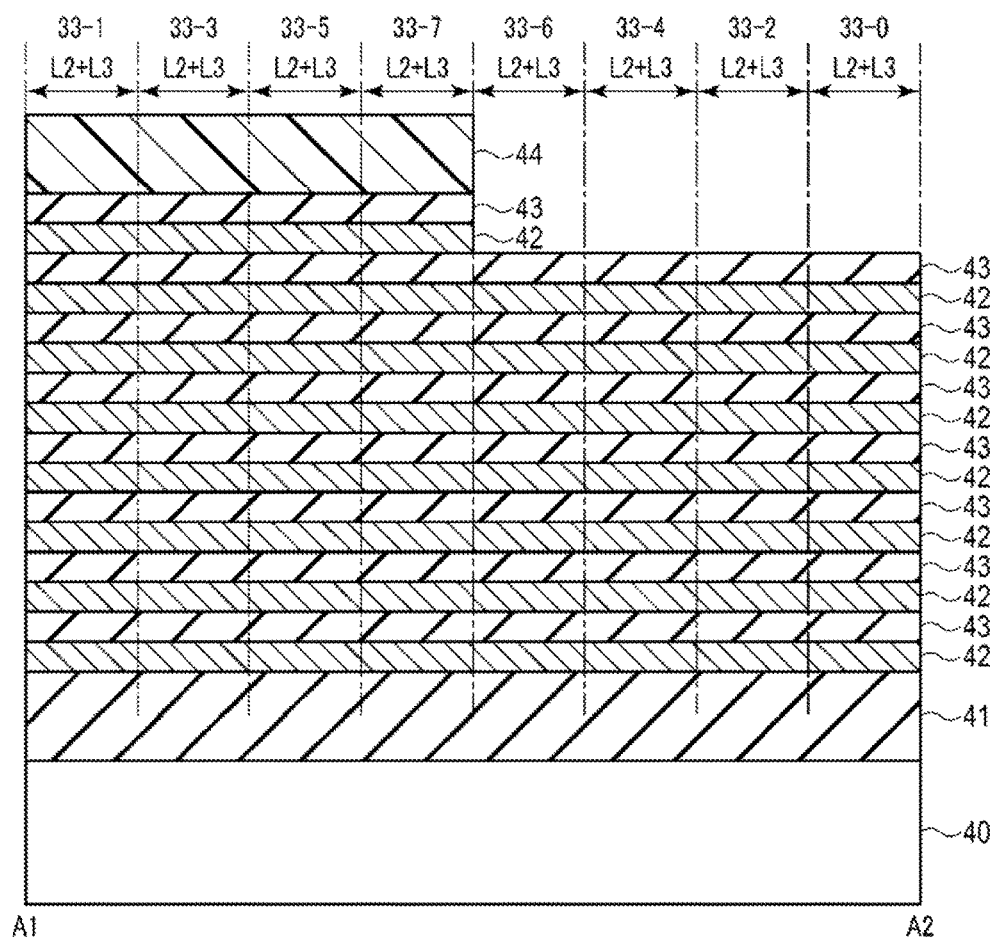
FIG. 21 is a cross-sectional view, taken along line A1-A2, illustrating a step of manufacturing the hookup portion provided in the semiconductor memory device according to the third embodiment.

Next, as shown in FIG. 21, the first mask pattern is formed by the first photolithography. More specifically, as described with reference to FIG. 19, regions equivalent to the contact region portions 33-1, 33-3, 33-5, and 33-7 are masked with the resist 44. Thereafter, one of each of the interlayer insulating film 43 and the wiring layer 42 is etched by dry etching where left exposed by the resist 44 of the mask.

Figure 22:
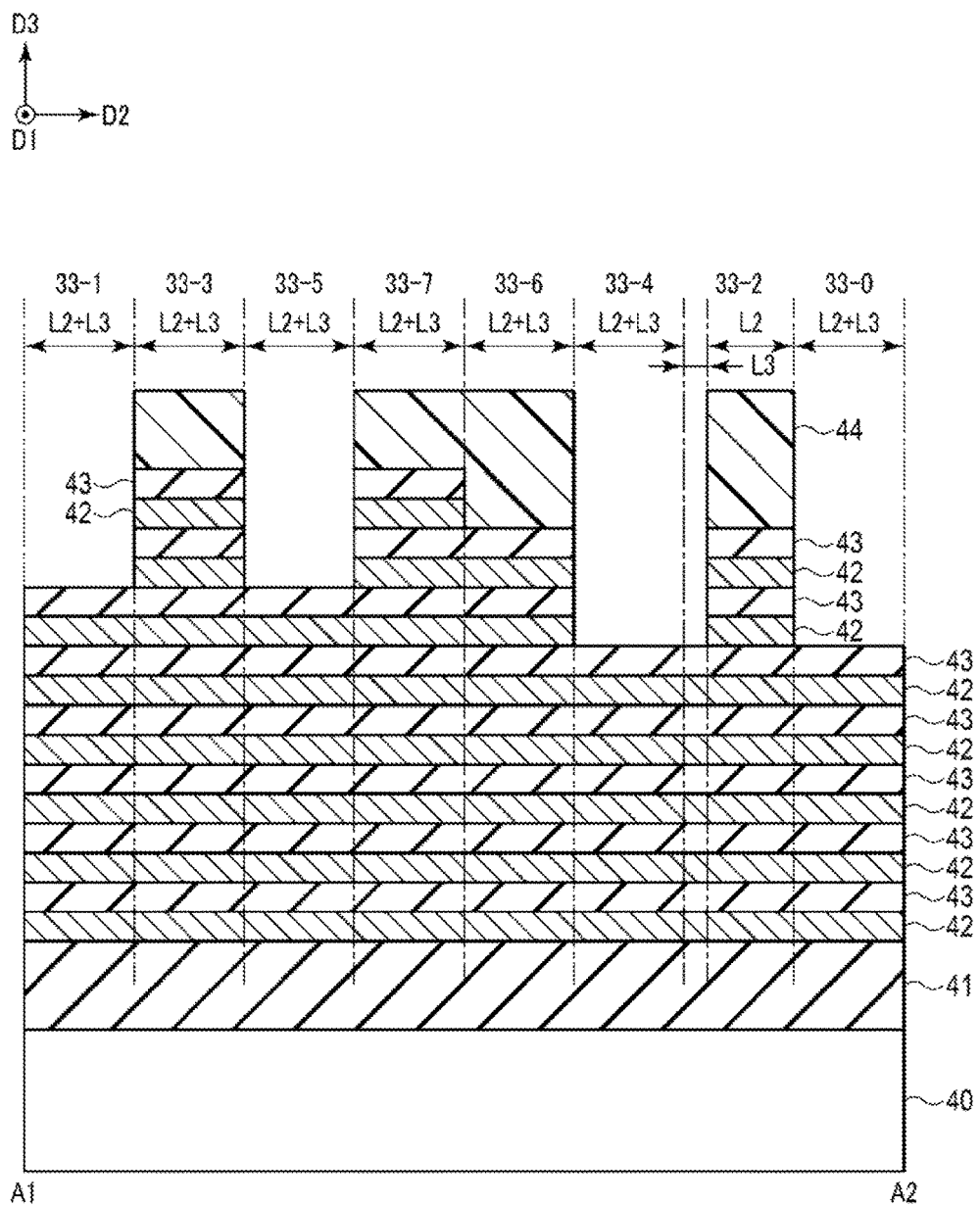
FIG. 22 is a cross-sectional view, taken along line A1-A2, illustrating a step of manufacturing the hookup portion provided in the semiconductor memory device according to the third embodiment.

Next, after the resist of the first mask pattern is removed, as shown in FIG. 22, the resist 44 is applied again, and the second mask pattern is formed by the second photolithography. More specifically, as described with reference to FIG. 19, regions equivalent to the contact region portions 33-3, 33-7, 33-6, and 33-2 are masked with the resist 44. Thereafter, two of each of the interlayer insulating film 43 and the wiring layer 42 are etched by dry etching where left exposed by the resist 44 of the mask pattern.

Figure 23:
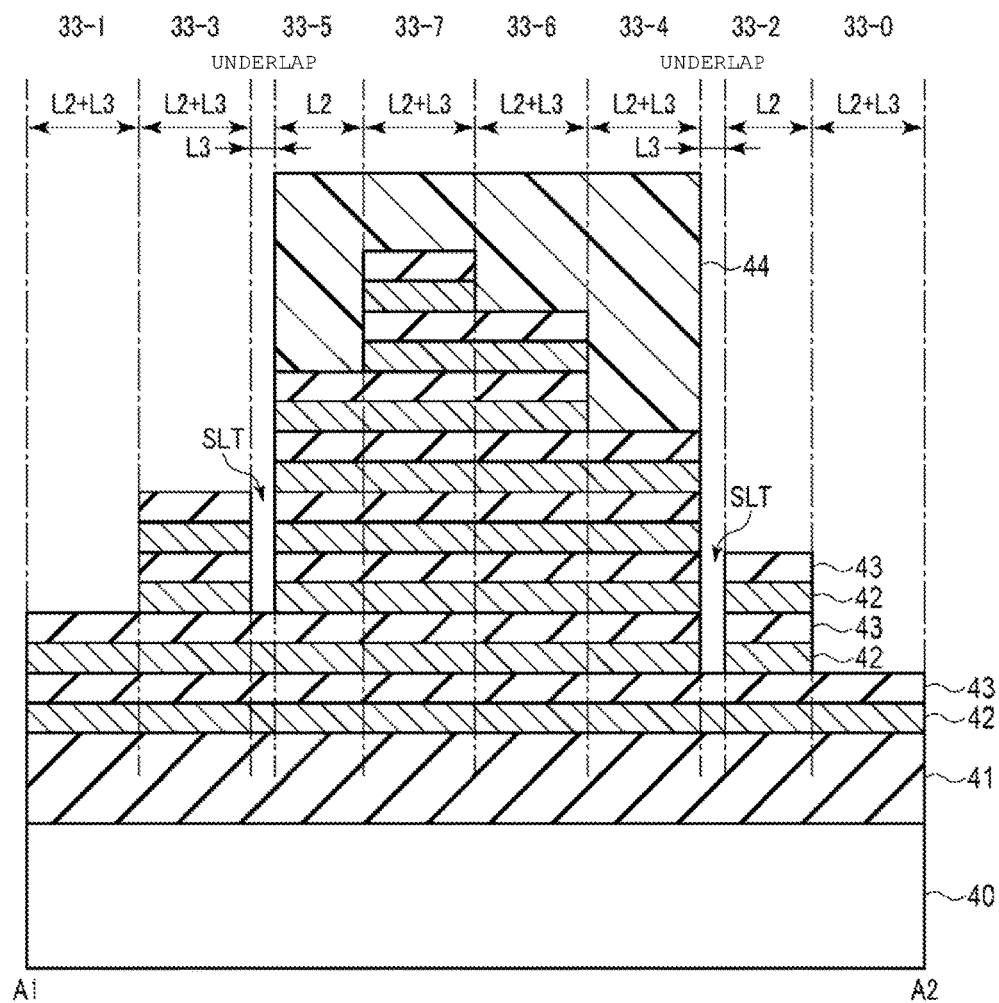
FIG. 23 is a cross-sectional view, taken along line A1-A2, illustrating a step of manufacturing the hookup portion provided in the semiconductor memory device according to the third embodiment.

Next, after the resist of the second mask pattern is removed, as shown in FIG. 23, the resist 44 is applied again, and the third mask pattern is formed by the third photolithography. More specifically, as described with reference to FIG. 19, regions equivalent to the contact region portions 33-5, 33-7, 33-6, and 33-4 are masked with the resist 44. The third mask pattern is formed so as to be underlapped from the boundary (stepped difference) between the contact region portion 33-3 and the contact region portion 33-5 and the boundary (stepped difference) between the contact region portion 33-4 and the contact region portion 33-2. Therefore, regions equivalent to the contact region portions 33-5 and 33-2 are set to be in a state where the interlayer insulating film 43 is exposed by the length L3. Thereafter, four of each of the interlayer insulating film 43 and the wiring layer 42 are etched by dry etching where exposed by the resist 44 of the mask pattern. Then, in the underlap region, the contact region portions 33-5 and 33-2 are etched. Therefore, the slit SLT is formed between contact region portion 33-3 and the contact region portion 33-5, and between the contact region portion 33-4 and the contact region portion 33-2. That is, the slit SLT is formed at the boundary portion of the stepped difference between the extraction portions 32-3 and 32-5, and the boundary portion of the stepped difference between the extraction portions 32-4 and 32-2.

Figure 24:
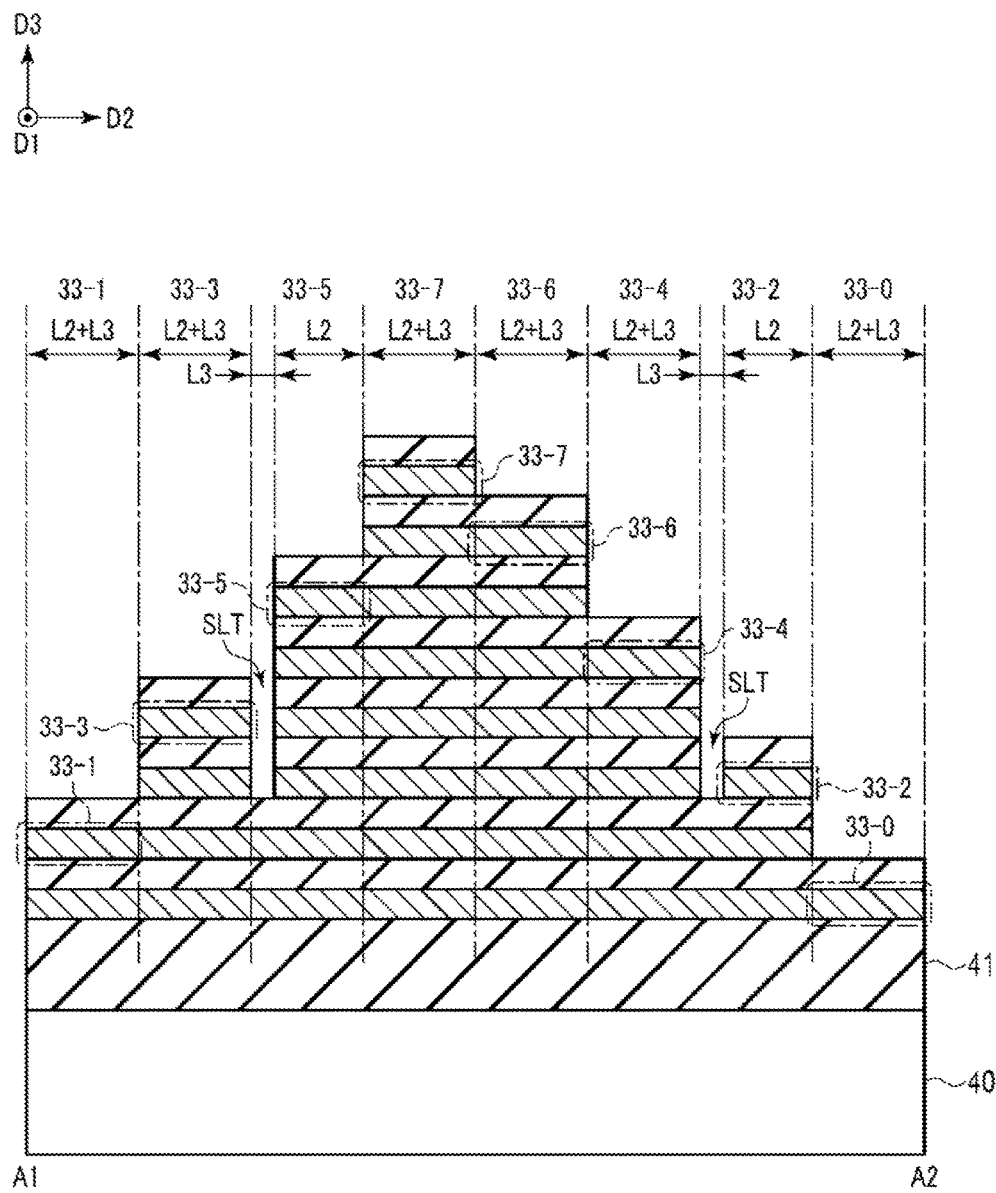
FIG. 24 is a cross-sectional view, taken along line A1-A2, illustrating a step of manufacturing the hookup portion provided in the semiconductor memory device according to the third embodiment.

Next, as shown in FIG. 24, the resist of the third mask pattern is removed, and the processing of the hookup portion HU is completed.

Even in a case where the extraction portion 32 is partitioned by forming the slit SLT in the hookup portion HU, the extraction portion is connected to the word line comb WLcomb, and thus there is little influence on performance characteristics of the memory.

3.3 Effects According to the Present Embodiment

The configuration according to the present embodiment can be applied to those in the first and second embodiments. Thereby, the same effects as those in the first and second embodiments are obtained.

Figure 25:
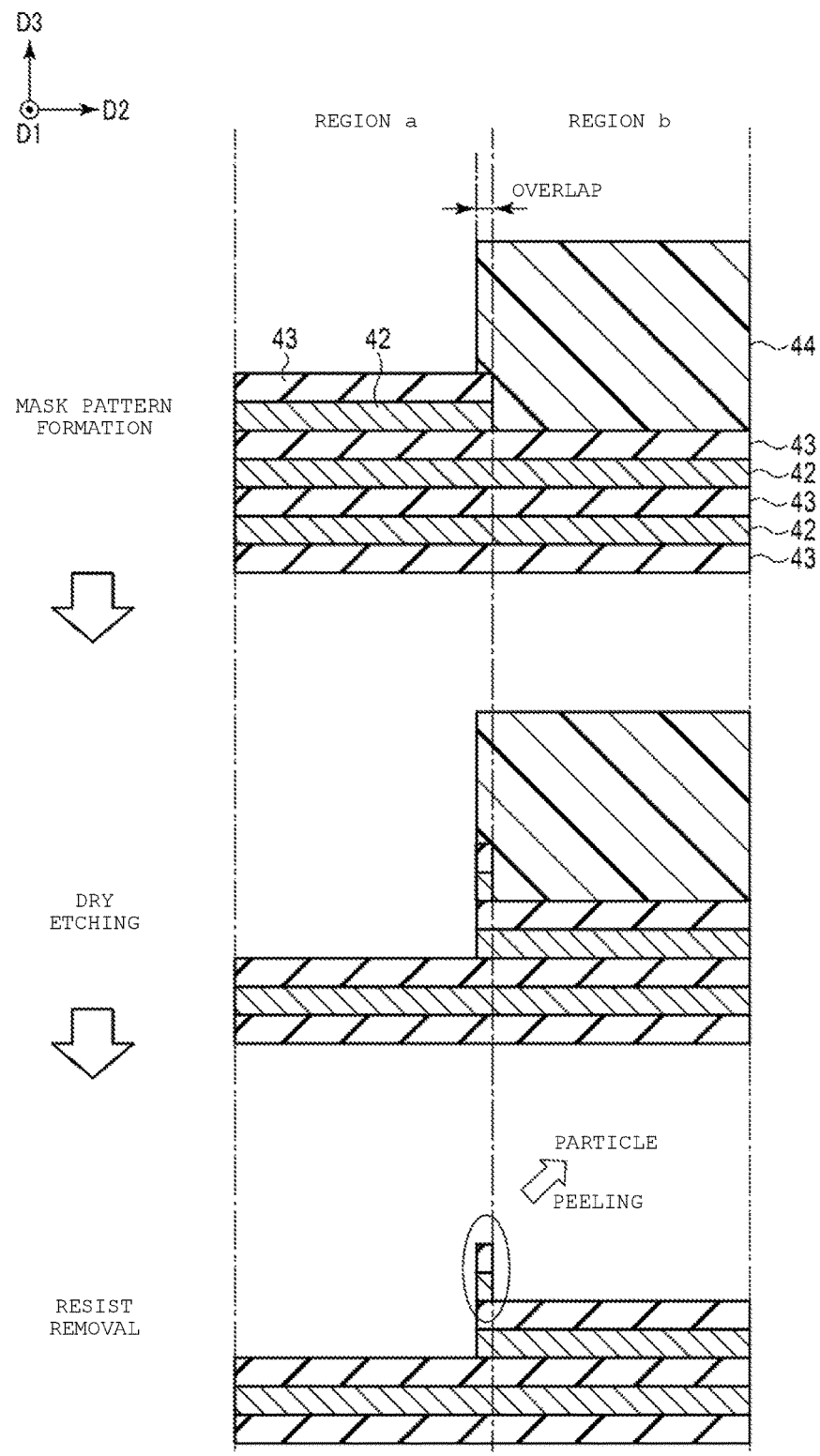
FIG. 25 is an example diagram illustrating a case where mask patterns are formed by overlapping a stepped difference portion of the hookup portion.
Figure 26:
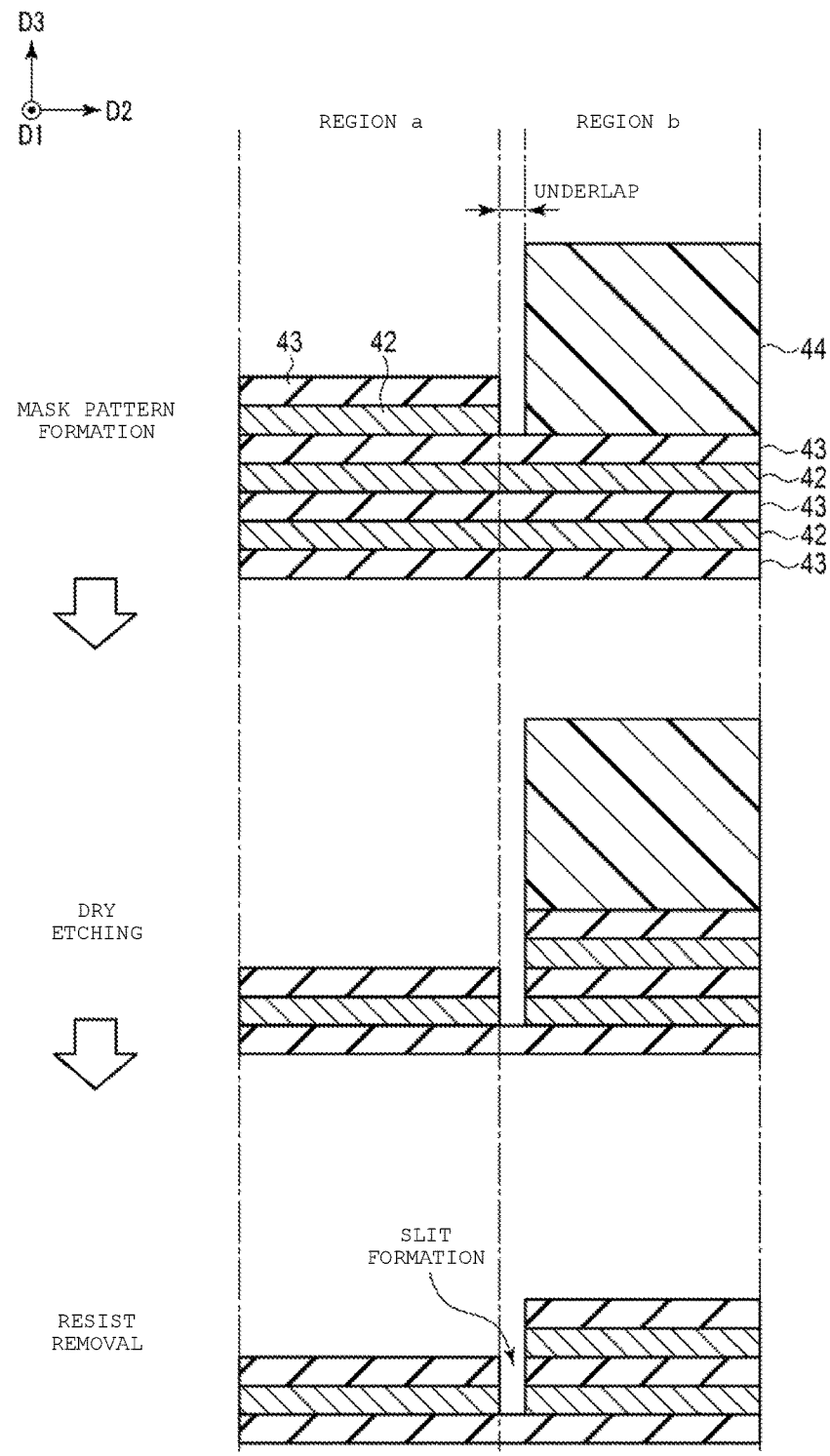
FIG. 26 is an example diagram illustrating a case where mask patterns are formed by underlapping the stepped difference portion of the hookup portion.

Further, with the configuration according to the present embodiment, when the hookup portion HU is processed, the generation of particles is prevented, and thus it is possible to prevent a decrease in the yield rate of a semiconductor memory device. Hereinafter, the effects will be described in detail with reference to FIGS. 25 and 26. FIG. 25 is a cross-sectional view illustrating an example in which a mask pattern overlaps a stepped difference portion without applying the present embodiment, and FIG. 26 is a cross-sectional view illustrating an example in a case where a mask pattern underlaps a stepped difference portion by applying the present embodiment.

As shown in FIG. 25, the upper step of the stepped difference before the mask pattern is formed is set to a region a, and the lower step of the stepped difference is set to a region b. In the next processing, in a case where the region a is processed, and the region b is not processed, the mask pattern is formed so as to cover the region b. In this case, it is likely that, due to a problem such as the superimposition accuracy of photolithography, the mask pattern is overlapped, and the end of the region a is slightly covered with a resist. In a case where dry etching is performed in this state, the interlayer insulating film 43 and the wiring layer 42 of the region a covered with the resist 44 remain without being processed. Then, after the resist is removed, a portion of the region a remaining without being processed may become peeled off to change into particles which affect the performance of the semiconductor memory device. Thereby, there is the possibility of a decrease in the yield rate of a semiconductor memory device.

On the other hand, with the configuration according to the present embodiment, when the upper step of the stepped difference is processed, the resist that covers the lower step of the stepped difference is underlapped from the stepped difference portion so as not to cover the upper step of the stepped difference due to overlapping, thereby allowing the mask pattern to be formed. Thereby, the slit SLT is formed in the stepped difference portion. More specifically, for example, as shown in FIG. 26, a mask pattern is formed in the region b so as to be underlapped. In a case where dry etching is performed in this state, the slit SLT is formed in the underlapped region. Therefore, it is possible to prevent the generation of particles due to the occurrence of processing remainders caused by overlap when the hookup portion HU is processed. Thus, it is possible to prevent a decrease in the yield rate of a semiconductor memory device.

Further, in the configuration according to the present embodiment, each interval between the contact plugs CP can be set to an equal interval. Therefore, since the layout of the contact plug CP and the wiring connected to the upper surface of the contact plug CP is not dependent on the disposition of the slit SLT, the layout design of the contact plug CP and the wiring connected to the upper surface of the contact plug CP is facilitated and simplified.

Further, in the configuration according to the present embodiment, a length obtained by adding the slit SLT and the contact region portion 33 together can be set to a constant length of L2+L3 in the extraction portion 32 of each layer, regardless of the presence or absence of the slit SLT. Therefore, the layout design of the extraction portion 32 is facilitated.

4. Fourth Embodiment

Next, a fourth embodiment will be described. Points different from those in the third embodiment are in that the lengths of the respective contact region portions 33 are the same as each other, and the interval between the contact plugs CP connected to the respective contact region portions 33 is not an equal interval. Hereinafter, only the points different from those in the third embodiment will be described.

4.1 with Respect to Configuration of Hookup Portion

Figure 27:
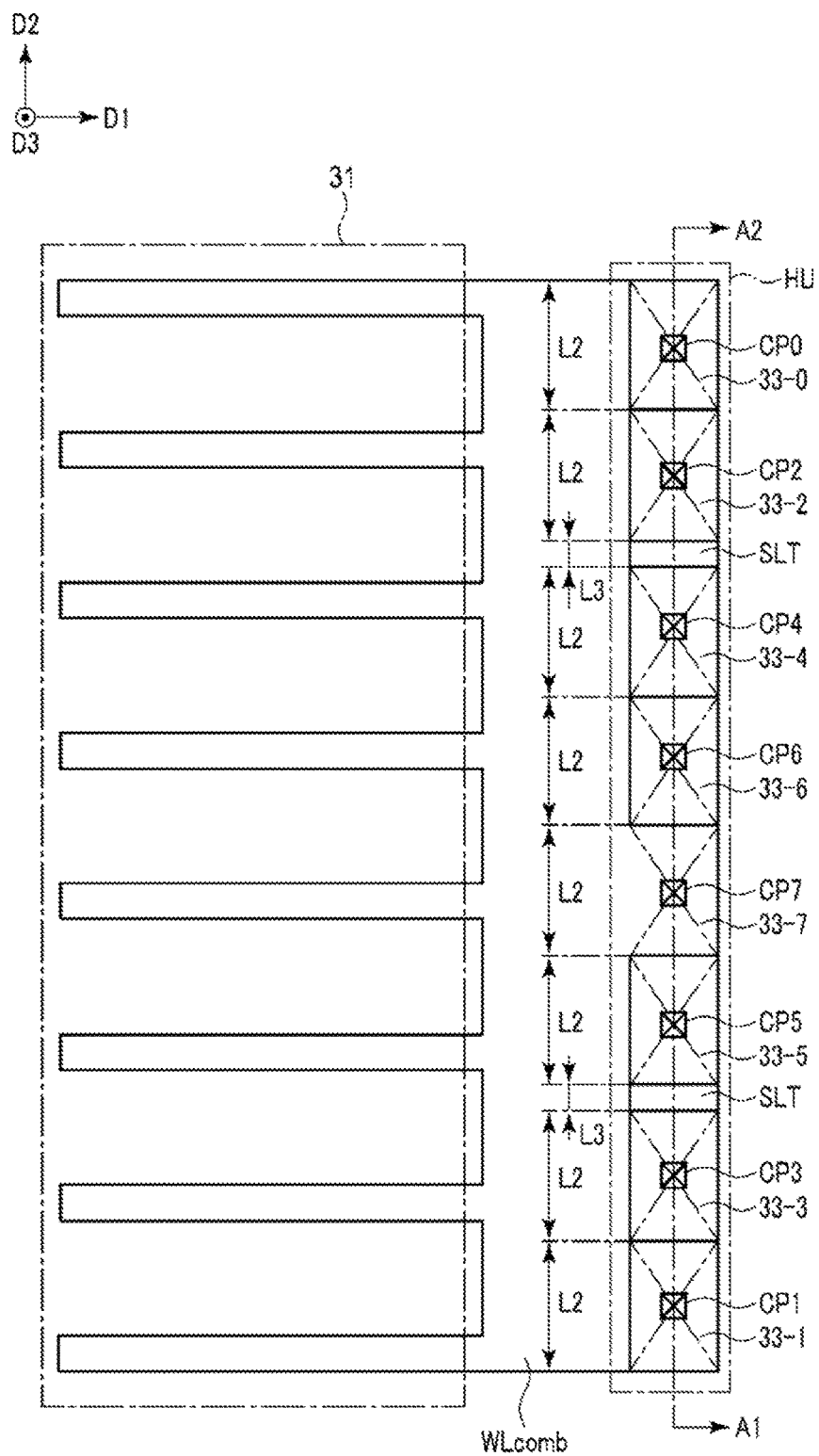
FIG. 27 is a plan view of word line fingers and a hookup portion provided in a semiconductor memory device according to a fourth embodiment.
Figure 28:
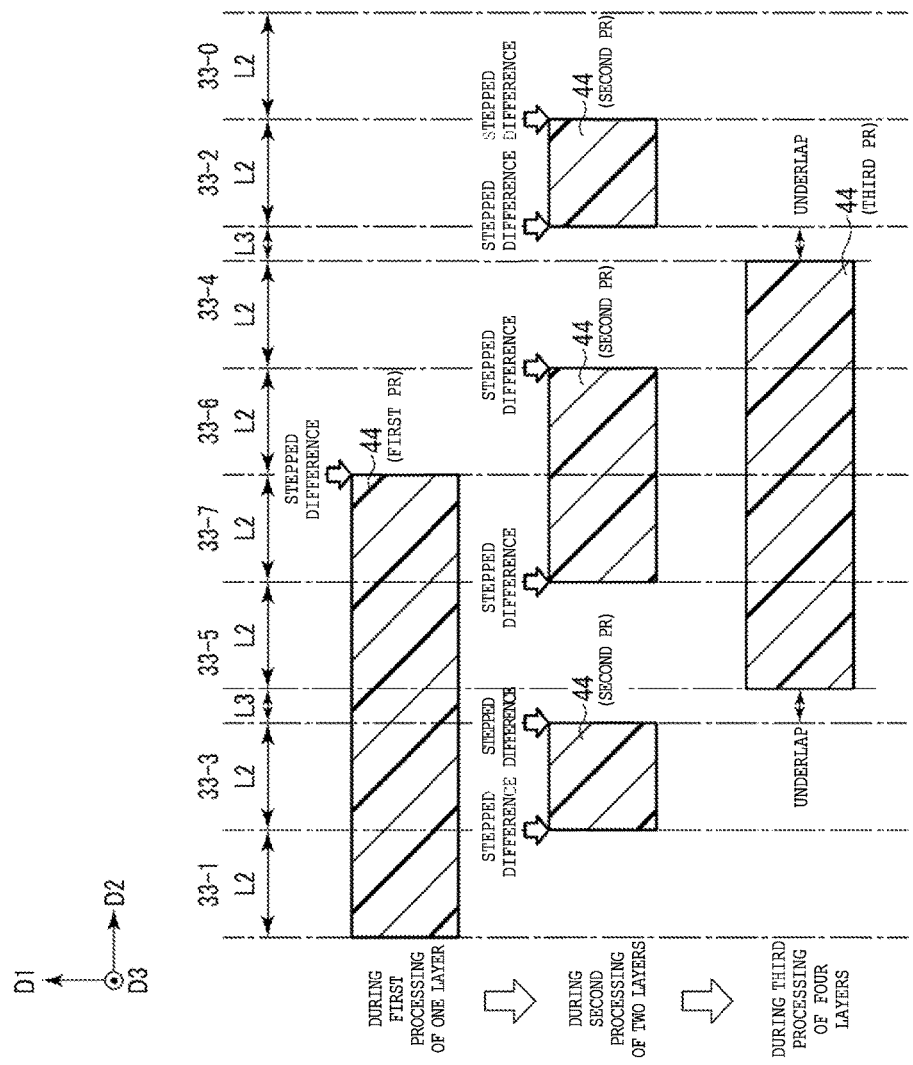
FIG. 28 is a plan view illustrating mask patterns in a case where the hookup portion provided in the semiconductor memory device according to the fourth embodiment is processed.
Figure 29:
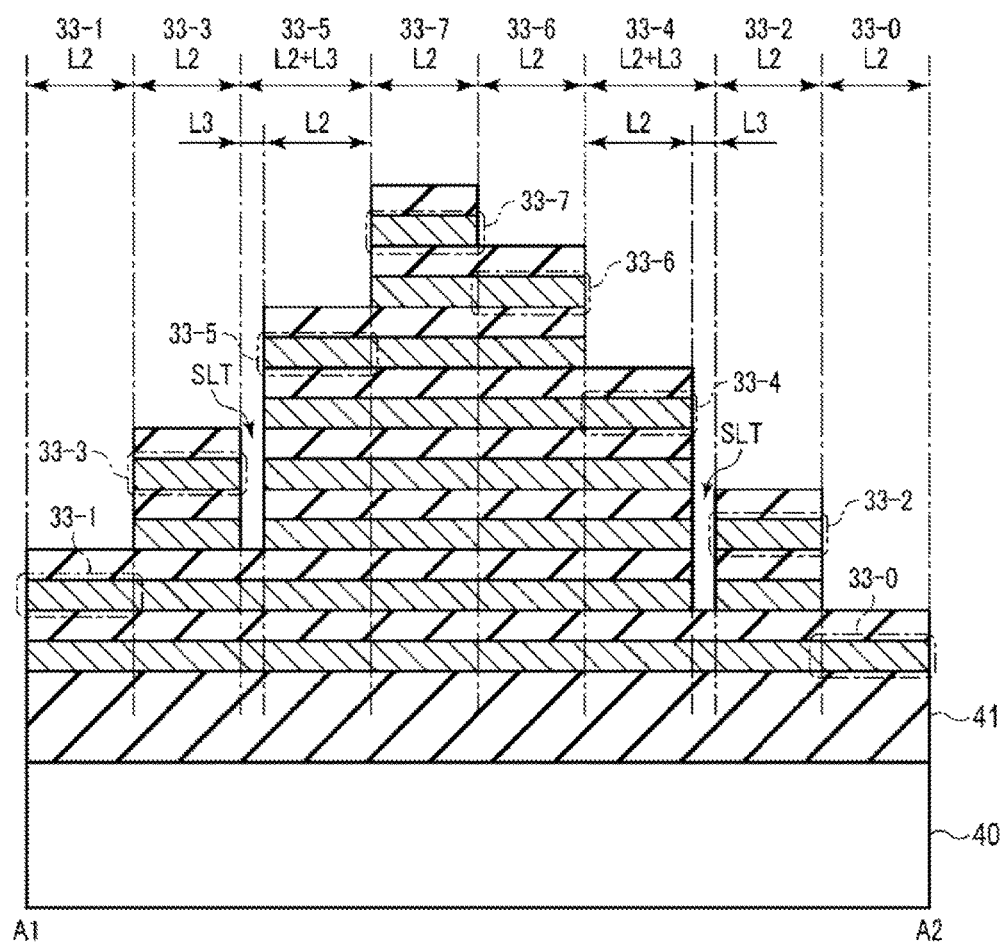
FIG. 29 is a cross-sectional view taken along line A1-A2 shown in FIG. 27.

First, the configuration of the hookup portion HU in the present embodiment will be described with reference to FIG. 27. Next, a method of manufacturing the hookup portion HU will be described with reference to FIGS. 28 and 29. FIG. 27 shows an example of a plan view of the word line comb WLcomb and the hookup portion HU. FIG. 28 is a diagram illustrating a plan view of mask patterns in a case where the hookup portion HU shown in FIG. 27 is processed three separate times. FIG. 29 is a cross-sectional view of the hookup portion HU taken along line A1-A2 in FIG. 27. In the example of FIG. 27, for the purpose of simplifying description, one word line comb WLcomb corresponding to one memory unit 31 is shown, and the word line comb WLcomb and the bit line BL that face the memory unit 31 are omitted. Further, in the example of FIG. 29, an interlayer insulating film that covers the contact plug CP and the contact region portion 33 is omitted.

As shown in FIG. 27, the disposition of eight contact region portions 33 and two slits SLT in the hookup portion HU is the same as that in FIG. 18 of the third embodiment. In the present embodiment, the lengths of the contact region portions 33-0 to 33-7 in the second direction D2 are the same length L2. The contact region portions 33-0 to 33-7 are set so that the contact plugs CP0 to CP7 are respectively connected to the central portions thereof, that is, at a distance of (L2)/2 from the ends in the second direction D2. Therefore, the interval between contact plugs CP0 to CP7 is not an equal interval. More specifically, an interval between the contact plugs CP1 and CP3, an interval between the contact plugs CP5 and CP7, an interval between the contact plugs CP7 and CP6, an interval between the contact plugs CP6 and CP4, and an interval between the contact plugs CP2 and CP0, in which the slit SLT is not disposed therebetween, are set to L2. On the other hand, an interval between the contact plugs CP3 and CP5 and an interval between the contact plugs CP4 and CP2, in which the slit SLT is disposed therebetween, are set to L2+L3.

Next, mask patterns in a case where the hookup portion HU is processed three separate times will be described.

As shown in FIG. 28, first, a first mask pattern (reference sign "first PR") is formed so as to mask the contact region portions 33-1, 33-3, 33-5, and 33-7 in the first photolithography step. In this case, the length of the first mask pattern corresponding to each of the contact region portions 33-1, 33-3, and 33-7 in the second direction D2 is set to L2, and the length of the first mask pattern corresponding to the contact region portion 33-5 is set to L2+L3. That is, the length of the first mask pattern is set to 4L2+L3. Thereafter, one layer of the extraction portion 32 is etched by dry etching, using on the first mask pattern.

Next, a second mask pattern (reference sign "second PR") is formed so as to mask the contact region portions 33-3, 33-7, 33-6, and 33-2 in the second photolithography. In this case, the length of the second mask pattern corresponding to the contact region portion 33-3 in the second direction D2 is set to L2. In addition, the length of the second mask pattern corresponding to the contact region portions 33-7 and 33-6 is set to 2×L2, and the length of the second mask pattern corresponding to the contact region portion 33-2 is set to L2. In this case, the second mask pattern corresponding to the contact region portions 33-7 and 33-6 is provided at a position spaced by L2+L3 from the second mask pattern corresponding to the contact region portion 33-3 along the second direction D2. In addition, the second mask pattern corresponding to the contact region portion 33-2 is provided at a position spaced by L2+L3 from the second mask pattern corresponding to the contact region portions 33-7 and 33-6 along the second direction D2. Thereafter, two layers of the extraction portions 32 are etched by dry etching, using the second mask pattern.

Next, a third mask pattern (reference sign "third PR") is formed so as to mask the contact region portions 33-5, 33-7, 33-6, and 33-4 in the third photolithography. In this case, the length of the third mask pattern corresponding to each of the contact region portions 33-5, 33-7, 33-6, and 33-4 in the second direction D2 is set to L2. That is, the length of the third mask pattern is set to 4×L2. Thereafter, four layers of the extraction portions 32 are etched by dry etching, using the third mask pattern. In this case, the slit SLT is formed in the underlap region.

Next, the cross-sectional shape of the hookup portion HU will be described.

As shown in FIG. 29, the slit SLT is formed between the contact region portion 33-3 and the contact region portion 33-5, and between the contact region portion 33-4 and the contact region portion 33-2. The length between each of the contact region portions 33-0 to 33-7 is set to L2.

4.2 Effects According to the Present Embodiment

The configuration according to the present embodiment can be applied to those in the first and second embodiments. Thereby, the same effects as those in the first and second embodiments are obtained.

Further, with the configuration according to the present embodiment, as is the case with the third embodiment, it is possible to prevent the generation of particles due to the occurrence of processing remainders caused by resist overlap when the hookup portion HU is processed. Thus, it is possible to prevent a decrease in the yield rate of a semiconductor memory device.

Further, with the configuration according to the present embodiment, underlap is provided in only portions in which the slit SLT is formed, and thus it is possible to shorten the entire length of the extraction portion 32, and to prevent an increase in chip area.

5. Fifth Embodiment

Next, a fifth embodiment will be described. In the fifth embodiment, a description will be given of the disposition of the contact region portion 33 within the hookup portion HU different from those in the third and fourth embodiments. Hereinafter, only points different from those in the third and fourth embodiments will be described.

5.1 with Respect to Configuration of Hookup Portion

Figure 30:
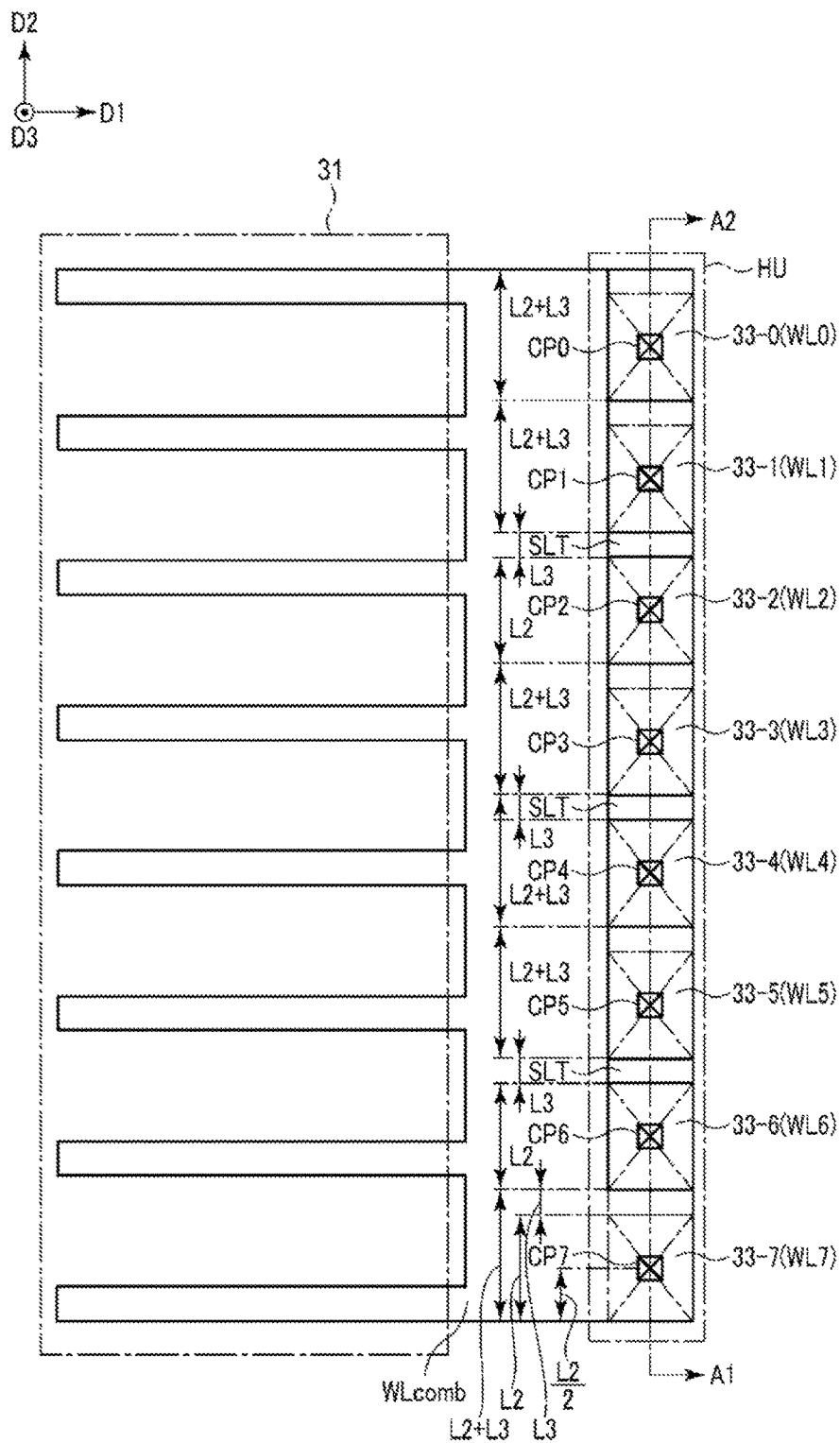
FIG. 30 is a plan view of word line fingers and a hookup portion provided in the semiconductor memory device according to a fifth embodiment.

First, the configuration of the hookup portion HU in the present embodiment will be described with reference to FIG. 30. FIG. 30 shows an example of a plan view of the word line comb WLcomb and the hookup portion HU. In the example of FIG. 30, for the purpose of simplifying description, one word line comb WLcomb corresponding to one memory unit 31 is shown, and the word line comb WLcomb and the bit line BL that face the memory unit 31 are omitted.

As shown in FIG. 30, in the present embodiment, eight contact region portions 33 and three slits SLT are provided in the hookup portion HU. More specifically, the contact region portions 33-7 and 33-6, the slit SLT, the contact region portions 33-5 and 33-4, the slit SLT, the contact region portions 33-3 and 33-2, the slit SLT, and the contact region portions 33-1 and 33-0 are provided in order from one end of the second surface of the word line comb WLcomb along the second direction D2. That is, 33-0 to 33-7 are provided in order from one end of the second surface of the word line comb WLcomb toward the other end.

Hereinafter, the length of the contact region portion 33 in the second direction D2 will be described in detail. In the present embodiment, as is the case with the third embodiment, a length obtained by adding the slit SLT and the contact region portion 33 is set to a constant length of L2+L3 in each extraction portion 32. More specifically, the length of the contact region portions 33-7, 33-5, 33-3, 33-1, and 33-0 in the second direction D2 is set to be L2+L3. On the other hand, the length of the contact region portions 33-6, 33-4, and 33-2 is set to be L2. That is, the length of the contact region portions 33-6, 33-4, and 33-2 is smaller by the length L3 of the slit SLT than the length of other contact region portions 33.

The contact plugs CP0 to CP7 connected to the contact region portions 33-0 to 33-7 are arranged at equal intervals along the second direction D2. More specifically, for example, the contact region portions 33-6, 33-4, and 33-2 are set so that the contact plugs CP6, CP4 and CP2 are respectively connected to the central portions thereof, that is, at a distance of (L2)/2 from the ends in the second direction D2. On the other hand, the contact region portions 33-7, 33-5, 33-3, 33-1, and 33-0 are set so that the contact plugs CP7, CP5, CP3, CP2, and CP0 are respectively connected thereto at a distance of (L2)/2 from the lower ends of the plane of paper of FIG. 30 in each contact region portion 33. Thereby, the contact plugs CP0 to CP7 are arranged at equal intervals of L2+L3 along the second direction D2.

5.2 Method of Manufacturing Hookup Portion

Figure 31:
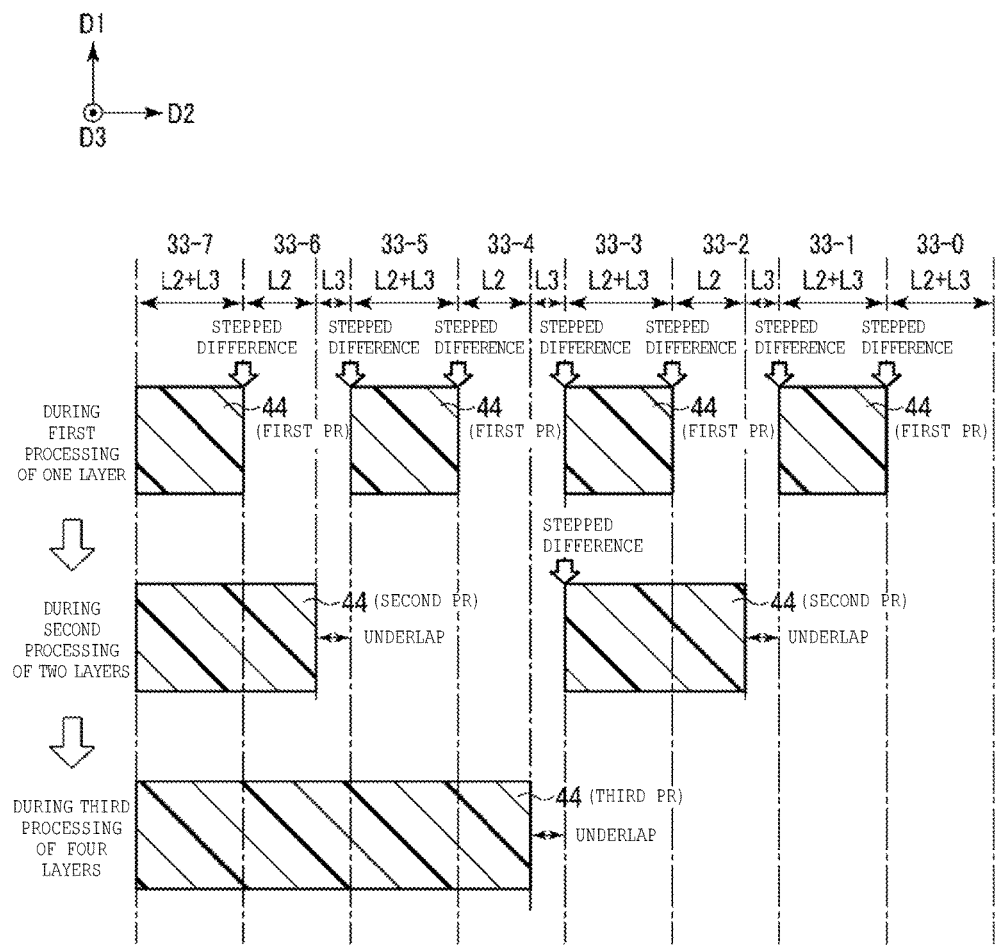
FIG. 31 is a plan view illustrating mask patterns in a case where the hookup portion provided in the semiconductor memory device according to the fifth embodiment is processed.

Next, a method of manufacturing the hookup portion HU will be described with reference to FIGS. 31 to 36. FIG. 31 is a diagram illustrating mask patterns in a case where the hookup portion HU shown in FIG. 30 is processed three separate times. FIGS. 32 to 36 show each step of a manufacturing method in a case where the hookup portion HU shown in FIG. 30 is manufactured using the mask patterns shown in FIG. 31.

As shown in FIG. 31, first, a first mask pattern (reference sign "first PR") is formed so as to mask the contact region portions 33-7, 33-5, 33-3, and 33-1 corresponding to odd-numbered word lines WL in the first photolithography step. In this case, the length of the first mask pattern corresponding to each of the contact region portions 33 in the second direction D2 is set to L2+L3. Thereafter, one layer of the extraction portion 32 is etched by dry etching, based on the first mask pattern. Thereby, a step difference is formed at a boundary between each of the contact region portions 33. For example, a step difference is formed at the boundary between the contact region portion 33-6 and the contact region portion 33-5, and the contact region portion 33-6 serves as a lower step of the step difference. In addition, a step difference is formed at the boundary between the contact region portion 33-2 and the contact region portion 33-1, and the contact region portion 33-2 serves as a lower step of the step difference.

Next, a second mask pattern (reference sign "second PR") is formed so as to mask the contact region portions 33-7, 33-6, 33-3, and 33-2 in the second photolithography step. In this case, the length of the second mask pattern corresponding to the contact region portions 33-7 and 33-6 in the second direction D2 is set to 2×L2+L3. In addition, the length of the second mask pattern corresponding to the contact region portions 33-3 and 33-2 is set to 2×L2+L3. The end of the second mask pattern is provided at a position underlapped by the length L3 with respect to a stepped difference between the contact region portions 33-6 and 33-5 and a stepped difference between the contact region portions 33-2 and 33-1. Thereafter, two layers of the extraction portions 32 are etched by dry etching.

Next, a third mask pattern (reference sign "third PR") is formed so as to mask the contact region portions 33-7, 33-6, 33-5, and 33-4 in the third photolithography step. In this case, the length of the third mask pattern corresponding to the contact region portions 33-7, 33-6, 33-5, and 33-4 in the second direction D2 is set to 4×L2+3×L3. The end of the third mask pattern is provided at a position underlapped by the length L3 with respect to a step difference between the contact region portions 33-4 and 33-3. Thereafter, four layers of the extraction portions 32 are etched by dry etching.

Next, the cross-sectional shape of the hookup portion HU will be described.

Figure 32:
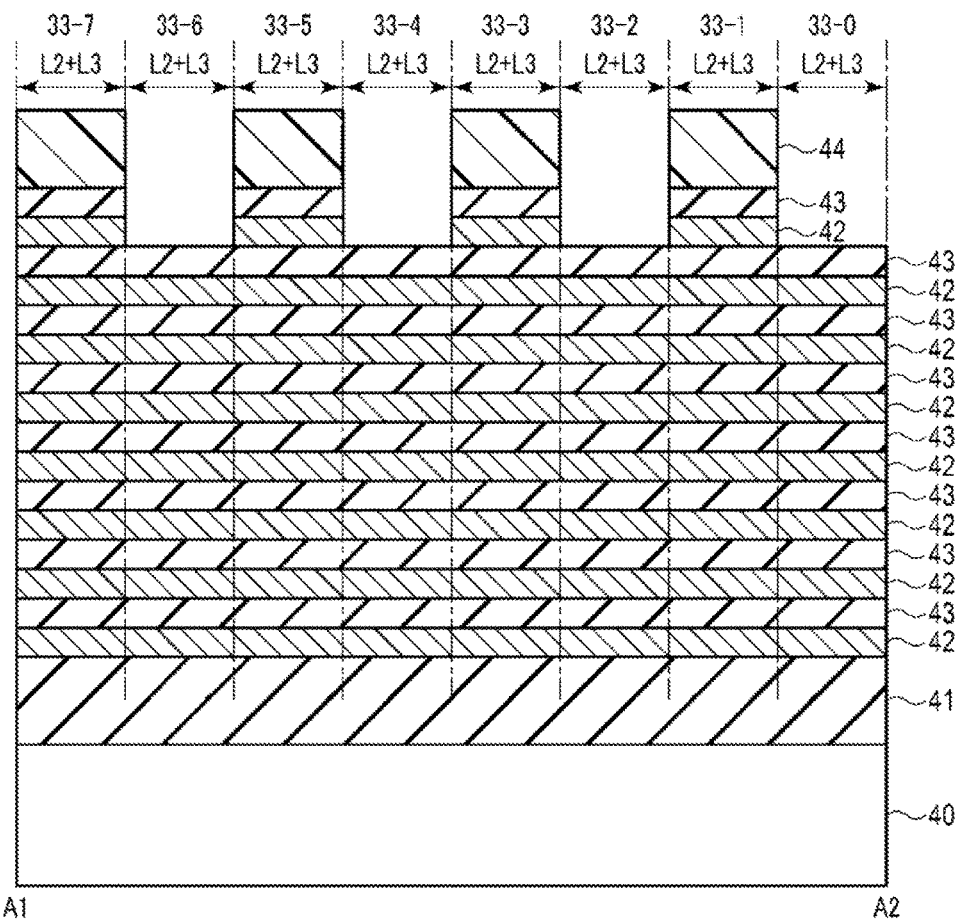
FIG. 32 is a cross-sectional view, taken along line A1-A2, illustrating a step of manufacturing the hookup portion provided in the semiconductor memory device according to the fifth embodiment.

First, similarly to FIG. 20, after eight of the wiring layers 42 and the interlayer insulating films 43 are alternately stacked, and then the resist 44 is applied to the front surface of the uppermost interlayer insulating film 43, the first mask pattern is formed by the first photolithography step as shown in FIG. 32. More specifically, as described with reference to FIG. 31, regions equivalent to the contact region portions 33-7, 33-5, 33-3, and 33-1 are masked with the resist 44. Thereafter, one of each of the interlayer insulating film 43 and the wiring layer 42 exposed by the resist layer is etched by dry etching.

Figure 33:
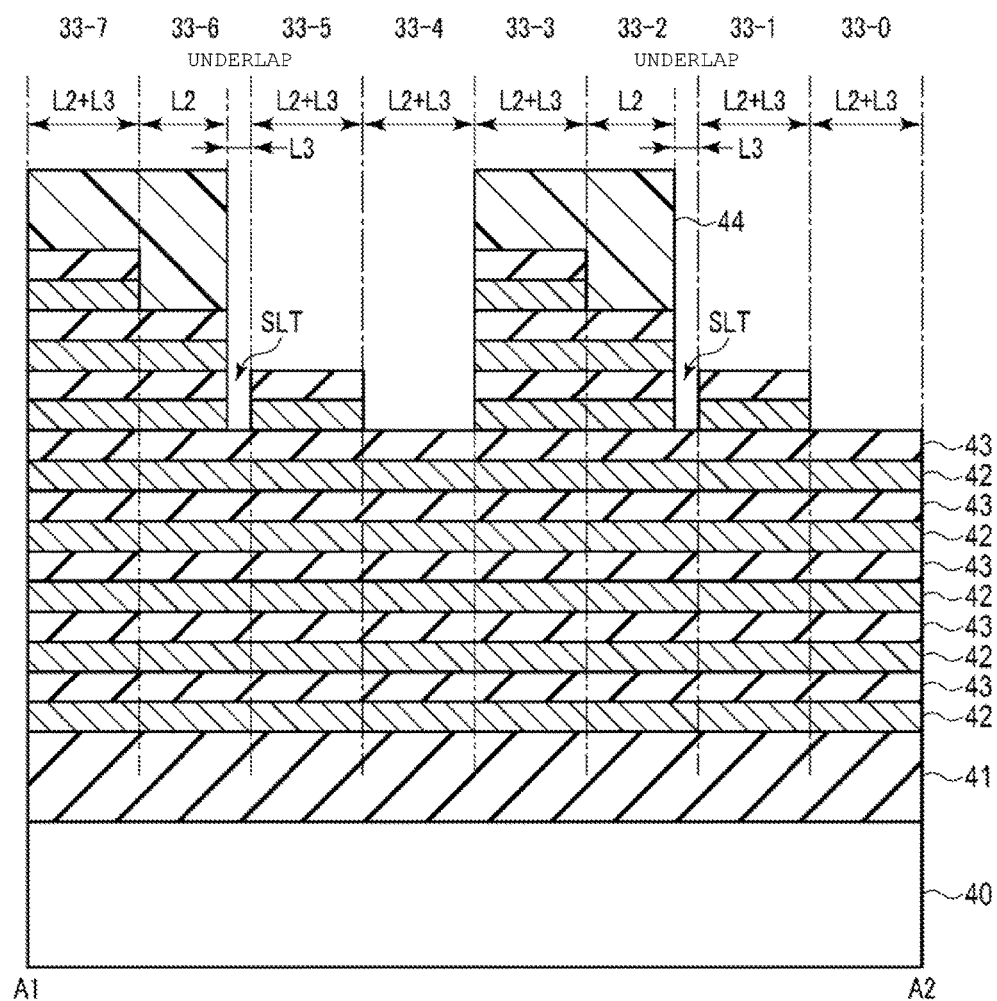
FIG. 33 is a cross-sectional view, taken along line A1-A2, illustrating a step of manufacturing the hookup portion provided in the semiconductor memory device according to the fifth embodiment.

Next, after the resist of the first mask pattern is removed, as shown in FIG. 33, the resist 44 is applied again, and the second mask pattern is formed by the second photolithography. More specifically, as described with reference to FIG. 31, regions equivalent to the contact region portions 33-7, 33-6, 33-3, and 33-2 are masked with the resist 44. The second mask pattern is formed so as to be underlapped from a boundary (stepped difference) between the contact region portion 33-6 and the contact region portion 33-5, and a boundary (stepped difference) between the contact region portion 33-2 and the contact region portion 33-1. Therefore, regions equivalent to the contact region portion 33-6 and 33-2 are set to be in a state where the interlayer insulating film 43 is exposed by the length L3. Thereafter, two of each of the interlayer insulating film 43 and the wiring layer 42 exposed by the resist are etched by dry etching. Then, in the underlap region, the contact region portions 33-6 and 33-2 are etched. Therefore, the slit SLT is formed between the contact region portion 33-6 and the contact region portion 33-5, and between the contact region portion 33-2 and the contact region portion 33-1.

Figure 34:
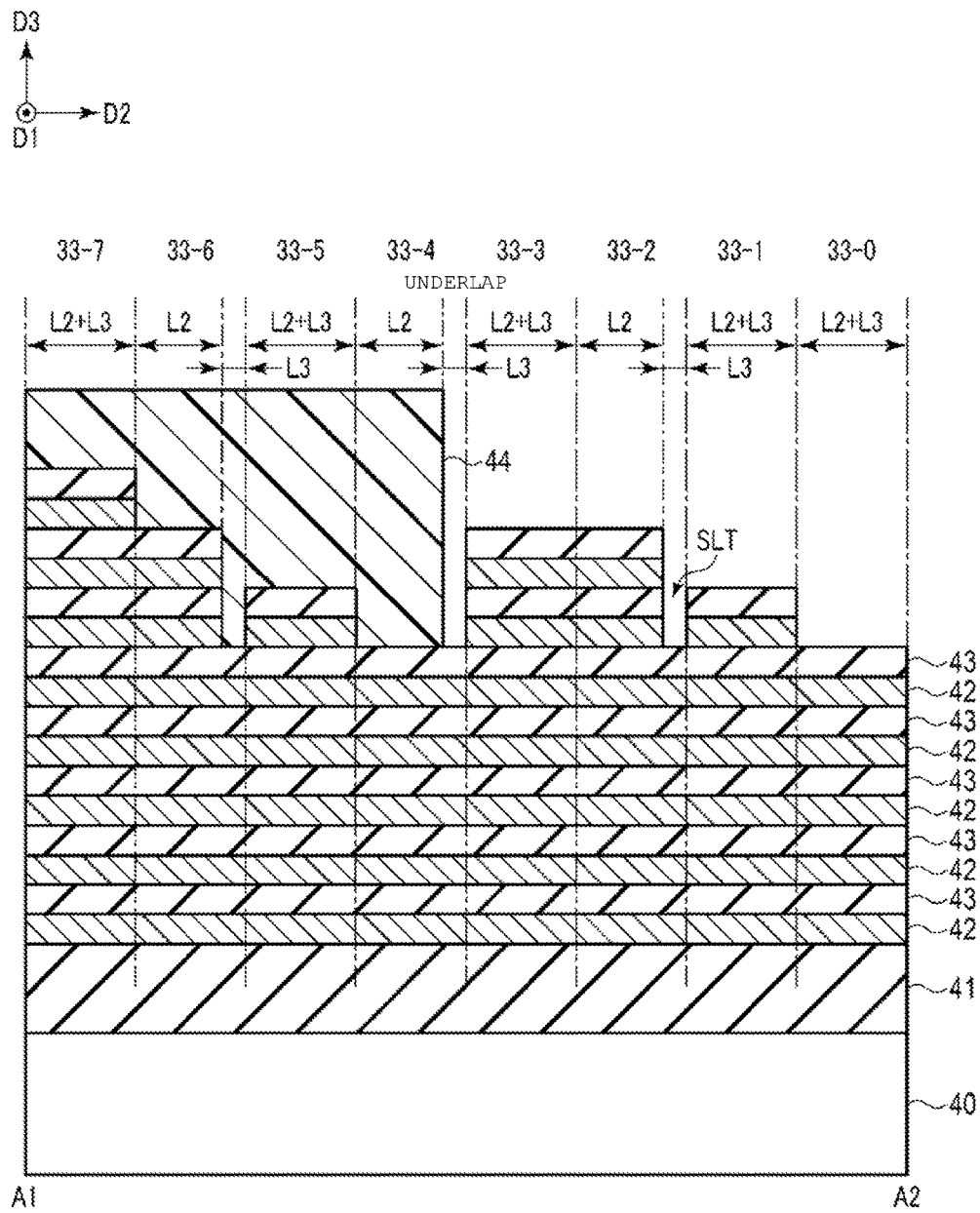
FIG. 34 is a cross-sectional view, taken along line A1-A2, illustrating a step of manufacturing the hookup portion provided in the semiconductor memory device according to the fifth embodiment.

Next, as shown in FIG. 34, after the resist of the second mask pattern is removed, the resist 44 is applied again, and the third mask pattern is formed by the third photolithography step. More specifically, as described with reference to FIG. 31, regions equivalent to the contact region portions 33-7, 33-6, 33-5, and 33-4 are masked with the resist 44. The third mask pattern is formed so as to be underlapped between a boundary (stepped difference) between the contact region portion 33-4 and the contact region portion 33-3. Therefore, a region equivalent to the contact region portion 33-4 is set to be in a state where the interlayer insulating film 43 is exposed by the length L3.

Figure 35:
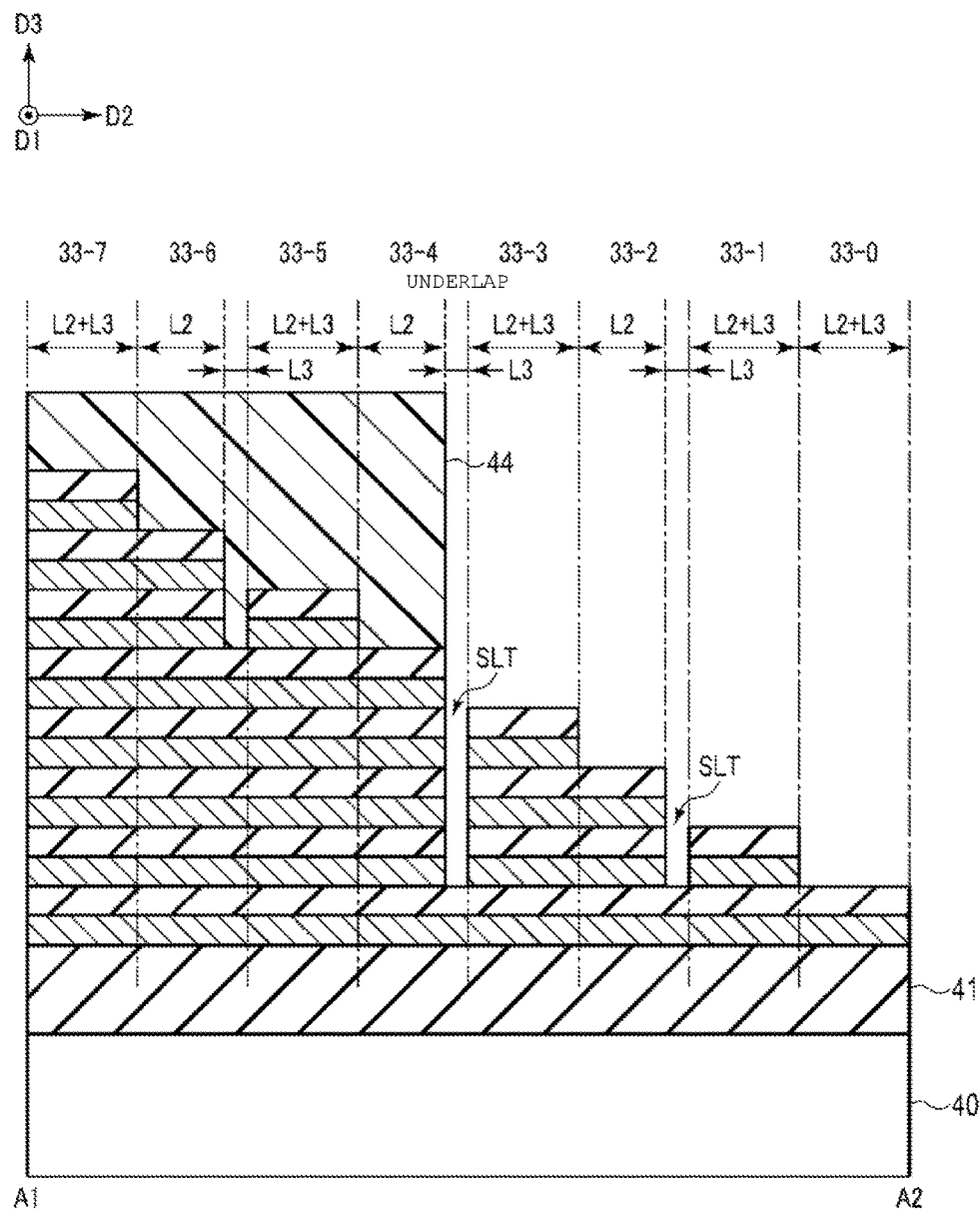
FIG. 35 is a cross-sectional view, taken along line A1-A2, illustrating a step of manufacturing the hookup portion provided in the semiconductor memory device according to the fifth embodiment.

Next, as shown in FIG. 35, every four of each of the interlayer insulating film 43 and the wiring layer 42 are etched by dry etching where exposed by the resist. Then, in the underlap region, the contact region portions 33-5 and 33-4 are etched. Therefore, the slit SLT is formed between the contact region portion 33-4 and the contact region portion 33-3.

Figure 36:
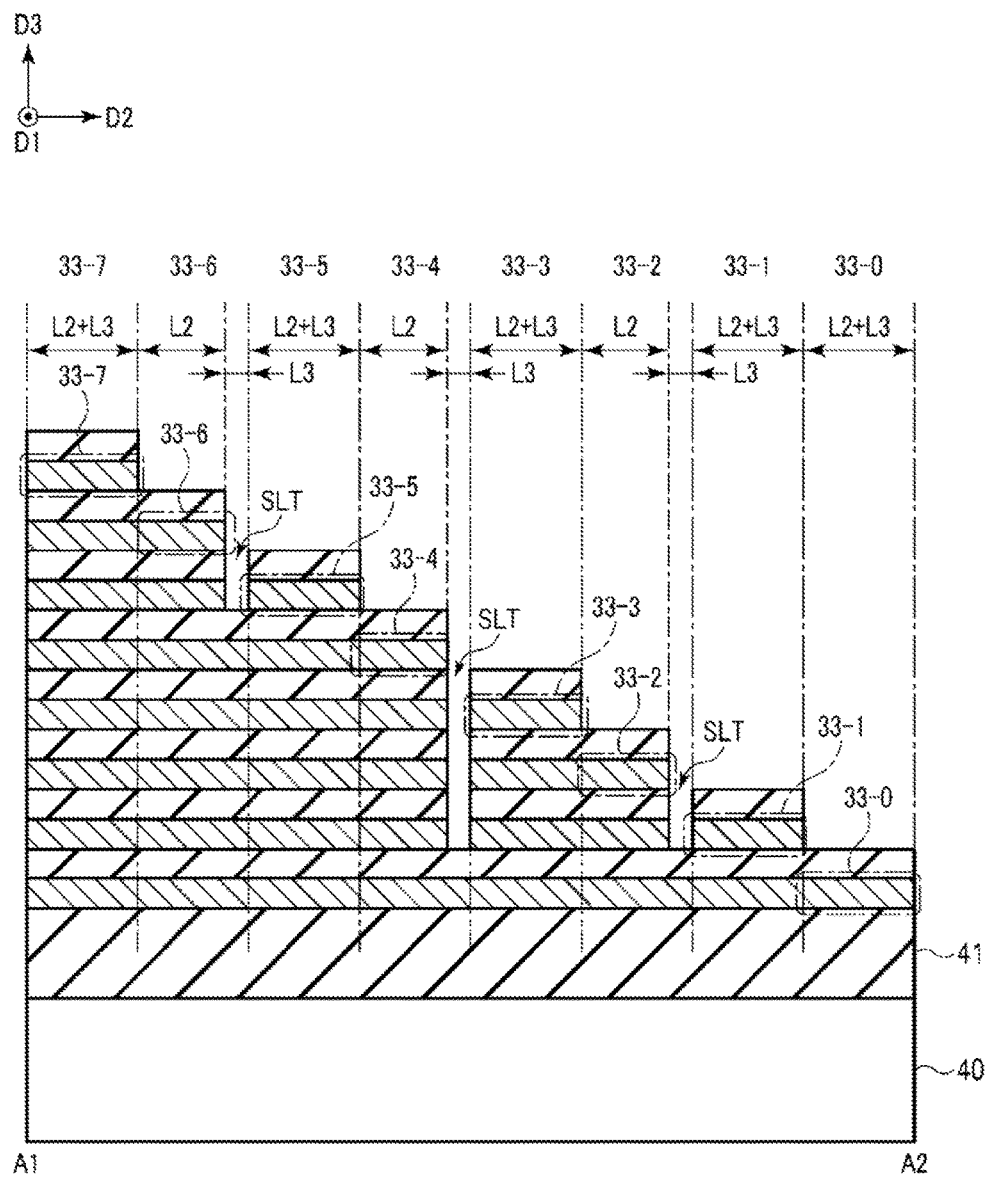
FIG. 36 is a cross-sectional view, taken along line A1-A2, illustrating a step of manufacturing the hookup portion provided in the semiconductor memory device according to the fifth embodiment.

Next, as shown in FIG. 36, the resist of the third mask pattern is removed, and the processing of the hookup portion HU is completed.

5.3 Effects According to the Present Embodiment

With the configuration according to the present embodiment, the same effects as those in the third and fourth embodiments are obtained.

In the present embodiment, as is the case with the fourth embodiment, the lengths of the respective contact region portions 33 may be configured to be the same as each other.

6. Sixth Embodiment

Next, a sixth embodiment will be described. In the sixth embodiment, a description will be given of a case where a semiconductor memory device is a three-dimensional stacked NAND flash memory.

6.1 Overall Configuration of Semiconductor Memory Device

Figure 37:
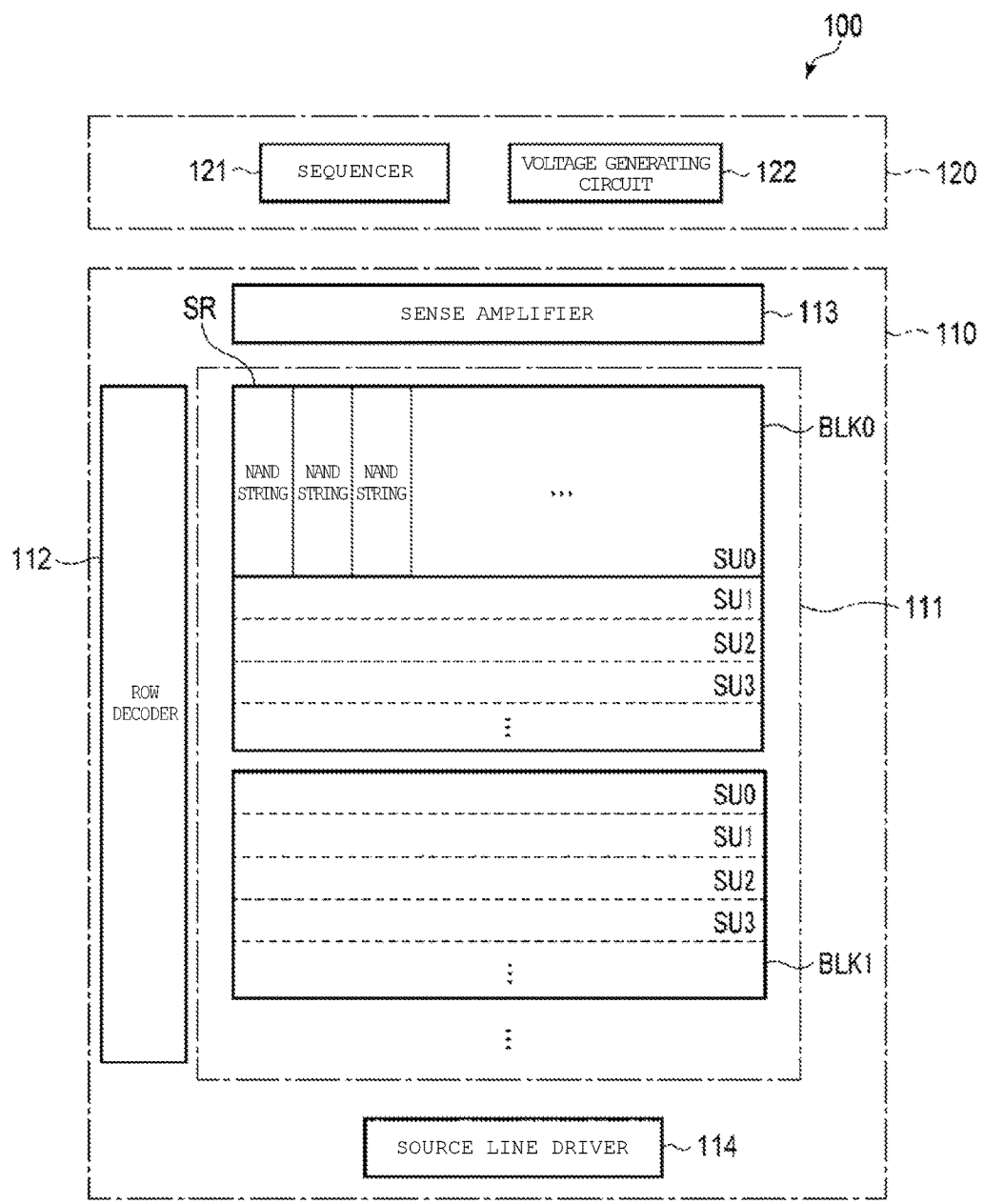
FIG. 37 is a block diagram of a semiconductor memory device according to a sixth embodiment.

First, the overall configuration of a semiconductor memory device will be described with reference to FIG. 37. FIG. 37 is a block diagram illustrating an overall configuration of a NAND flash memory 100.

As shown in FIG. 37, the NAND flash memory 100 generally includes a core portion 110 and a peripheral circuit 120.

The core portion 110 includes a memory cell array 111, a row decoder 112, a sense amplifier 113, and a source line driver 114.

The memory cell array 111 includes a plurality of blocks BLK (BLK0, BLK1, ... ) which are a set of a plurality of nonvolatile memory cell transistors.

Each of the blocks BLK includes a plurality of string units SU (SU0, SU1, ... ). Each of the string units SU includes a plurality of NAND strings SR. A plurality of memory cell transistors are connected in series to each other within the NAND string SR. The numbers of blocks BLK, string units SU, and NAND strings SR within the memory cell array 111 may be set freely.

The row decoder 112 decodes the address of the block BLK or the address of a page, for example, during write and read of data, and selects a target word line WL.

The sense amplifier 113 senses and amplifies data read from the memory cell transistor to the bit line BL during read of data. In addition, write data is transferred to the memory cell transistor during write of data.

The source line driver 114 applies a voltage required for a source line, during write, read, and erase of data.

The peripheral circuit 120 includes a sequencer 121 and a voltage generating circuit 122.

The sequencer 121 controls the operation of the entire NAND flash memory 100.

The voltage generating circuit 122 generates a voltage required for writing, reading, and erasing data, and supplies the generated voltage to the row decoder 112, the sense amplifier 113, the source line driver 114, and the like.

6.2 with Respect to Configuration of Memory Cell Array

Figure 38:
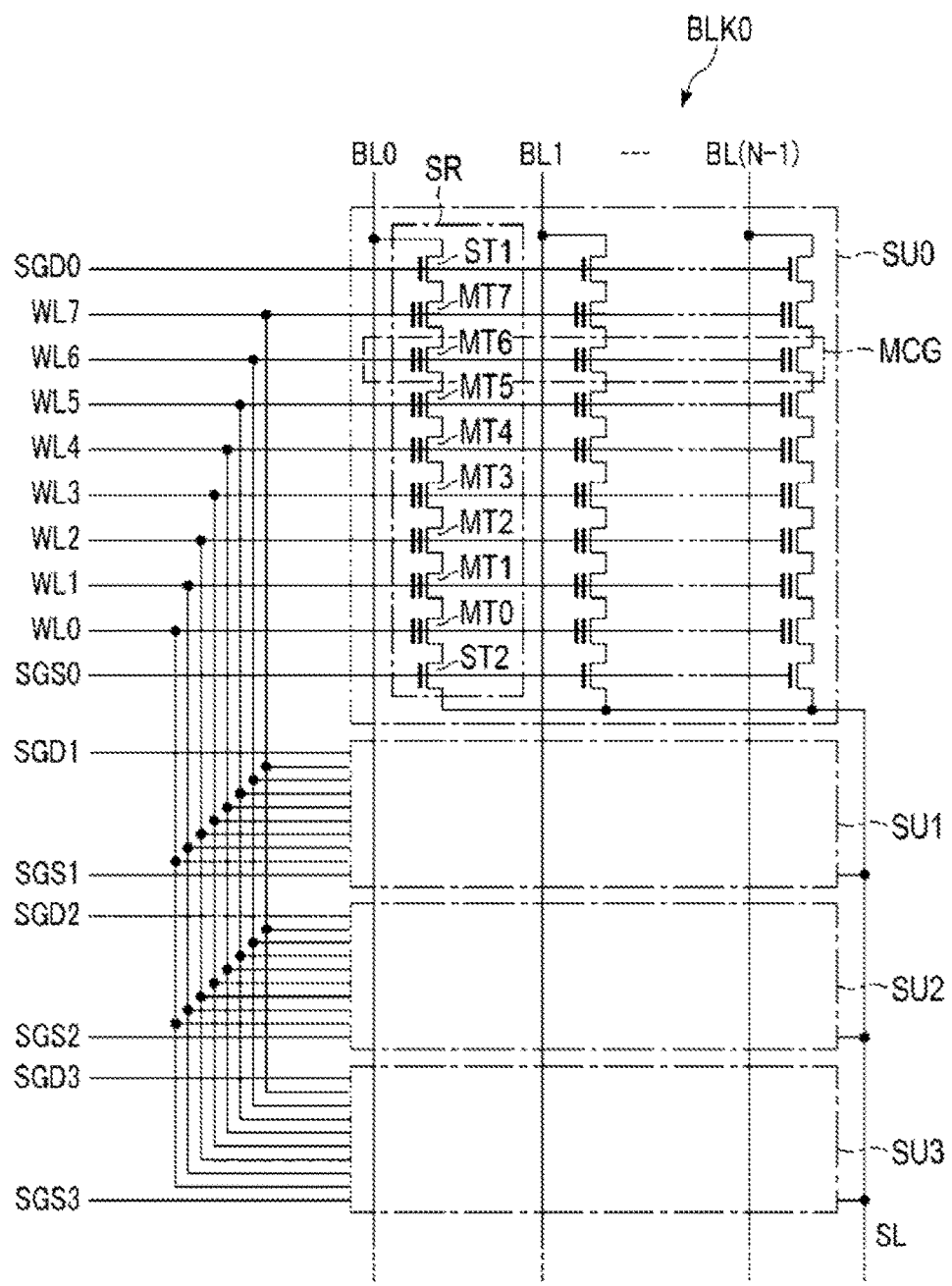
FIG. 38 is a circuit diagram of a memory cell array provided in the semiconductor memory device according to the sixth embodiment.

Next, the configuration of the memory cell array 111 will be described with reference to FIG. 38. FIG. 38 is a circuit diagram of the memory cell array 111. In the example of FIG. 38, a block BLK0 is shown, but the configurations of other blocks BLK are also the same as each other.

As shown in FIG. 38, the block BLK0 includes, for example, four string units SU (SU0 to SU3). Each of the string units SU includes a plurality of NAND strings SR. Each of the NAND strings SR includes, for example, eight memory cell transistors MT0 to MT7 and select transistors ST1 and ST2. Hereinafter, the memory cell transistors MT0 to MT7 are denoted as the memory cell transistor MT in a case where there is no limitation thereto. The memory cell transistor MT includes a control gate and a charge storage layer, and holds data in a non-volatile state.

The memory cell transistor MT may be a MONOS type in which an insulating film is used in the charge storage layer, and may be an FG type in which a conductive layer is used in the charge storage layer. Hereinafter, in the present embodiment, the MONOS type will be described as an example. In addition, the number of memory cell transistors MT may be 16, 32, 64, 128 and the like without being limited to eight, and there is no limitation on the number of memory cell transistors. Further, the numbers of select transistors ST1 and ST2 may be set freely, and may each be one or more.

The memory cell transistors MT are connected in series with each other between the source of the select transistor ST1 and the drain of the select transistor ST2. More specifically, the memory cell transistors MT0 to MT7 have the current paths thereof connected in series with each other. The drain of the memory cell transistor MT7 is connected to the source of the select transistor ST1, and the source of the memory cell transistor MT0 is connected to the drain of the select transistor ST2.

The gate of the select transistor ST1 in each of the string units SU0 to SU3 is connected to each of select gate lines SGD0 to SGD3. Similarly, the gate of the select transistor ST2 in each of the string units SU0 to SU3 is connected to each of select gate lines SGS0 to SGS3. Hereinafter, the select gate lines SGD0 to SGD3 are denoted as the select gate line SGD in a case where there is no limitation thereto. The select gate lines SGS0 to SGS3 are denoted as the select gate line SGS in a case where there is no limitation thereto. The select gate lines SGS0 to SGS3 in each string unit SU may be connected in common.

The control gates of the memory cell transistors MT0 to MT7 located within the block BLK are connected in common to the word lines WL0 to WL7, respectively. Hereinafter, the word lines WL0 to WL7 are denoted as the word line WL in a case where there is no limitation thereto.

The drain of the select transistor ST1 of each NAND string SR located within the string unit SU is connected to each of different bit lines BL0 to BL (N−1) (N is integer equal to or greater than 2). Hereinafter, the bit lines BL0 to BL (N−1) are denoted as the bit line BL in a case where there is no limitation thereto. Each of the bit lines BL commonly connects one NAND string SR located within each string unit SU between the plurality of blocks BLK. Further, the sources of a plurality of select transistors ST2 are connected in common to a source line SL. That is, the string unit SU is an aggregate of NAND strings SR which are connected to a different bit line BL and connected to the same select gate lines SGD and SGS. In addition, the block BLK is an aggregate of a plurality of string units SU making common use of the word line WL. The memory cell array 18 is an aggregate of a plurality of blocks BLK making common use of the bit line BL.

Write and read of data are collectively performed on the memory cell transistor MT connected to any of the word lines WL in any of the string units SU. Hereinafter, a group of memory cell transistors MT which are collectively selected during write and read of data is referred to as a "memory cell group MCG". A collection of 1-bit data of each memory cell transistor MT which is written in or is read from one memory cell group MCG is referred to as a "page".

6.3 with Respect to Cross-Sectional Configuration of Memory Cell Array

Figure 39:
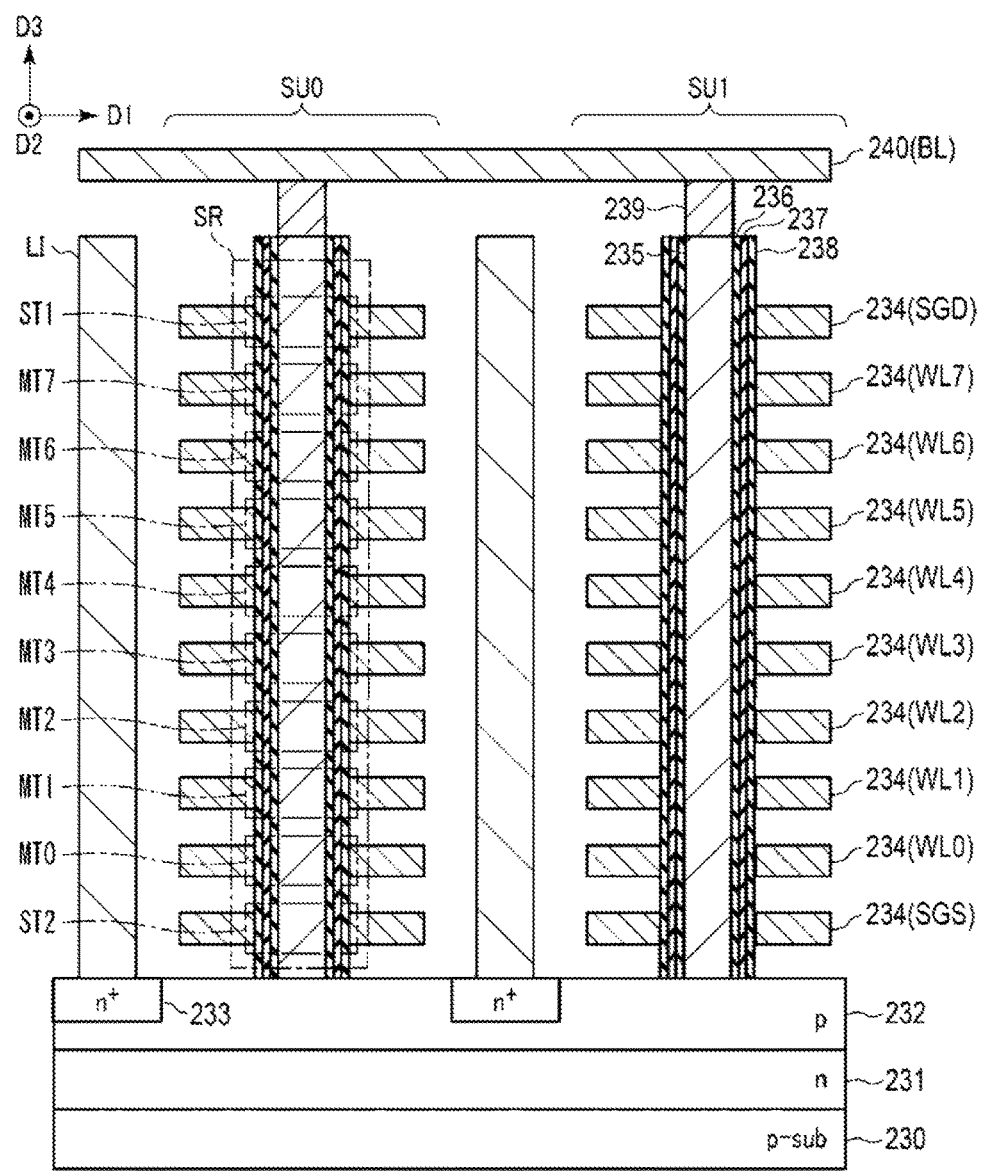
FIG. 39 is a cross-sectional view of the memory cell array provided in the semiconductor memory device according to the sixth embodiment.

Next, the cross-sectional configuration of the memory cell array 111 will be described with reference to FIG. 39. FIG. 39 is a cross-sectional view of the memory cell array 111. In the example of FIG. 39, the cross-sections of the string units SU0 and SU1 are shown, and the configurations of the string units SU2 and SU3 are also the same as each other. In FIG. 39, an interlayer insulating film is omitted.

As shown in FIG. 39, a plurality of source line contacts LI extending in the second direction D2 are provided along the first direction D1. One string unit SU is disposed between two source line contacts LI. The source line contact LI connects a semiconductor substrate 230 and a source line SL, not shown, provided above the NAND string SR. The source line contact LI and the NAND string SR may be disposed in any manner. For example, a plurality of string units SU may be provided between two source line contacts LI. Further, in the example of FIG. 39, for the purpose of simplifying description, a case is shown in which a plurality of NAND strings SR are arrayed in one row along the second direction D2 in one string unit SU, but the NAND strings SR may be arranged in one string unit SU in any manner. For example, the NAND strings may be arranged parallel to each other in two rows along the second direction D2, and may be arrayed in the staggered arrangement of four rows.

In each string unit SU, the NAND string SR is formed in the third direction D3 perpendicular to the semiconductor substrate 230. More specifically, an n-type well 231 is provided in the front surface region of the semiconductor substrate 230. A p-type well 232 is provided in the front surface region of the n-type well 231. In addition, an n+-type diffusion layer 233 is provided in a portion of the front surface region of the p-type well 232. The select gate line SGS, the word lines WL0 to WL7 connected to the memory cell transistors MT0 to MT7, and ten wiring layers 234 functioning as the select gate line SGD are sequentially stacked above the p-type well 232 with each interlayer insulating film (not shown) interposed therebetween. The ten wiring layers 234 are connected to upper wirings (not shown) in the hookup portion HU (not shown).

A pillar-shaped semiconductor layer 235 reaching the p-type well 232 through the ten wiring layers 234 is formed. A tunnel insulating film 236, a charge storage layer 237, and a block insulating film 238 are sequentially formed on the side surface of the semiconductor layer 235. The semiconductor layer 235 has, for example, polycrystalline silicon used therein. The tunnel insulating film 236 and the block insulating film 238 have, for example, a silicon oxide film used therein. The charge storage layer 237 has, for example, a silicon nitride film used therein. The semiconductor layer 235 functions as the current path of the NAND string SR, and serves as a region in which the channel of each transistor is formed. The upper end of the semiconductor layer 235 is connected to a wiring layer 240 extending in the first direction D1 via a contact plug 239. The wiring layer 240 functions as the bit line BL.

In the example of FIG. 39, each one of the wiring layers 234 that function as the select gate lines SGD and SGS is provided, but a plurality of wiring layers may be provided.

The source line contact LI has a line shape along the second direction D2. The source line contact LI has, for example, polycrystalline silicon used therein. The bottom of the source line contact LI is connected to the n+-type diffusion layer 233, and the upper surface thereof is connected to a wiring layer (not shown) functioning as the source line SL.

6.4 Effects According to the Present Embodiment

In the configuration according to the present embodiment, the first to sixth embodiments can be applied.

7. Modification Example and the Like

The semiconductor memory device according to the embodiment includes a plurality of first electrodes (WLcomb), having a comb shape, each of which is stacked above a semiconductor substrate with an interlayer insulating film (43) interposed therebetween, and to which one-side ends of a plurality of first word lines (WLfinger) extending in a first direction (D1) parallel to the semiconductor substrate (40) are connected in common, a plurality of extraction portions (32) which are connected to a plurality of second surfaces, respectively, facing a plurality of first surfaces having the plurality of first word lines connected thereto, in the plurality of first electrodes, and each of which is stacked with the interlayer insulating film interposed therebetween so as to be formed in a stepped shape in parallel to the semiconductor substrate and along a second direction (D2) different from the first direction, a plurality of first memory cells (MC) which are stacked above the semiconductor substrate, and are connected to any of the plurality of first word lines, and a decoder (22) that supplies a voltage to the plurality of first electrode portions. The plurality of extraction portions include a plurality of contact region portions (33), respectively, to which a contact plug (CP) for electrical connection to the decoder is connected. In the plurality of stacked extraction portions, the contact region portion (33-9) of the extraction portion (32-9) of an uppermost layer is not disposed in an end region of the second surface, and the contact region portion (33-0) of the extraction portion (32-0) of a lowermost layer is disposed in the end region of the second surface.

The embodiment is applied, and thus it is possible to provide a semiconductor memory device capable of improving reliability. The embodiment can be variously changed and modified without being limited to the above-described forms.

For example, in the embodiment, the mask pattern is formed by the resist 44, but a hard mask having an insulating film or a metal film used therein is formed using photolithography, and this hard mask may be used as the mask pattern.

Further, the semiconductor memory device in the embodiment is not limited to a ReRAM and a NAND flash memory. The semiconductor memory device can be applied to a three-dimensional stacked memory having word lines stacked therein.

Further, the term "connection" in the embodiment also includes a state of being indirectly connected in between, for example, with something else such as a transistor or a resistor interposed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a plurality of electrodes, extending in a first direction and a second direction orthogonal to the first direction, and stacked one over the other with an insulating layer disposed between each adjacent electrode;
    the plurality of electrodes including a first side, and a second side, each extending in the second direction and spaced from each other in the first direction;
    a plurality of protrusion portions extending from the first side of at least two of the electrodes, the protrusion portions spaced from one another in the second direction;
    an extraction portion extending from the second side of the electrode on the at least two electrodes having protrusion portions extending from the first side thereof; and
    first and second contact plugs extending in a third direction, orthogonal to the first and second directions, one of each contacting the extraction portions connected to one of the two electrodes having protrusion portions extending from the first side thereof,
    wherein the extraction portion extending from the uppermost of the two electrodes having protrusion portions extending from the first side thereof is located closer to the center of the second side in the second direction, than the location of the extraction portion extending from the lowermost of the two electrodes having protrusion portions extending from the first side thereof.

2. The semiconductor device according to claim 1, wherein each electrode includes an extraction portion extending from the second side thereof, and the extraction portions extending from the uppermost electrodes, among the plurality of electrodes, are located closer to the center of the second side of the electrode in the second direction than are the extraction portions extending from the lowermost electrodes among the plurality of electrodes.

3. The semiconductor device according to claim 2, wherein a first portion of the extraction portions extending from the electrodes located between the uppermost and lower most electrodes among the plurality of electrodes extend from the second side of the electrode at a location between the location of the extraction portion on the uppermost electrode among the plurality of electrodes and a first end of the second side of the uppermost electrode in the second direction, and a second portion of the extraction portions among the plurality plurality of electrodes extending from the electrodes located between the uppermost and lowermost electrodes among the plurality of electrodes extend from the second side of the electrode at a location between the location of the extraction portion on the uppermost electrode and a second end of the uppermost electrode in the second direction.

4. The semiconductor device of claim 3, wherein the number of the first portion of extraction portions and the number of the second portion of the extraction portions is the same.

5. The semiconductor device of claim 3, wherein there is one more extraction portion in the first portion of extraction portions than in the second portion of extraction portions.

6. The semiconductor device according to claim 2, wherein at least two insulation layers extend between each two adjacent extraction portions, where one of the two adjacent extraction portions overlies the other of the two adjacent extraction portions in the third direction.

7. The semiconductor device according to claim 2, wherein the length of the extraction portion in the second direction extending from the second side of any electrode, other than the uppermost electrode or lowermost electrode among among the plurality of electrodes, is greater than the length of the extraction portion in the second direction extending from the second side of the portion immediately thereabove, and smaller than the length of the extraction portion in the second direction extending from the second side of the electrode immediately therebelow.

8. The semiconductor device according to claim 2, wherein each extraction portion includes a contact region portion where a contact plug extending in the third direction makes contact therewith, and the centers of the contact region portions are evenly spaced form one another in the second direction.

9. The semiconductor device according to claim 8, wherein the diameter of the contact plug contacting a lower one of the contact region portions of the extraction portions is smaller than the diameter of a contact plug contacting a contact region portion of an extraction portion immediately thereabove.

10. The semiconductor device of claim 2, further comprising a slit extending through at least one extraction portion, other than the uppermost extraction portion among the plurality of electrodes, at a location intermediate of the opposed ends thereof in the second direction.

11. The semiconductor device according to claim 1, wherein the extraction portion extending from the second side of the lowermost electrode among the plurality of electrodes extends further in the second direction than does the extraction portion extending from the second side of the uppermost electrode among the plurality of electrodes.

12. The semiconductor device according to claim 1, wherein the width of the electrode in the first direction is greater than the width of the extraction portions in the first direction.

13. A semiconductor memory device, comprising:
a plurality of first electrodes, extending in a first direction and a second direction orthogonal to the first direction, and stacked one over the other with an insulating layer disposed between each adjacent electrode;
the plurality of electrodes including a first side, and a second side, each extending in the second direction and spaced from each other in the first direction;
a plurality of protruding portions extending in the first direction from the first side of at least two of the electrodes, the protruding portions spaced from one another in the second direction;
an extraction portion extending in the first direction from the second side of each of the electrodes of the plurality of first electrodes together forming a step shaped pattern in the second direction;
a plurality of contact plugs extending in a third direction, orthogonal to the first and second directions, one of each of the contact plugs contacting one of the extraction portions;
a plurality of first memory cells stacked above the semiconductor substrate, each memory cell connected to one of a plurality of first projecting portions stacked one above the other; and
a decoder configured to supply a voltage to the plurality of first electrodes,
wherein, among the extraction portions, a slit extends inwardly of a portion of at least one extraction portion.

14. The semiconductor memory device according to claim 13, wherein the slit extends in a third direction orthogonal to the first and second directions.

15. The semiconductor memory device according to claim 13, wherein each extraction portion includes a contact region, and the contact regions extend from the second side of the electrodes by the same length in the first direction.

16. The semiconductor memory device according to claim 13, wherein each extraction portion includes a contact region, and the different contact regions extend different lengths in the second direction.

17. The semiconductor memory according to claim 16, wherein the contact plugs are spaced from one another in the first direction, and the distance between each adjacent one of the contacts is the same.

18. The semiconductor memory according to claim 13, wherein the diameter of the contact plugs decreases in a third direction, orthogonal to the first and second direction, from the location of a first electrode to the location of second electrode below the first electrode in the third direction.

19. The semiconductor device according to claim 13, wherein
each electrode includes an extraction portion extending from the second side thereof, and
the extraction portions extending from the uppermost electrodes among the plurality of electrodes are located closer to the center of the second side of the electrode in the second direction than are the extraction portions extending from the lowermost electrodes.

20. The semiconductor device according to claim 19, wherein
a first portion of the extraction portions extending from the electrodes located between the uppermost and lower most electrodes among the plurality of electrodes extend from the second side of the electrode to a location between the location of the extraction portion on the uppermost electrode and a first end of the second side of the uppermost electrode in the second direction, and a second portion of the extraction portions extending from the electrodes located between the uppermost and lower most electrodes extend from the second side of the electrode to a location between the location of the extraction portion on the uppermost electrode and a second end of the uppermost electrode in the second direction.

* * * * *

UNITED STATES PATENT AND TRADEMARK OFFICE
CERTIFICATE OF CORRECTION

PATENT NO. : 10,170,570 B1
APPLICATION NO. : 15/909473
DATED : January 1, 2019
INVENTOR(S) : Takeshi Sonehara et al.

It is certified that error appears in the above-identified patent and that said Letters Patent is hereby corrected as shown below:

In Column 31, Claim 3, Line 16, please delete the first instance of "plurality".

In Column 31, Claim 7, Line 39, please delete the first instance of "among".

Signed and Sealed this
Twenty-seventh Day of August, 2019

Andrei Iancu
*Director of the United States Patent and Trademark Office*